(12) United States Patent
Forrest et al.

(10) Patent No.: US 10,074,815 B2
(45) Date of Patent: Sep. 11, 2018

(54) ORGANIC ELECTROLUMINESCENT DEVICES

(71) Applicants: The Regents of the University of Michigan, Ann Arbor, MI (US); University of Southern California, Los Angeles, CA (US)

(72) Inventors: Stephen R. Forrest, Ann Arbor, MI (US); Jaesang Lee, Seoul (KR); Mark E. Thompson, Anaheim Hills, CA (US)

(73) Assignees: THE REGENTS OF THE UNIVERSITY OF MICHIGAN, Ann Arbor, MI (US); UNIVERSITY OF SOUTHERN CALIFORNIA, Los Angeles, CA (US)

( * ) Notice: Subject to any disclaimer, the term of this patent is extended or adjusted under 35 U.S.C. 154(b) by 336 days.

(21) Appl. No.: 15/086,795

(22) Filed: Mar. 31, 2016

(65) Prior Publication Data

US 2016/0293864 A1    Oct. 6, 2016

Related U.S. Application Data

(60) Provisional application No. 62/140,746, filed on Mar. 31, 2015.

(51) Int. Cl.
*H01L 51/00* (2006.01)
*C09K 11/06* (2006.01)
(Continued)

(52) U.S. Cl.
CPC ........ *H01L 51/0085* (2013.01); *C09K 11/025* (2013.01); *C09K 11/06* (2013.01); *H05B 33/14* (2013.01); *H05B 33/20* (2013.01); *C09K 2211/1007* (2013.01); *C09K 2211/1011* (2013.01); *C09K 2211/1014* (2013.01); *C09K 2211/1044* (2013.01); *C09K 2211/1059* (2013.01); *C09K 2211/1088* (2013.01); *C09K 2211/185* (2013.01); *H01L 51/0058* (2013.01); *H01L 51/0067* (2013.01);
(Continued)

(58) Field of Classification Search
CPC ............ H01L 51/5096; H01L 51/5004; H01L 51/5008
See application file for complete search history.

(56) References Cited

U.S. PATENT DOCUMENTS 6,951,694 B2 * 10/2005 Thompson ............. C09K 11/06
                                                          313/504
9,741,942 B2 *  8/2017 Stoessel ............. H01L 51/0072
(Continued)

OTHER PUBLICATIONS

Giebink, N. C. et al.,"Intrinsic luminance loss in phosphorescent small-molecule organic light emitting devices due to bimolecular annihilation reactions," J. Appl. Phys. 103, 044509-1 to 044509-9 (2008).

(Continued)

*Primary Examiner* — Michael M Dollinger
(74) *Attorney, Agent, or Firm* — Duane Morris LLP

(57) ABSTRACT

An organic light emitting device is disclosed in which the emissive dopant material in its organic emissive layer is an organic phosphorescent emissive material and a neat film of the organic phosphorescent emissive material is disposed between the organic emissive layer and the anode as an electron blocking layer.

21 Claims, 14 Drawing Sheets

(51) Int. Cl.
  *C09K 11/02* (2006.01)
  *H05B 33/14* (2006.01)
  *H05B 33/20* (2006.01)
  *H01L 51/50* (2006.01)
(52) U.S. Cl.
  CPC ...... *H01L 51/0072* (2013.01); *H01L 51/5016* (2013.01); *H01L 51/5096* (2013.01); *H01L 2251/5346* (2013.01)

(56) References Cited

U.S. PATENT DOCUMENTS

| | | | | |
|---|---|---|---|---|
| 2005/0260444 | A1* | 11/2005 | Forrest | C07F 15/0033 428/690 |
| 2009/0131670 | A1* | 5/2009 | Cheng | C07F 7/0809 546/14 |
| 2009/0206741 | A1* | 8/2009 | Yoon | B82Y 10/00 313/504 |
| 2013/0082273 | A1* | 4/2013 | Ting | H01L 21/02458 257/76 |
| 2013/0240850 | A1* | 9/2013 | Forrest | H01L 51/5028 257/40 |
| 2014/0152637 | A1* | 6/2014 | Fujita | C07F 15/002 345/211 |
| 2017/0155061 | A1* | 6/2017 | Forrest | H01L 51/0085 |

OTHER PUBLICATIONS

Sajoto, T. et al., "Blue and Near-UV Phosphorescence from Iridium Complexes with Cyclometalated Pyrazolyl or N-Heterocyclic Carbene Ligands," Inorg. Chem. 44, 7992-8003 (2005).
Hopkinson, M. N. et al., "An overview of N-heterocyclic carbenes," Nature, vol. 510, 485-496 (2014).
Holmes, R. J. et al., "Efficient, deep-blue organic electrophosphorescence by guest charge trapping," Appl. Phys. Lett., vol. 83, No. 18, 3818-3820 (2003).
Chang, C.-F. et al., "Highly Efficient Blue-Emitting Iridium(III) Carbene Complexes and Phosphorescent OLEDs," Angew. Chem. Int. Ed. 47, 4542-4545 (2008).
Chiu, Y.-C. et al., "En Route to High External Quantum Efficiency (~12%) Organic True-Blue-Light-Emitting Diodes Employing Novel Design of Iridium (III) Phosphors," Adv. Mater. 21, 2221-2225 (2009).
Hsieh, C.-H. et al., "Design and Synthesis of Iridium Bis(carbene) Complexes for Efficient Blue Electrophosphorescence," Chem. Eur. J. 17, 9180-9187 (2011).
Lu, K.-Y. et al., "Wide-Range Color Tuning of Iridium Biscarbene Complexes from Blue to Red by Different NN Ligands: an Alternative Route for Adjusting the Emission Colors," Adv. Mater. 23, 4933-4937 (2011).
Fleetham T. et al., "Efficient deep blue electrophosphorescent devices based on platinum(II) bis(n-methyl-midazolyl)benzene chloride," Organic Electronics 13, 1430-1435 (2012).
Lee, S. et al., "Deep-Blue Phosphorescence from Perfluoro Carbonyl-Substituted Iridium Complexes," J. Am. Chem. Soc. 135, 14321-14328 (2013).
Hang, X.-C. et al., "Highly Efficient Blue-Emitting Cyclometalated Platinum(II) Complexes by Judicious Molecular Design," Angew. Chem. Int. Ed. 52, 6753-6756 (2013).
Fleetham, T. et al., "Efficient "Pure" Blue OLEDs Employing Tetradentate Pt Complexes with a Narrow Spectral Bandwidth," Adv. Mater. 26, 7116-7121 (2014).
Baldo, M. A. et al., "Transient analysis of organic electrophosphorescence. II. Transient analysis of triplet-triplet annihilation," Phys. Rev. B., vol. 62, No. 16, 10967-10977 (2000).
Shi, F., Xu, X., Zheng, L., Dang, Q. & Bai, X. Method Development for a Pyridobenzodiazepine Library with Multiple Diversification Points. J. Comb. Chem. 10, 158-161 (2008).
Forrest, S. R. et al., "Measuring the Efficiency of Organic Light-Emitting Devices," Adv. Mater. 15, No. 13, 1043-1048 (2003).
Zhang, Y. et al., "Tenfold increase in the lifetime of blue phosphorescent organic light-emitting diodes," Nat. Commun. 5, 1-7 (2014).
Holmes, R. J. et al., "Saturated deep blue organic electrophosphorescence using a fluorine-free emitter," Appl. Phys. Lett. 87, 243507-1 to 243507-3 (2005).
Xiao, L. et al., "Recent Progresses on Materials for Electrophosphorescent Organic Light-Emitting Devices," Adv. Mater. 23, 926-952 (2011).
Yook, K. S. & Lee, J. Y., "Organic Materials for Deep Blue Phosphorescent Organic Light-Emitting Diodes," Adv. Mater. 24, 3169-3190 (2012).
Djurovich, P. I. et al., "Measurement of the lowest unoccupied molecular orbital energies of molecular organic semiconductors," Organic Electronics 10, 515-520 (2009).
Jeon, S. O. et al., "External Quantum Efficiency Above 20% in Deep Blue Phosphorescent Organic Light-Emitting Diodes," Adv. Mater. 23, 1436-1441 (2011).
Lee, J. et al., "Deep blue phosphorescent organic light-emitting diodes with very high brightness and efficiency," Nature Materials, vol. 15, Jan. 2016, 92-99.
Reineke, S. et al., "Triplet-exciton quenching in organic phosphorescent light-emitting diodes with Ir-based emitters," Phys. Rev. B 75, 125328-1 to 125328-13 (2007).
D'Andrade, B. W. et al., "Relationship between the ionization and oxidation potentials of molecular organic semiconductors," Organic Electronics 6, 11-20 (2005).
Erk, P. et al., "11.2: Efficient Deep Blue Triplet Emitters for OLEDs," SID Symp. Dig. Tech. Pap. 37, 131-134 (2006).

* cited by examiner

ORGANIC ELECTROLUMINESCENT DEVICES

CROSS-REFERENCE TO RELATED APPLICATIONS

This application is a Non-provisional application claiming priority under 35 U.S.C. § 119(e) of U.S. Provisional Application Ser. No. 62/140,746, filed Mar. 31, 2015, which is incorporated herein by reference in its entirety.

GOVERNMENT RIGHTS

This invention was made with Government support from the U.S. Department of Energy (DOE) under contract No. DE-SC0001013. The United States Government has certain rights to this invention.

PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and Universal Display Corporation. The agreement was in effect on and before the date the claimed invention was made, and the claimed invention was made as a result of activities undertaken within the scope of the agreement.

FIELD OF THE INVENTION

The present disclosure relates to improved device structure for organic light-emitting devices. Particularly, this present disclosure discloses a device utilizing the phosphorescent emitter dopant also as an electron blocker.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Organic electroluminescent devices utilize the radiative decay of excitons formed inside the emissive layer. The position of exciton formation and migration play very important role on the stability and efficiency of the devices. When holes and electrons are injected to the devices, they travel in the emissive layer, recombine, and form excitons. When the recombination zone is too narrow or close to HTL and ETL interfaces, a large buildup of charge and high concentration of excitons can occur, which can cause polaron-exciton interaction and triplet-triplet annihilation. These interactions can adversely affect the device performance, generally shortening the device lifetime. In order to increase device efficiency and improve lifetime, it is desirable to have a wider recombination zone and lower exciton concentration in the emissive layer. Therefore, the charge transporting properties of the emissive layer is important.

A driving force behind the use of organic electroluminescence in displays and lighting has been the introduction of red and green electrophosphorescent devices with up to 100% internal quantum efficiency. However, achieving deep blue electrophosphorescence with both high efficiency and long-term operational stability remains a challenge. The design of robust and efficient blue phosphors free of electrochemically reactive moieties offers one possible solution. For example, Sajoto, T. et al. (Blue and Near-UV Phosphorescence from Iridium Complexes with Cyclometalated Pyrazolyl or N-Heterocyclic Carbene Ligands. *Inorg. Chem.* 44, 7992-8003 (2005)) demonstrated tris-cyclometalated iridium (III) complexes based on the thermodynamically stable N-heterocyclic carbene (NHC) ligands, or Ir(C^C:)$_3$. Compared with blue Ir complexes using fluorination to obtain a wide energy gap, such as bis[2-(4,6-difluorophenyl)pyridinato-C,N](picolinato) iridium (III) (FIrpic) and bis[2,4-difluorophenylpyridinato]tetrakis(1-pyrazolyl) borate iridium (III) (FIr6), the NHC approach provides more saturated blue emission.

However, previously reported deep blue PHOLEDs using either NHC- or other ligand-based metal complexes that can accommodate highly energetic excited states are subject to a pronounced external quantum efficiency (EQE) roll-off at a high brightness; i.e., the current densities at the half maximum EQE, $J_{1/2}$, are typically <50 mA/cm$^2$ due to exciton and electron leakage from the PHOLED emissive layer (EML), as well as strong bimolecular annihilation. Inventors have discovered that when the same compounds are used for both the emitter dopant in the EML and for the neat electron/exciton blocking layer (EBL) film next to the EML, significant improvement in device efficiency can be achieved.

SUMMARY OF THE INVENTION

According to some embodiments, an organic light emitting device comprising: an anode; a cathode; an organic emissive layer disposed between the anode and the cathode, wherein the organic emissive layer comprises a host material and an organic phosphorescent emissive dopant material; and an electron blocking layer comprising a neat film of the organic phosphorescent emissive dopant material disposed between the organic emissive layer and the anode is disclosed. The provision of the organic phosphorescent emissive material as both the emissive dopant in the emissive layer as well as the electron blocking layer provides substantially low or no barrier for the holes and enhances the OLED's efficiency.

According to some embodiments, a device comprising one or more organic light emitting devices is disclosed, wherein at least one of the one or more organic light emitting devices comprising: an anode; a cathode; an organic emissive layer disposed between the anode and the cathode, wherein the organic emissive layer comprises a host material and an organic phosphorescent emissive dopant material; and an electron blocking layer comprising a neat film of the organic phosphorescent emissive dopant material disposed between the organic emissive layer and the anode.

The OLED devices according to the present disclosure using N-heterocyclic carbene (NHC) Ir (III) complex, tris-(phenyl-methyl-pyridoimidazole) Ir (III) [Ir(pmp)$_3$] as the phosphorescent emitter dopant in the emissive layer and as the electron blocking layer demonstrated very high brightness deep blue phosphorescent emission. The novel device architecture of electron blocking by using the hole-conducting phosphor itself achieved much improved high brightness. The architecture effectively confines both electrons and excitons within the PHOLED emissive layers while allowing nearly barrier free hole transport into the emissive layer through the electron blocking layer.

According to some embodiments, the organic light emitting device can further comprise a hole blocking layer disposed between the organic emissive layer and the cathode; wherein the organic emissive layer and the electron blocking layer forming an emissive layer/electron blocking layer interface and the organic emissive layer and the hole blocking layer forming an emissive layer/hole blocking layer interface; and wherein the organic phosphorescent emissive dopant material is present in the organic emissive layer with a graded doping concentration wherein the doping concentration is linearly graded with highest doping concentration at the emissive layer/electron blocking layer interface, to lowest doping concentration at the emissive layer/hole blocking layer interface.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Figure 1:
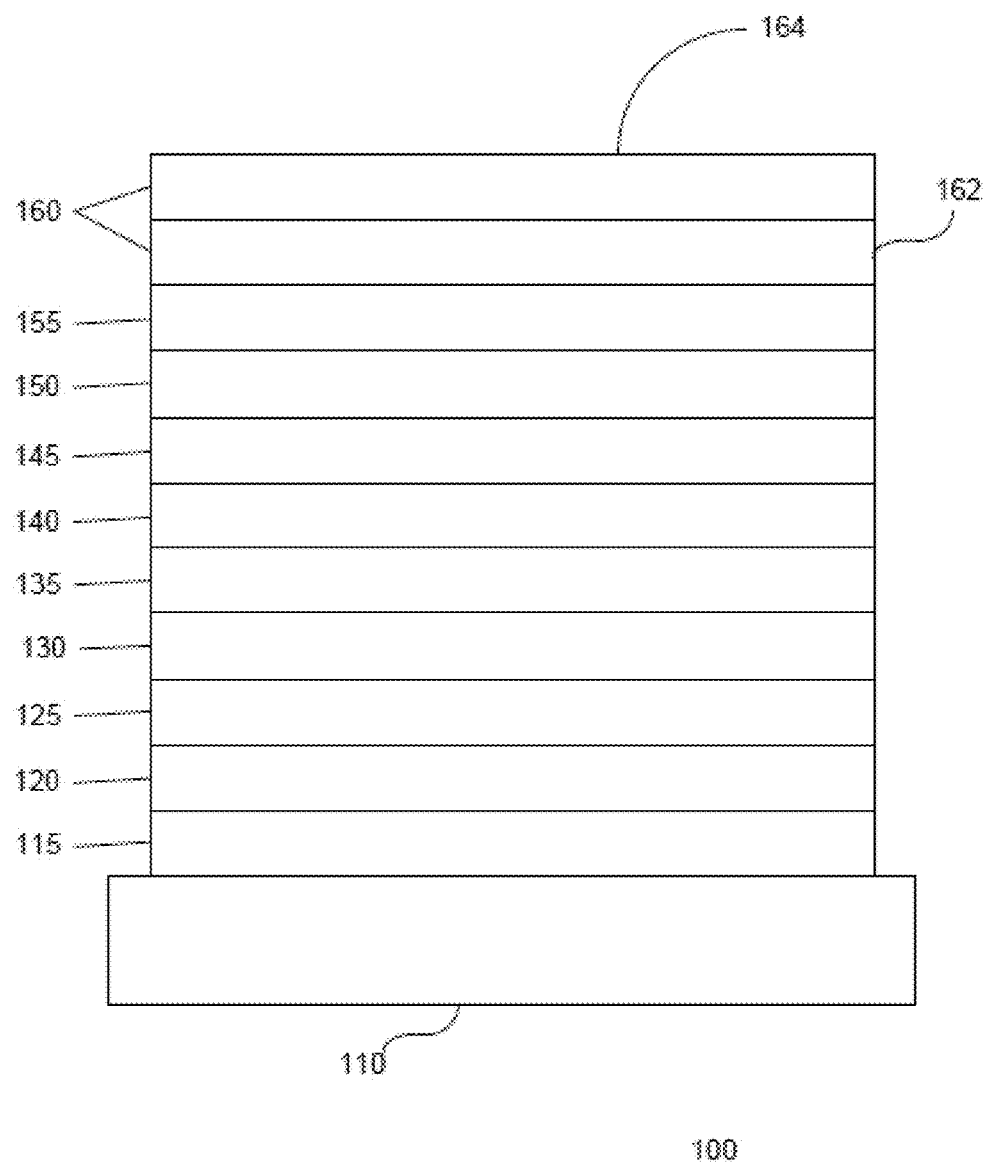
FIG. 1 shows a structure of an example of an organic light emitting device in which the present invention can be applied.

FIG. 1 shows an example of an organic light emitting device 100 in which the present invention can be applied. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. The emissive layer 135 comprises at least one emissive dopant material and a host material Device 100 may be fabricated by depositing the layers described, in order. The properties and functions of these various layers, as well as example materials, are described in more detail, for example, in U.S. Pat. No. 7,279,704 at cols. 6-10, which are incorporated by reference.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-0230980 to Forrest et al., which are incorporated by reference in their entireties.

As used herein, as would be understood by one of ordinary skill in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Figure 2:
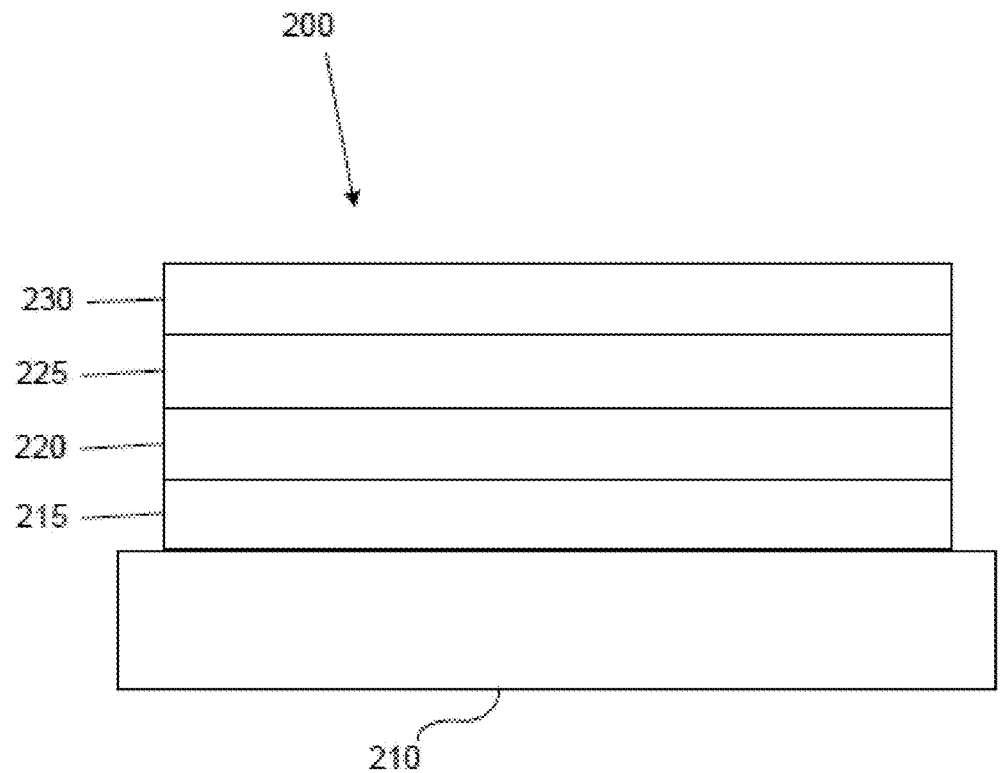
FIG. 2 shows a structure of an example of an inverted organic light emitting device that does not have a separate electron transport layer in which the present invention can be applied.

FIG. 2 shows an example of an inverted OLED 200 in which the present invention can be applied. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100. According to an embodiment of the present disclosure, the emissive layer 220 comprises at least one emissive dopant material and a host material.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The term "halo" or "halogen" as used herein includes fluorine, chlorine, bromine and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Hetero-aromatic cyclic radicals also means heteroaryl. Preferred hetero-non-aromatic cyclic groups are those containing 3 or 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Figure 3:
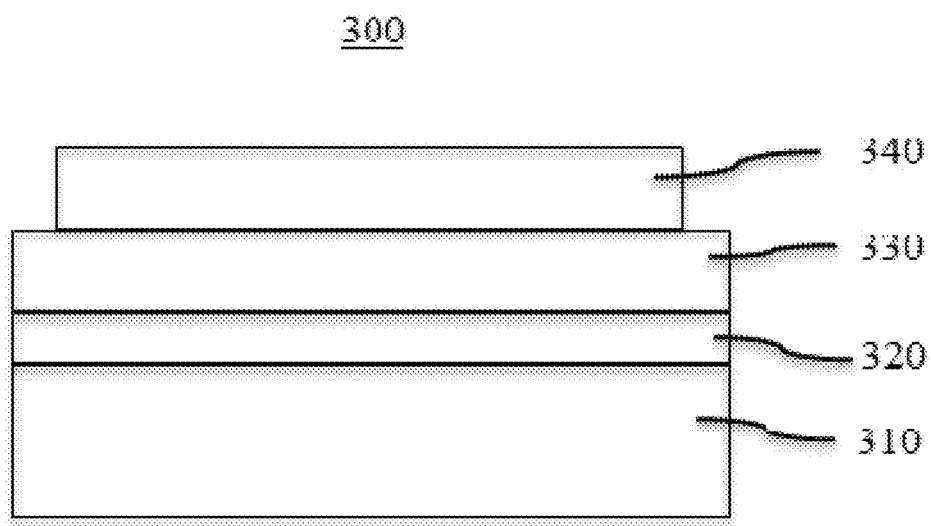
FIG. 3 shows a according to some embodiments of the present disclosure.

Referring to FIG. 3, a novel organic light emitting device 300 according to some embodiments of the present disclosure is disclosed. The organic light emitting device 300 comprises: an anode 310; a cathode 340; and an organic emissive layer 330 disposed between the anode and the cathode. The organic emissive layer 330 comprises one or more host material and an organic phosphorescent emissive dopant material, and an electron blocking layer 320 comprising a neat film of the organic phosphorescent emissive dopant material disposed between the organic emissive layer 330 and the anode 310.

In actual implemented devices, there can be other functional layers between the organic emissive layer 330 and the cathode 340 and between the electron blocking layer 320 and the anode 310. Some examples of such functional layers are illustrated in the examples shown in FIGS. 1 and 2.

In some embodiments of the organic light emitting device, the organic phosphorescent emissive dopant material is a carbene based emitter compound having a carbene ligand coordinated to a metal center.

As used herein, the term "carbene" refers to compounds having a divalent carbon atom with only six electrons in its valence shell when not coordinated to a metal. A useful exercise to determine whether a ligand includes a carbene-metal bond is to mentally deconstruct the complex as a metal fragment and a ligand, and to then determine whether a carbon atom in the ligand that was previously bound to the metal is a neutral divalent carbon atom in the deconstructed state. The resonance forms of a preferred embodiment may be shown as:

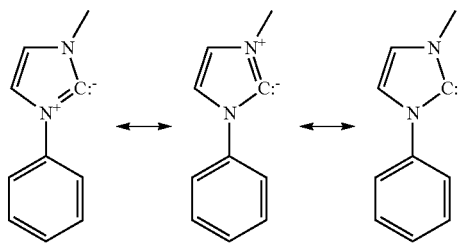

This definition of carbene is not limited to metal-carbene complexes synthesized from carbenes, but is rather intended to address the orbital structure and electron distribution associated with the carbon atom that is bound to the metal. The definition recognizes that the "carbene" may not technically be divalent when bound to the metal, but it would be divalent if it were detached from the metal. Although many such compounds are synthesized by first synthesizing a carbene and then binding it to a metal, the definition is intended to encompass compounds synthesized by other methods that have a similar orbital structure and electron configuration. Lowry & Richardson, *Mechanism and Theory in Organic Chemistry* 256 (Harper & Row, 1976) defines "carbene" in a way that is consistent with the way the term is used herein. Some references may define "carbene" as a carbon ligand that forms a double bond to a metal. While this definition is not being used in the present application, there may be some overlap between the two definitions. A variety of representations are used to depict the bonding in such carbenes, including those in which a curved line is used to indicate partial multiple bonding between the carbene carbon and the adjacent heteroatom(s).

Metal complexes incorporated into OLEDs are provided. In some embodiments, ligands with carbon donors coordinated to the metal center have resonance structures in which none of the atoms have a formal charge and are referred to as carbene ligands. In other embodiments, ligands with carbon donors can only be drawn with a zwitterionic resonance structure, and are hereinafter referred to as "zwitterionic carbon donors." It is possible to draw a resonance structure where the carbon coordinated to the metal center is a carbene as shown below.

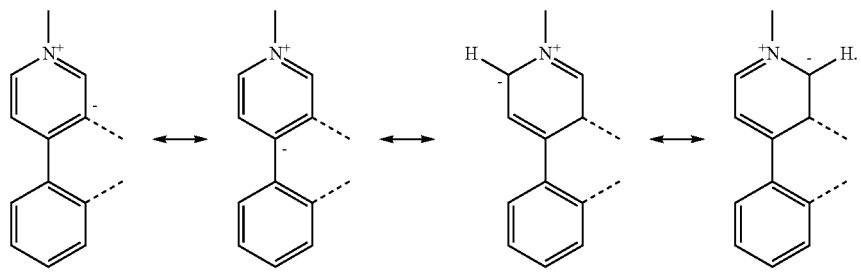

Preferred compounds having zwitterionic carbon donor ligands include heterocyclic compounds comprising at least one nitrogen atom. Preferred compounds include:

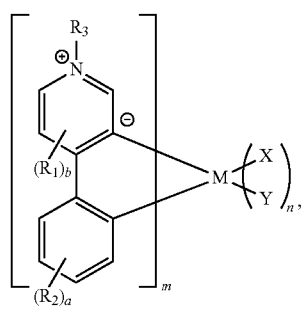

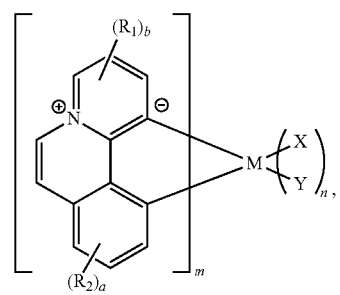

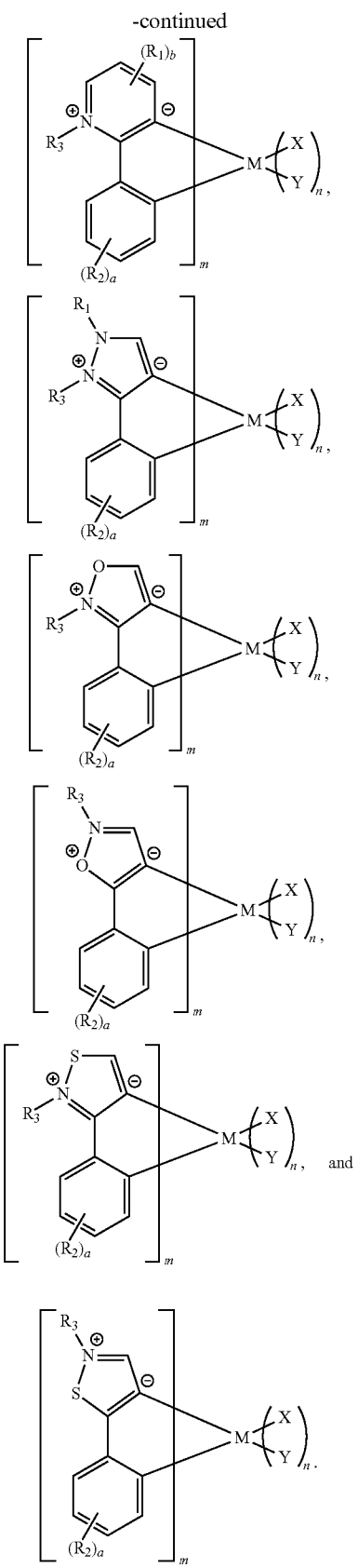

Some embodiments also include zwitterionic carbon donor ligands with the structure:

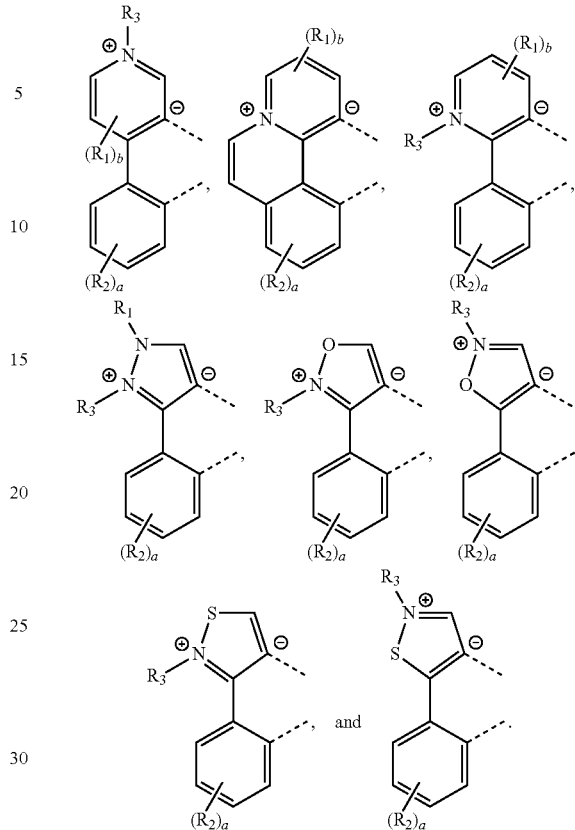

In some embodiments that include a zwitterionic carbon donor ligand, such as those depicted above, the carbon coordinated to the metal center is not directly bonded to a heteroatom.

As used herein, M is a metal; $R_1$ and $R_2$ may be hydrogen, alkyl, alkenyl, alkynyl, aralkyl, CN, $CF_3$, $CO_2R'$, $C(O)R'$, $C(O)NR'_2$, $NR'_2$, $NO_2$, OR', SR', $SO_2$, SOR', $SO_3R'$, halo, aryl, heteroaryl, substituted aryl, substituted heteroaryl, or a heterocyclic group; $R_3$ may be hydrogen, alkyl, alkenyl, alkynyl, aralkyl, aryl, heteroaryl, substituted aryl, substituted heteroaryl, or a heterocyclic group; and additionally or alternatively, two R groups on the same or adjacent ring, together may form independently a 5 or 6-member cyclic group, which may be a cycloalkyl, cycloheteroalkyl, aryl, or heteroaryl; and wherein said cyclic group may be substituted by one or more substituents J; each substituent J may be R', CN, $CF_3$, $C(O)OR'$, $C(O)R'$, $C(O)NR'_2$, $NR'_2$, $NO_2$, OR', SR', $SO_2$, SOR', or $SO_3R'$, and additionally, or alternatively, two J groups on adjacent ring atoms may form a fused 5- or 6-membered aromatic group; each R' may be halo, H, alkyl, alkenyl, alkynyl, heteroalkyl, aralkyl, aryl, and heteroaryl; (X—Y) may be a photoactive ligand or an ancillary ligand. Non-limiting examples of ancillary ligands may be found in PCT Application Publication WO 02/15645 A1 to Lamansky et al. At pages 89-90, which is incorporated herein by reference. "a" is 0, 1, 2, 3, or 4; "b" is 0, 1, 2, or 3; "c" is 0, 1, or 2; "m", the number of photoactive ligands of a particular type, may be a value from 1 to the maximum number of ligands that may be attached to metal M; m+n is the maximum number of ligands that may be attached to metal M.

The metal M may be Ir, Pt, Pd, Rh, Re, Ru, Os, Ti, Pb, Bi, In, Sn, Sb, Te, Al, Ga, Au, and Ag. In some embodiments, the metal is Ir.

In some embodiments of the organic light emitting device, the carbene based emitter compound includes at least one carbene ligand that includes a nitrogen containing heterocyclic ring. Some examples include:

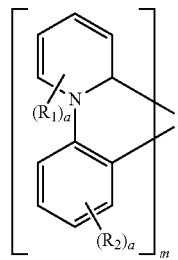 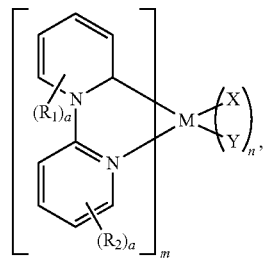

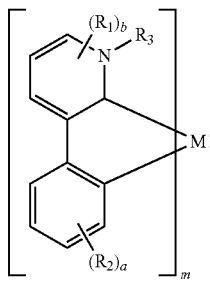 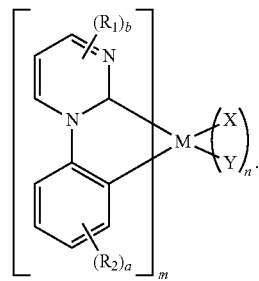

Some embodiments also include ligands with the structure:

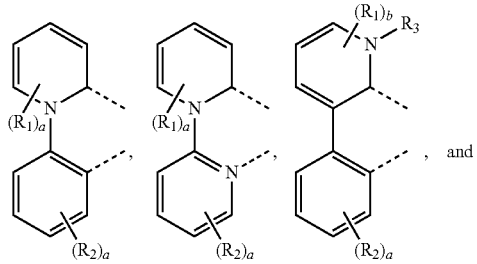

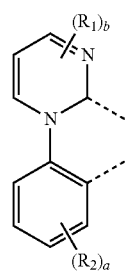

In some other embodiments, the carbene based emitter compound has the structure:

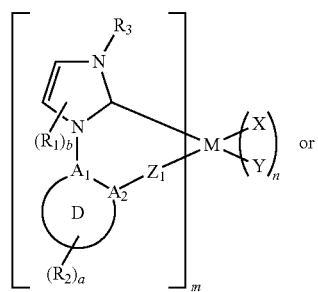

Formula (1)

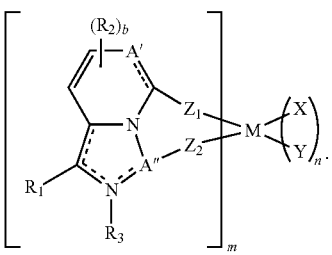

Formula (2)

where ring D may be an aromatic cyclic, heterocyclic, fused cyclic, or fused heterocyclic ring, and ring D may be optionally substituted with one or more substituents $R_2$. $Z_1$ and $Z_2$ may be a direct bond, O, S, or NR'. $A_1$, $A_2$, A', and A'' may be C, N, or P. In these embodiments, at least one carbene atom is coordinated to metal M. Some embodiments include carbene ligands having the structure:

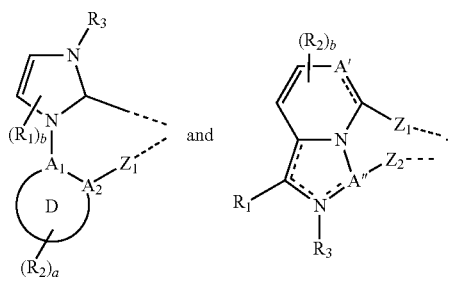

In some embodiments, the carbene ligands can be selected from the group consisting of:

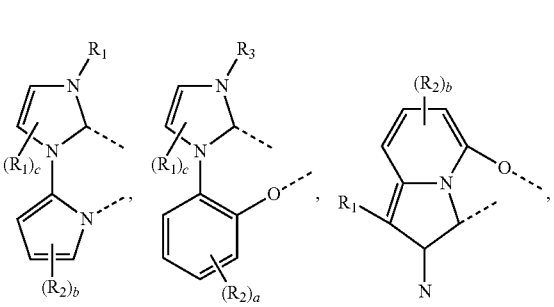

-continued

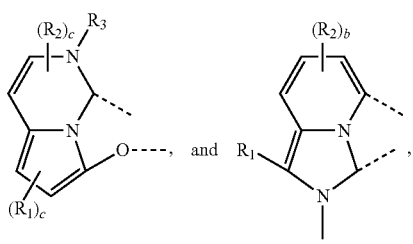

wherein c is 0, 1, or 2.

In the embodiments where the carbene based emitter compound has the structure of Formula (1), each of $R_1$ can be hydrogen or an alkyl having 1-15 carbon atoms, each of $R_2$ can be hydrogen or an alkyl having 1-15 carbon atoms, and M can be Ir or Pt.

In some embodiments, the carbene based emitter compound having the structure of Formula (1) has the structure:

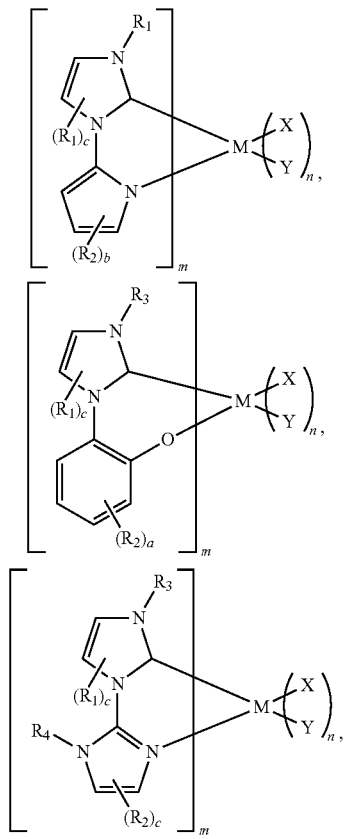

-continued

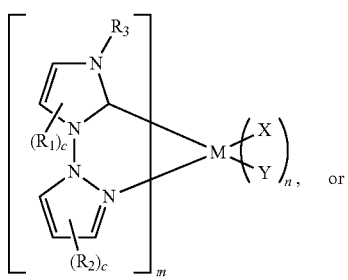

where c is 0, 1, or 2, wherein $R_4$ is selected from H, alkyl, alkenyl, alkynyl, aralkyl, aryl, heteroaryl, substituted aryl, substituted heteroaryl, or a heterocyclic group.

In some embodiments, the carbene based emitter compound includes ligands with the structure:

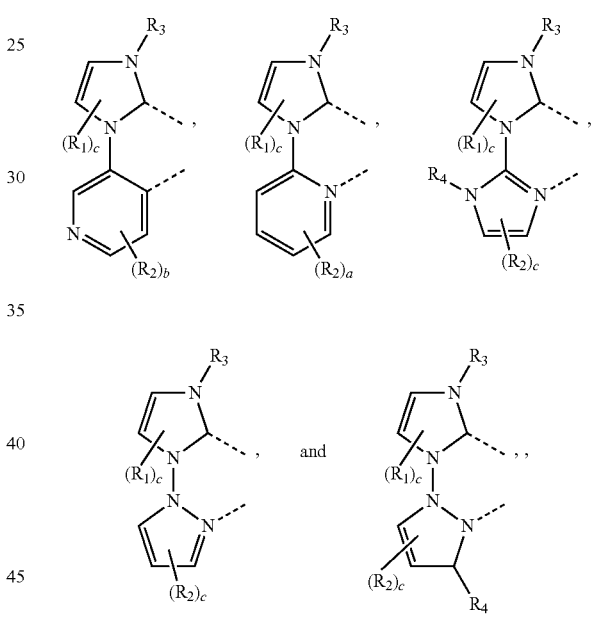

where c is 0, 1, or 2, wherein $R_4$ is selected from H, alkyl, alkenyl, alkynyl, aralkyl, aryl, heteroaryl, substituted aryl, substituted heteroaryl, or a heterocyclic group.

In some other embodiments, the carbene based emitter compound includes a triazole ring coordinated to a metal. In some examples, the compound has the structure:

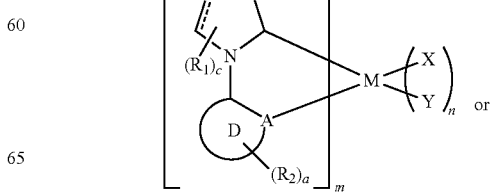

-continued
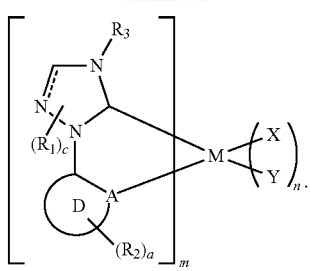
These embodiments include ligands with the structure:
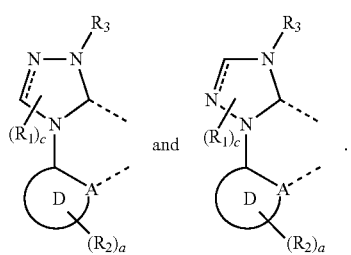
In some examples, the compound has the structure:
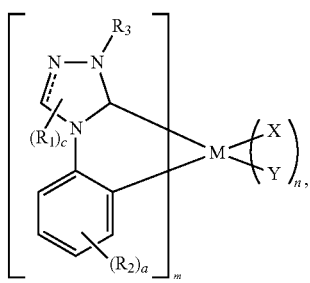
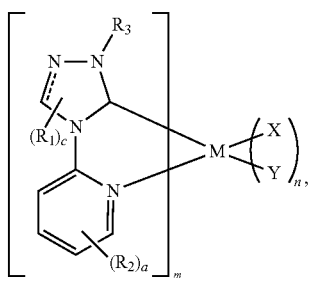
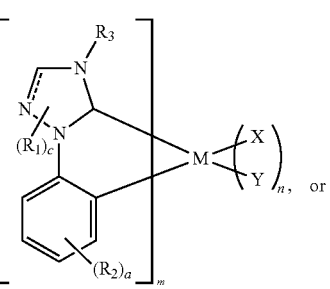, or
-continued
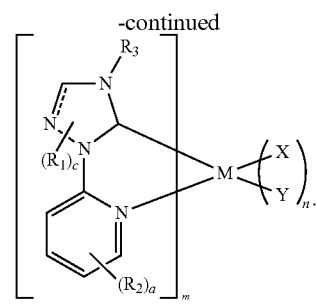
These embodiments include ligands having the structure:
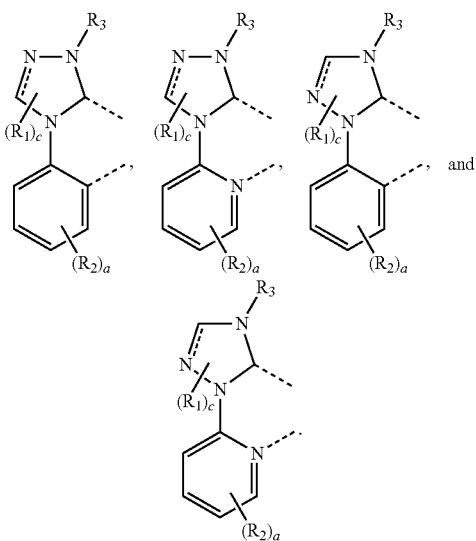
In some embodiments, the carbene based emitter compound has the structure:
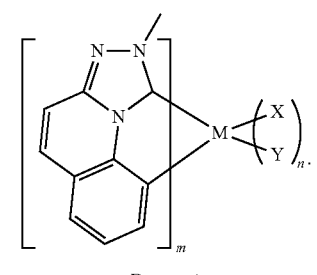
Dopant A
This embodiment includes a ligand with the structure:
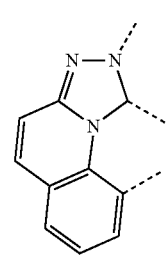
Ligand A In another embodiment, the carbene based emitter compound has the structure:

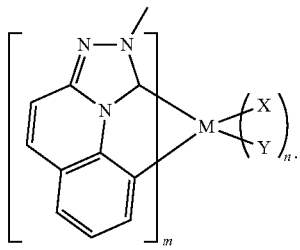

This embodiment includes a ligand with the structure:

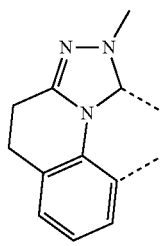

In other embodiments, the carbene based emitter compound includes a tetrazole ring coordinated to a metal. In some examples, the compound has the structure:

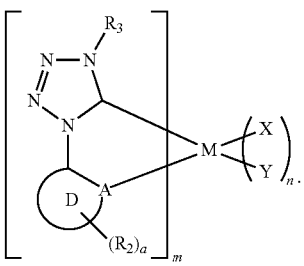

This embodiment includes a ligand with the general structure:

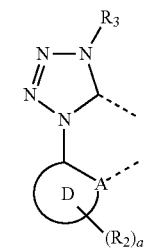

In some embodiments, the ligand has the structure:

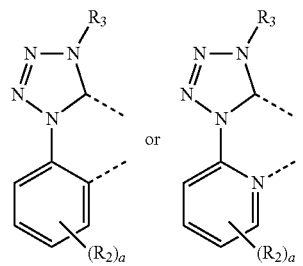

In some examples, the compound has the structure:

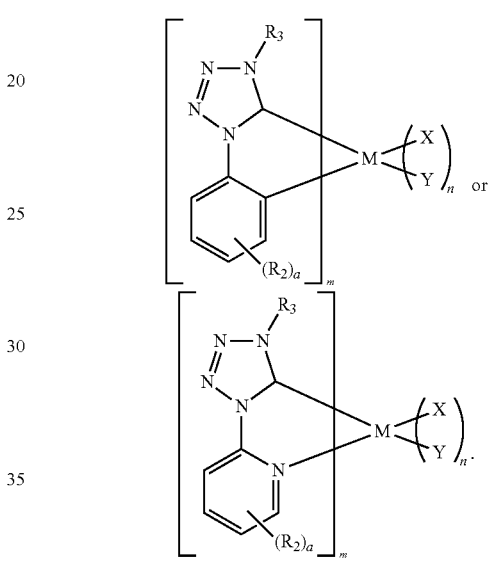

In some embodiments of the organic light emitting device, the carbene based emitter compound is Ir(pmp)$_3$.

In some embodiment, where the carbene based emitter compound has the structure of Formula (1), D is a 5-membered aromatic heterocyclic ring. In some embodiments, D is selected from the group consisting of

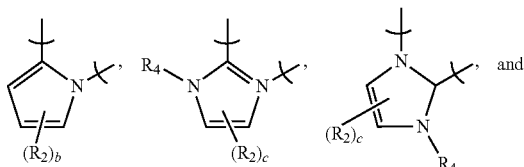

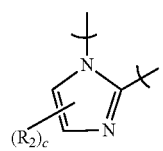

wherein R4 is selected from hydrogen, alkyl, alkenyl, alkynyl, aralkyl, aryl, heteroaryl, substituted aryl, substituted heteroaryl, or a heterocyclic group.

In some embodiments, where the carbene based emitter compound has the structure of Formula (1), D is a 6-membered aromatic heterocyclic ring. In some embodiments, D is

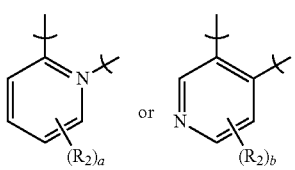

In some embodiments, where the carbene based emitter compound has the structure of Formula (1), D-Z₁ is

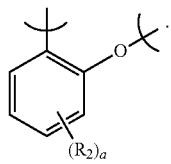

Figure 4:
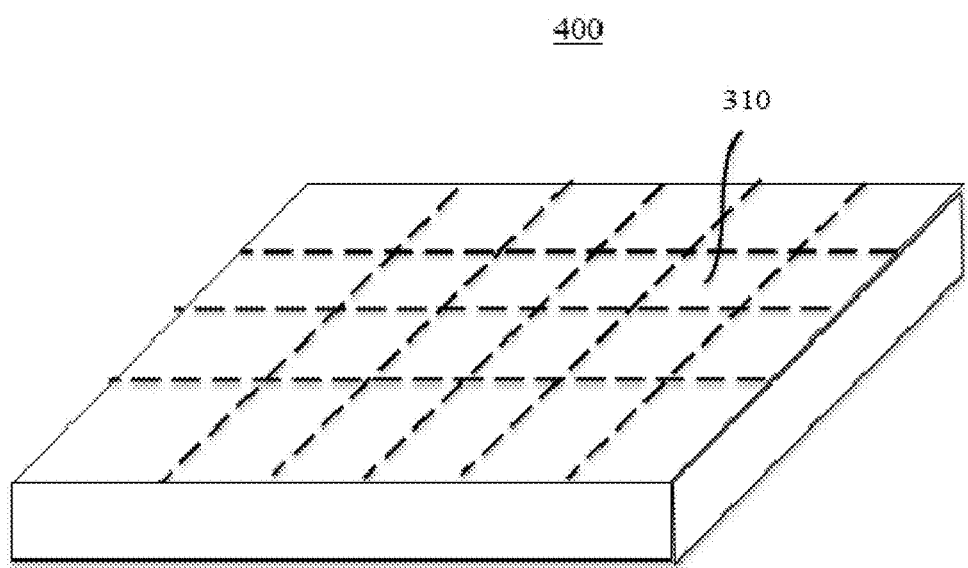
FIG. 4 shows a device 400 comprising one or more organic light emitting devices such as the organic light s device 300 according to some embodiments.

Referring to FIG. 4, according to another aspect of the present disclosure, a device 400 comprising one or more organic light emitting devices such as the organic light emitting device 300 is disclosed.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable device, laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

In some embodiments, two or more hosts are preferred in the emissive layer. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv C-C_nH_{2n+1}$, $Ar_1$, $Ar_1-Ar_2$, and $C_nH_{2n}-Ar_1$, or the host has no substitution. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

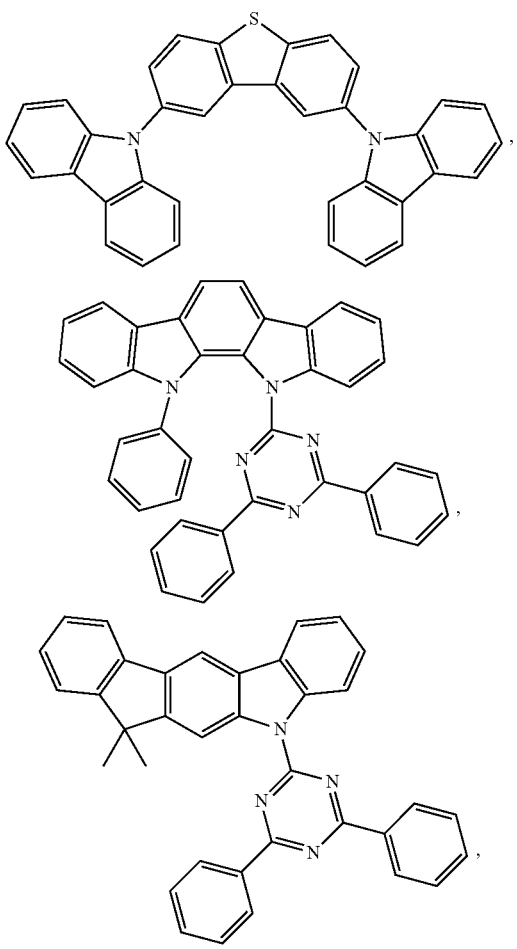

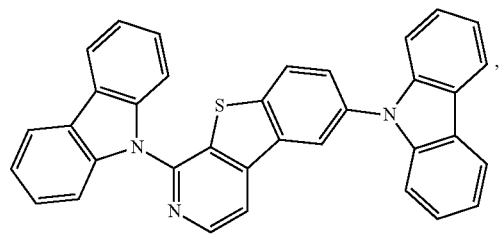

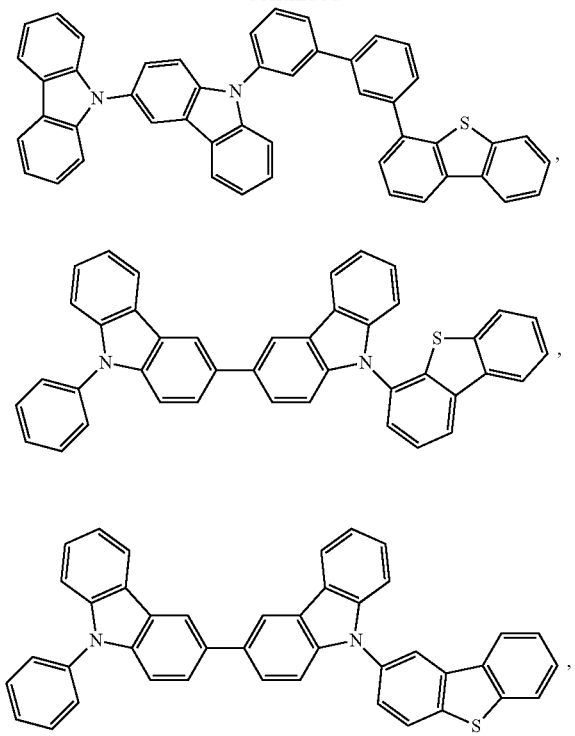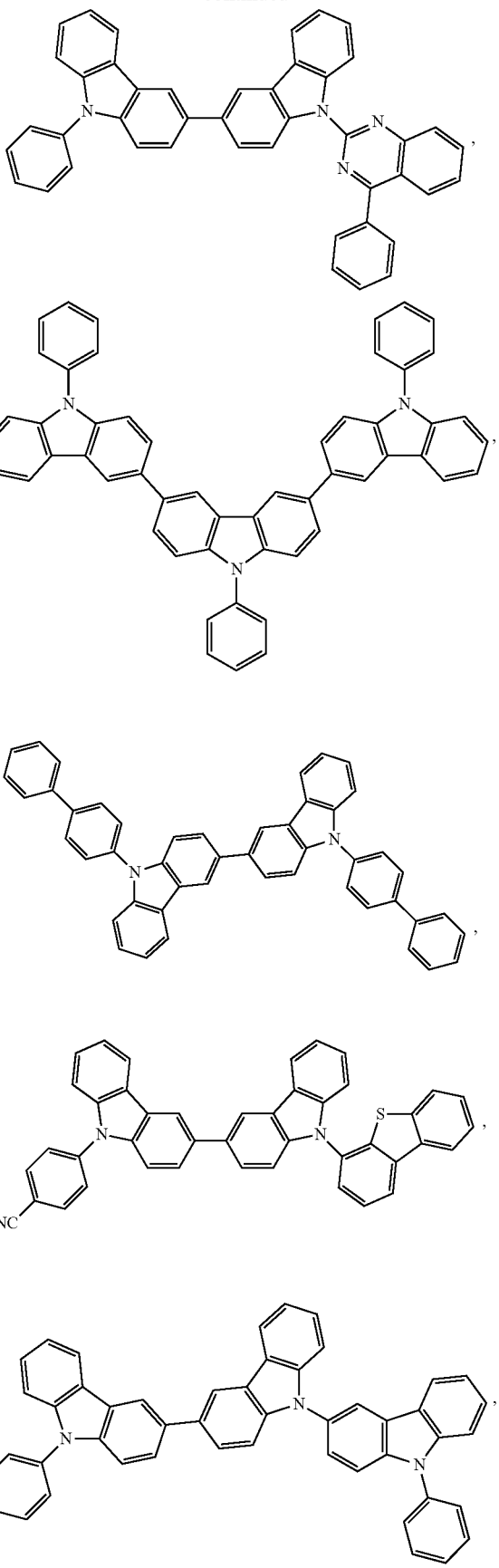

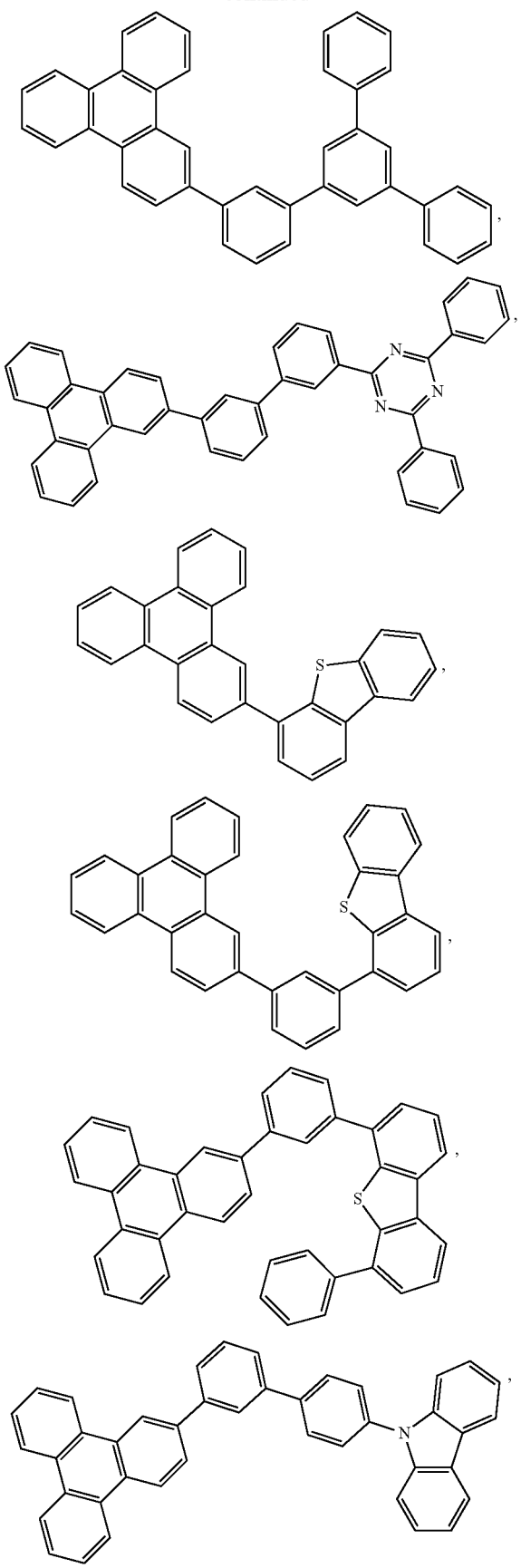

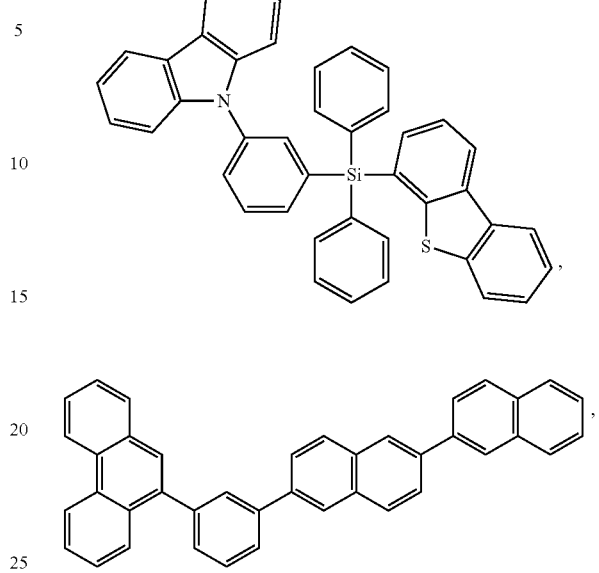

and combinations thereof.

Additional information on possible hosts is provided below

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

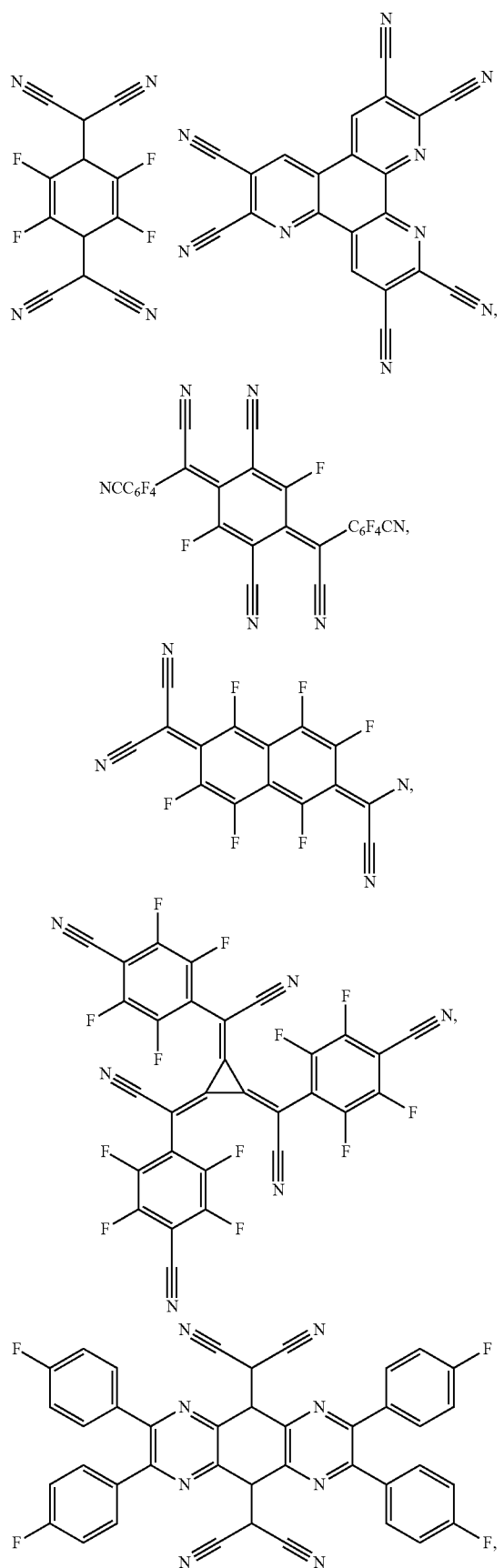
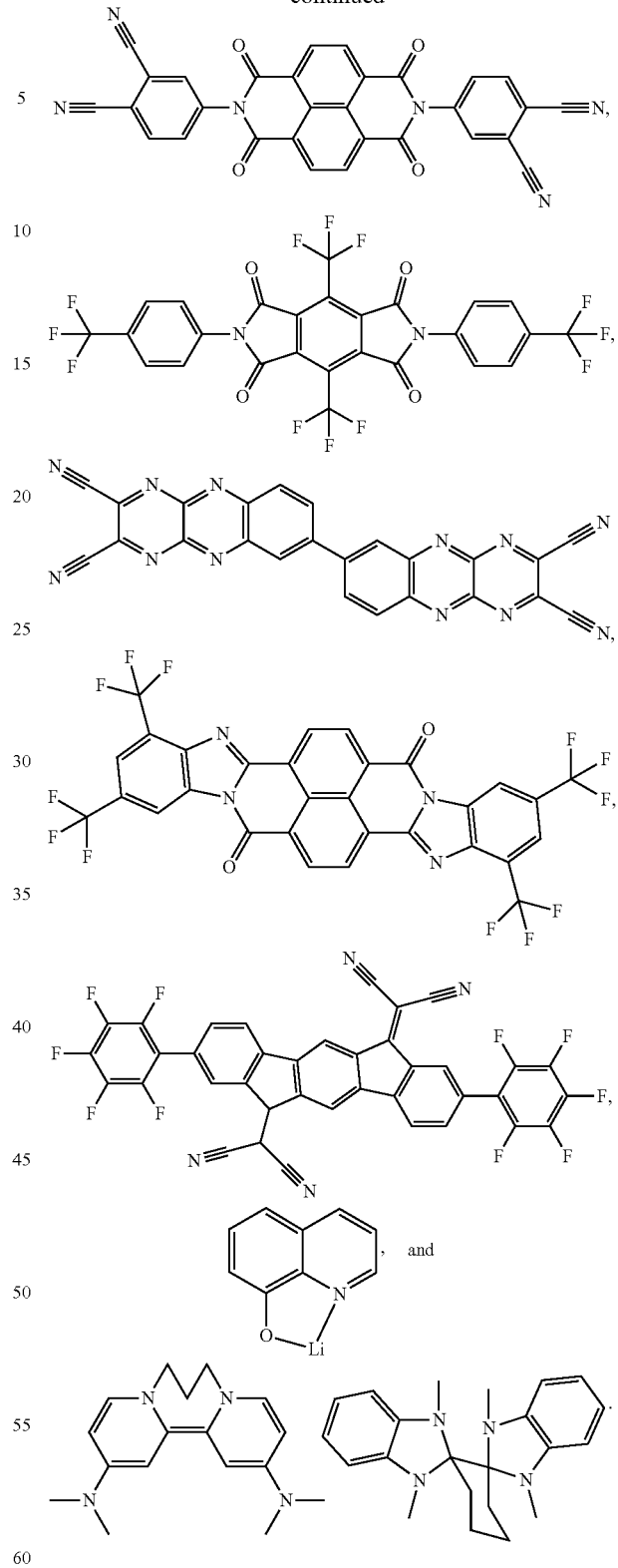
HIL/HTL:
A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds. Examples of aromatic amine derivatives used in HIL or HTL include, but not limit to the following general structures:

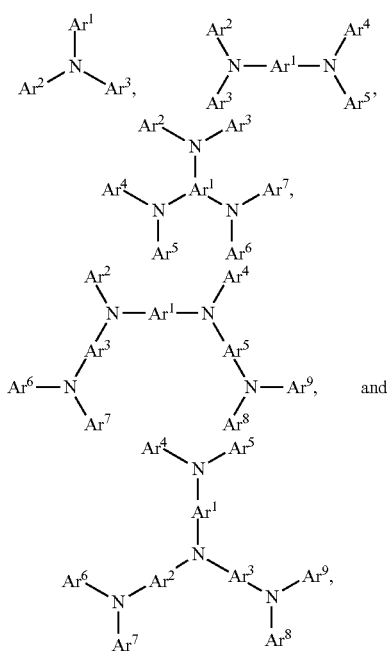

Each of $Ar^1$ to $Ar^9$ in the above structures is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

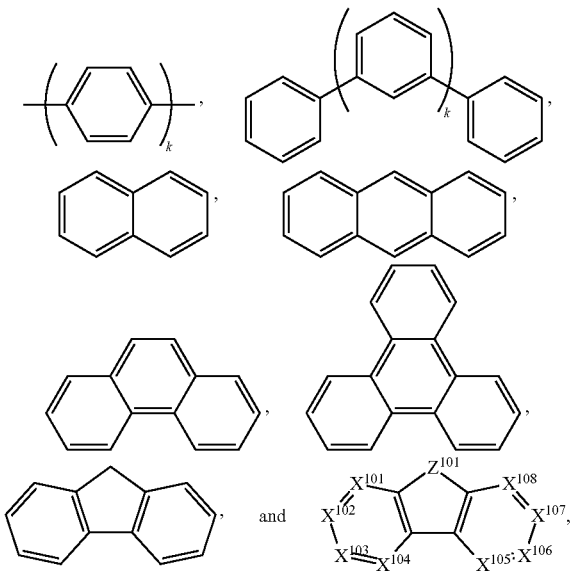

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

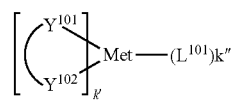

wherein Met is a metal, which can have an atomic weight greater than 40; $(Y^{101}-Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}-Y^{102})$ is a 2-phenylpyridine derivative. In another aspect, $(Y^{101}-Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417,

| 31 | 32 |
|---|---|
| US2008107919, US20090115320, US20090167161, US2009066235, US2011007385, US20110163302, US2011240968, US2011278551, US2012205642, US2013241401, US20140117329, US2014183517, U.S. Pat. No. 5,061,569, U.S. Pat. No. 5,639,914, WO05075451, WO07125714, WO08023550, WO08023759, WO2009145016, WO2010061824, WO2011075644, | WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018, |
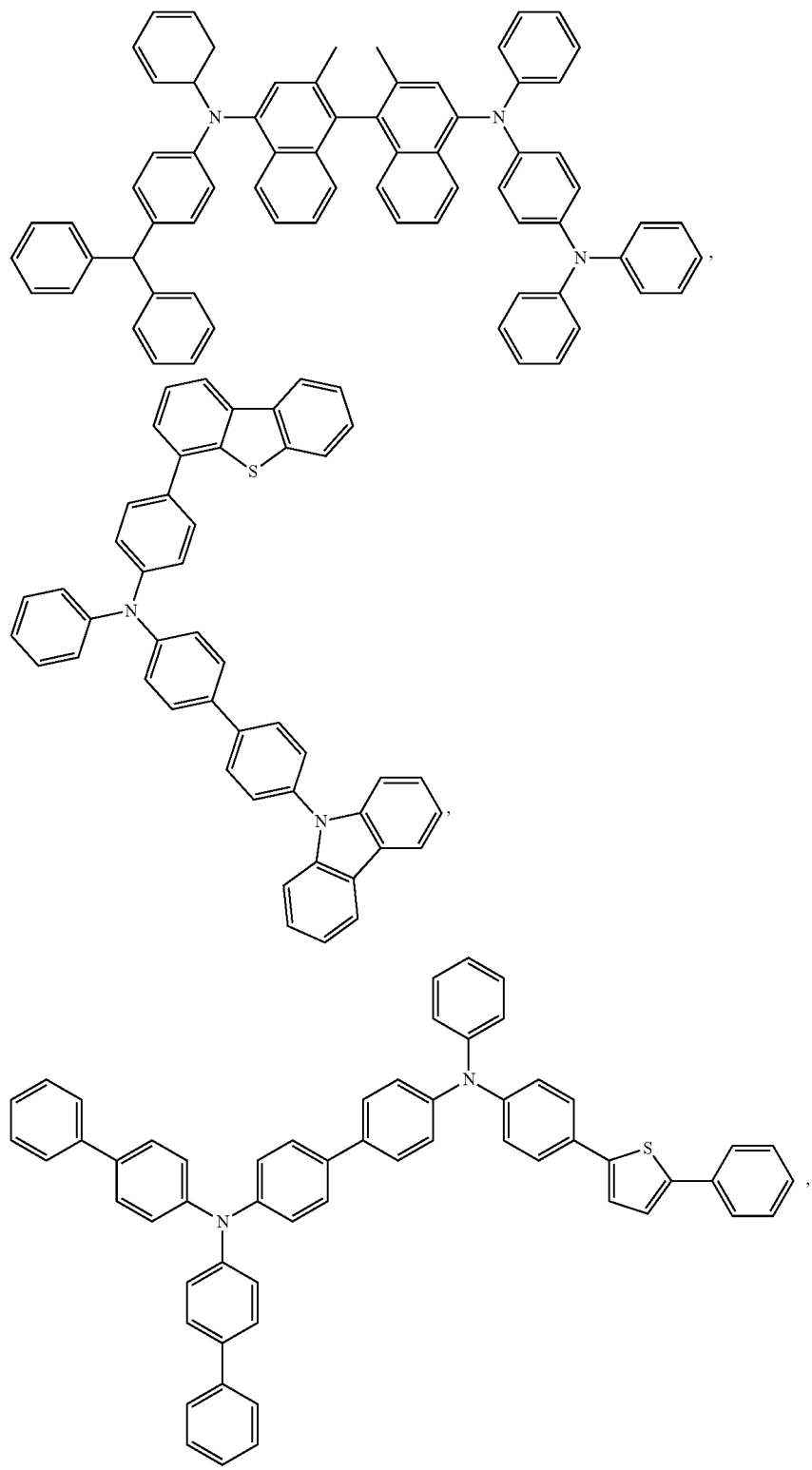

-continued
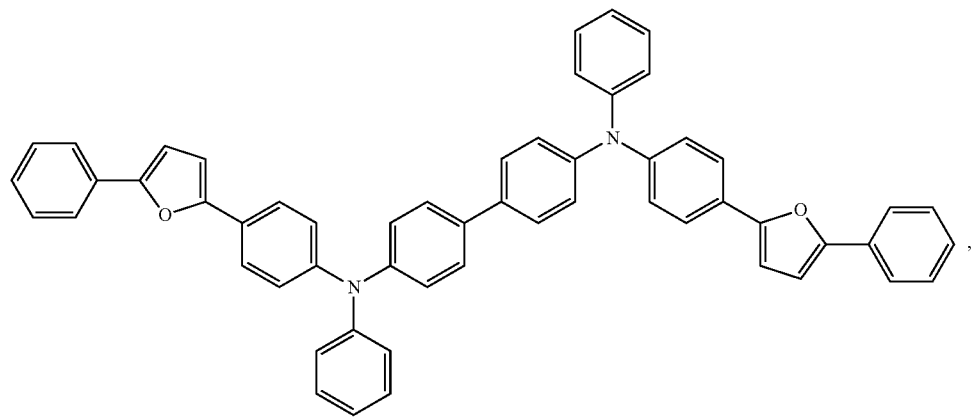
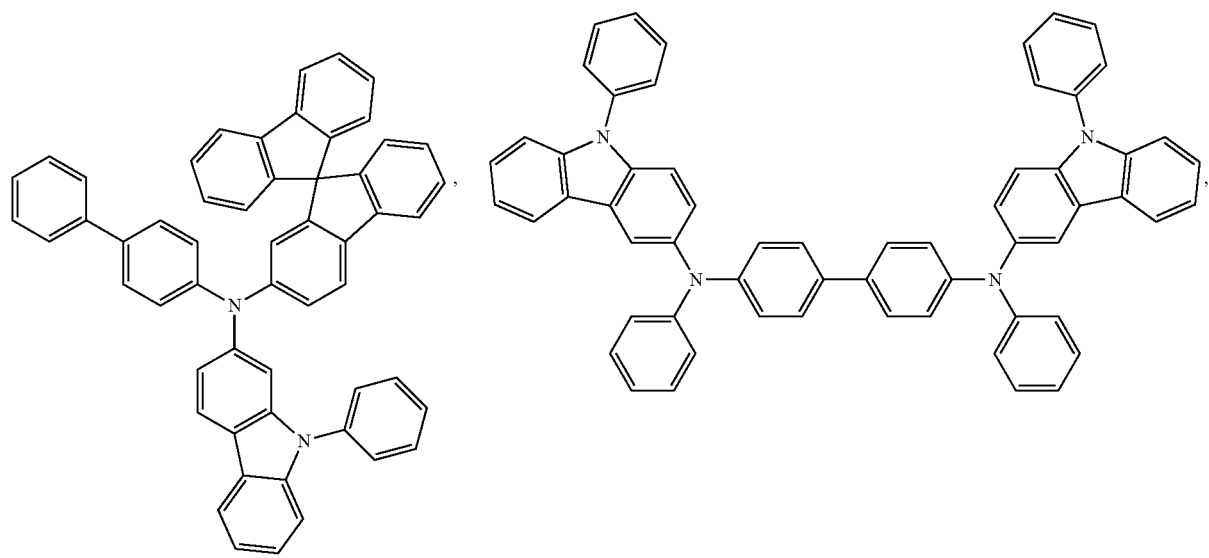
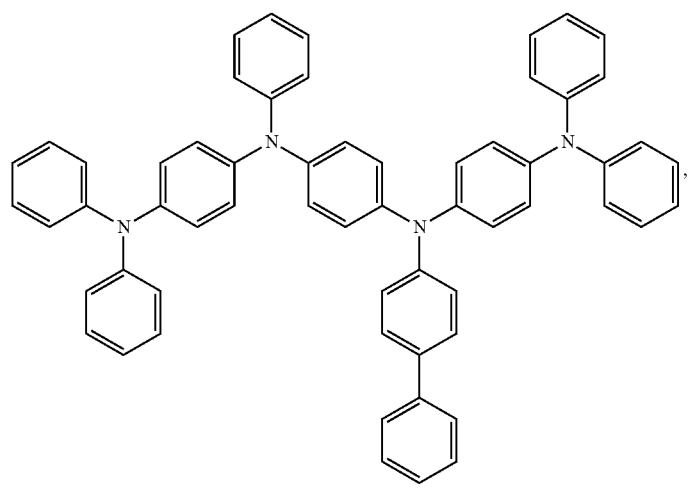

-continued
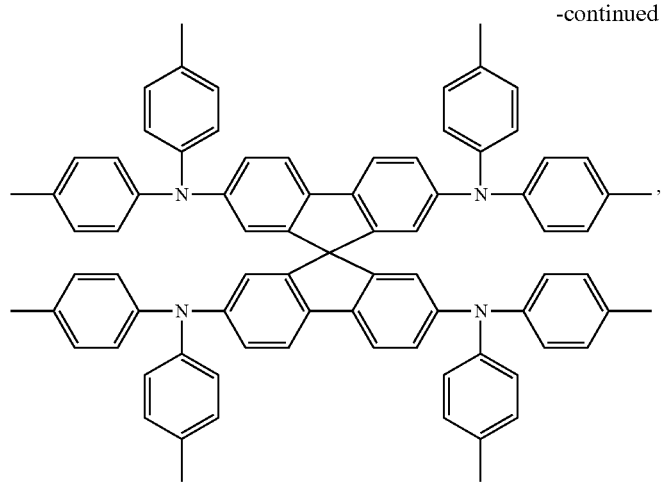
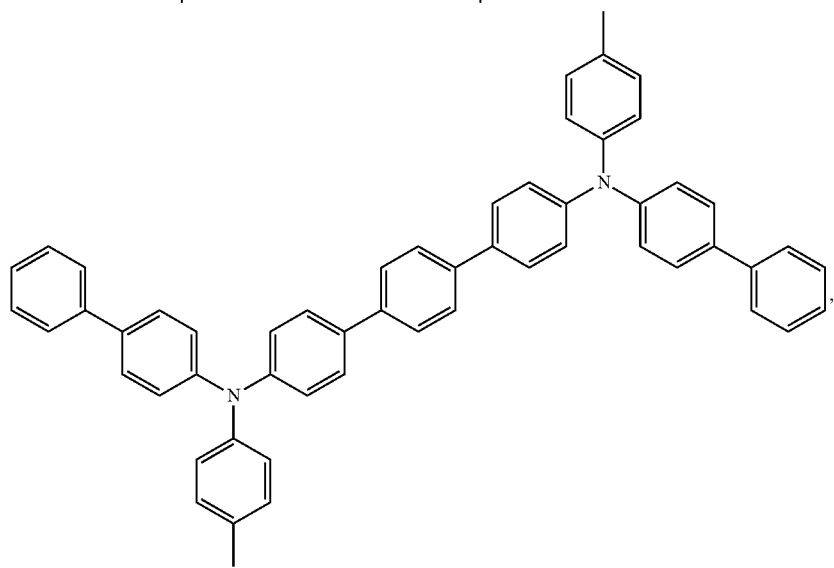
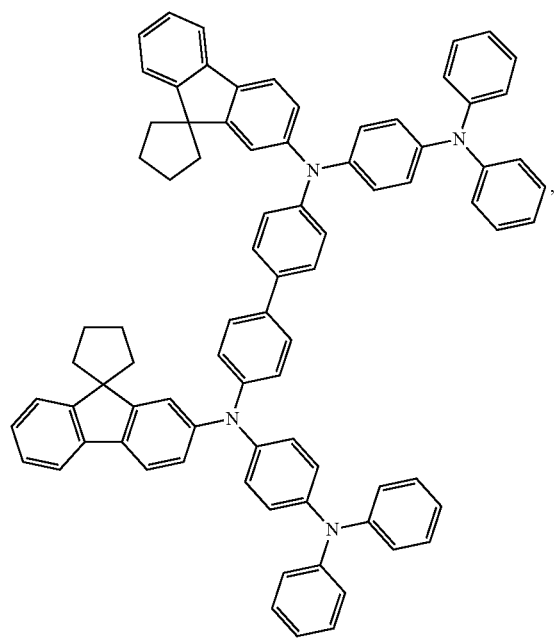

-continued
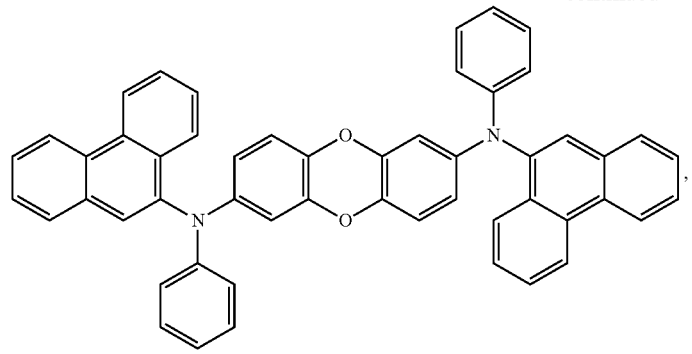
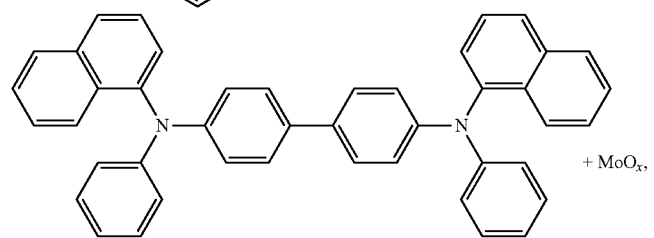
+ MoOx,
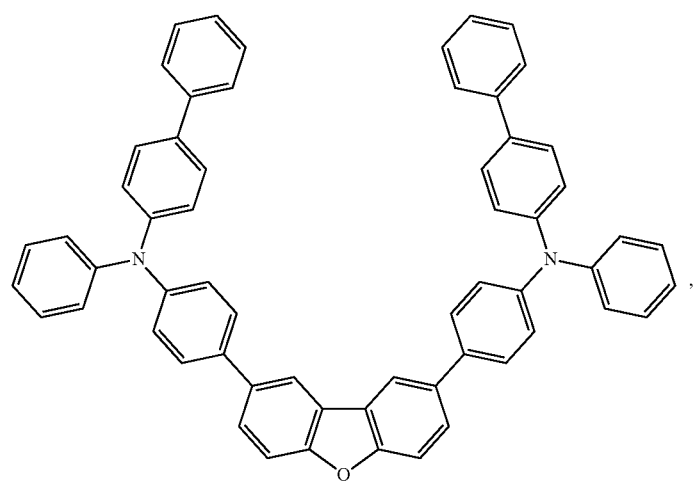
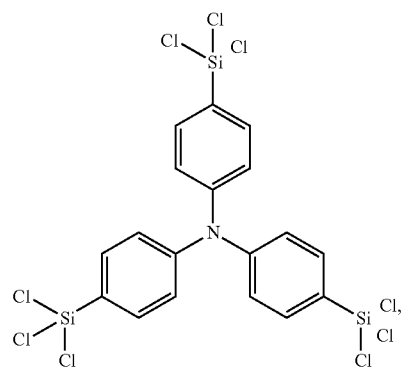
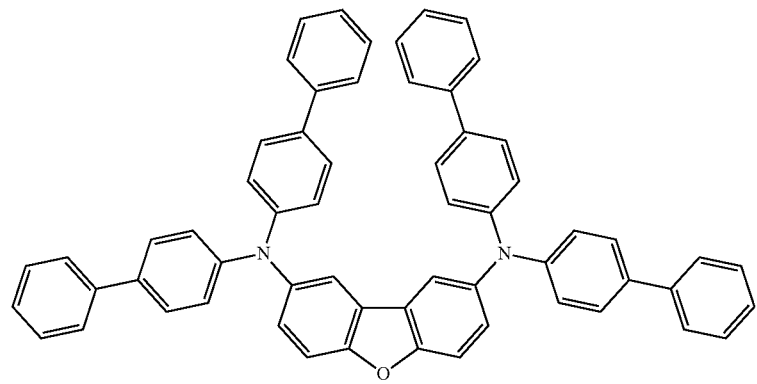
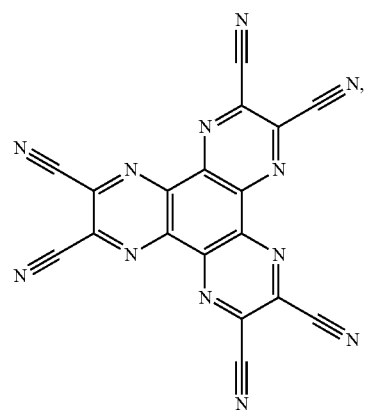

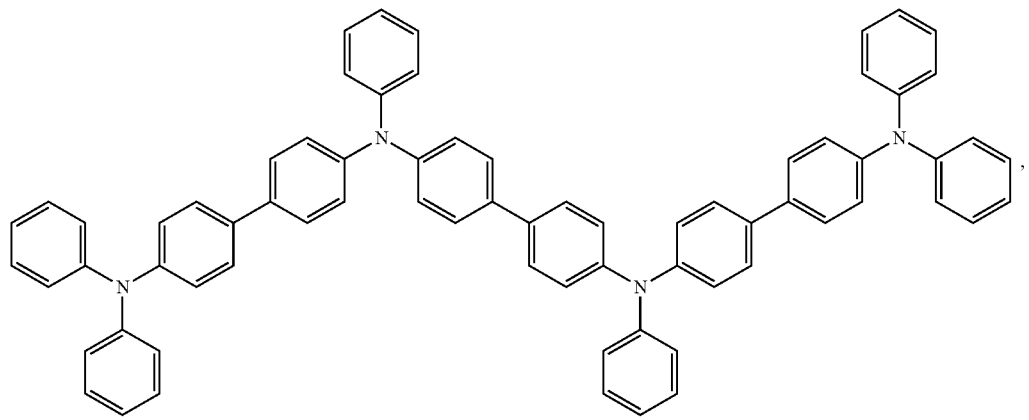
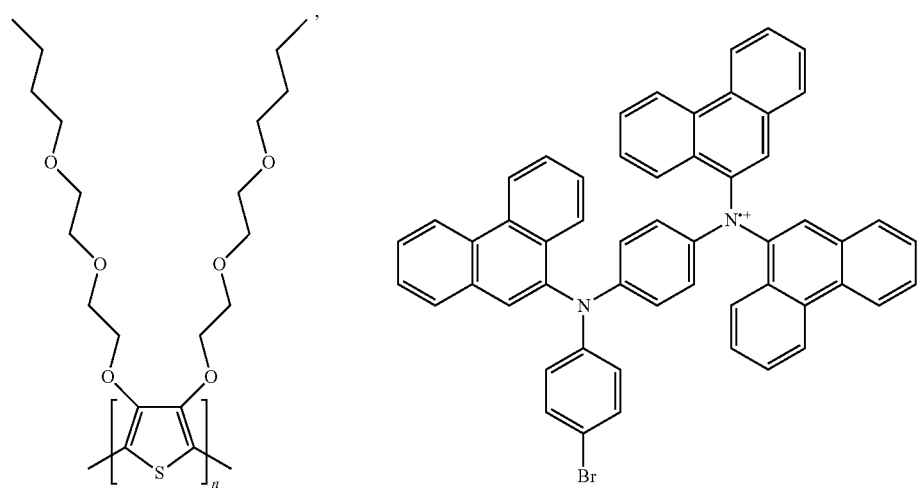
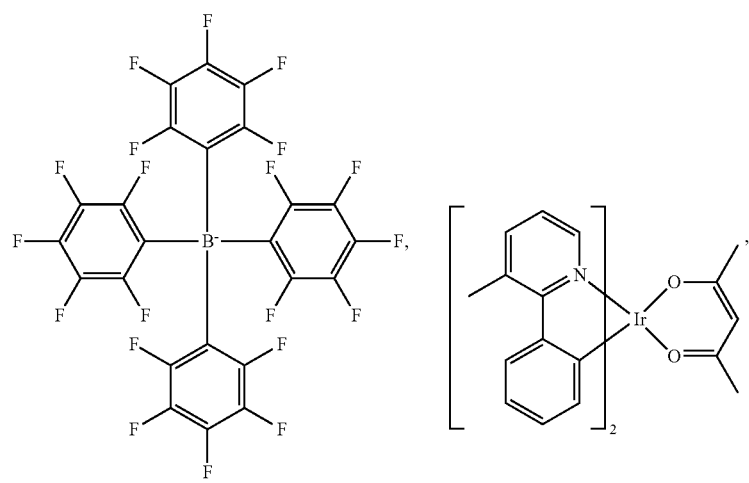

-continued
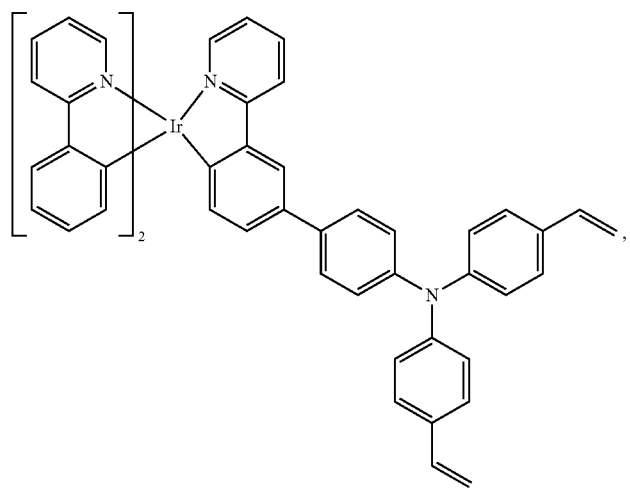
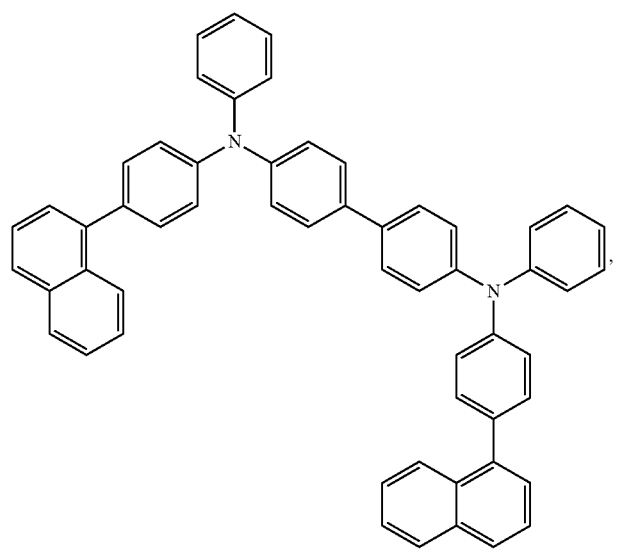
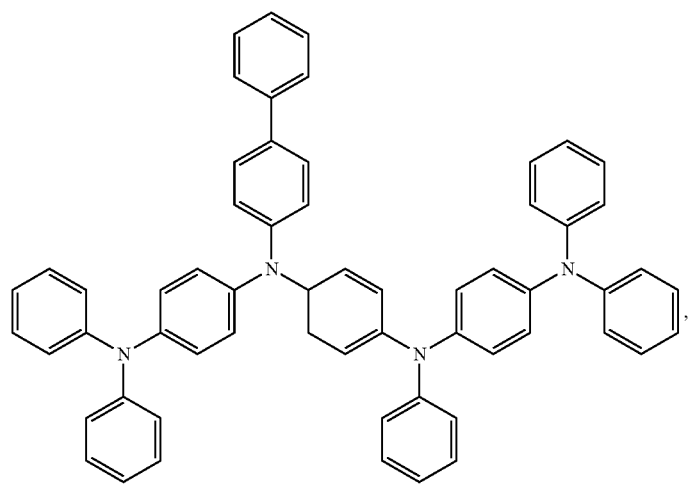

-continued
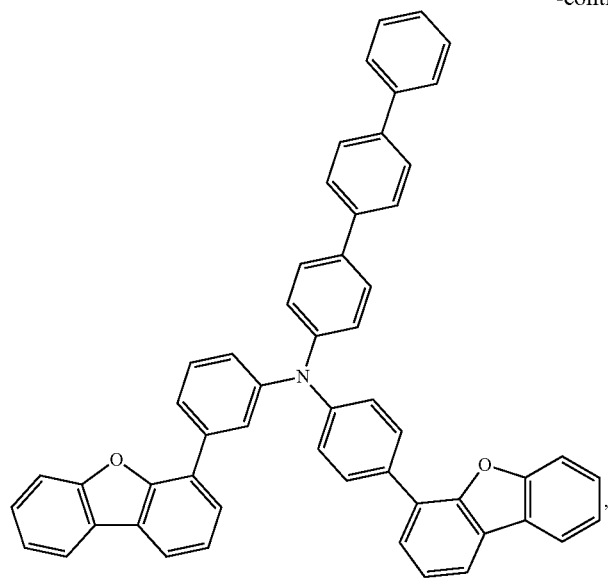
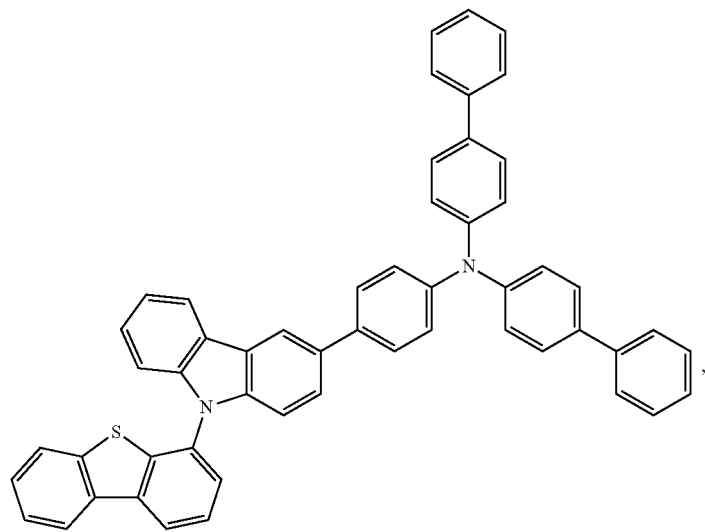
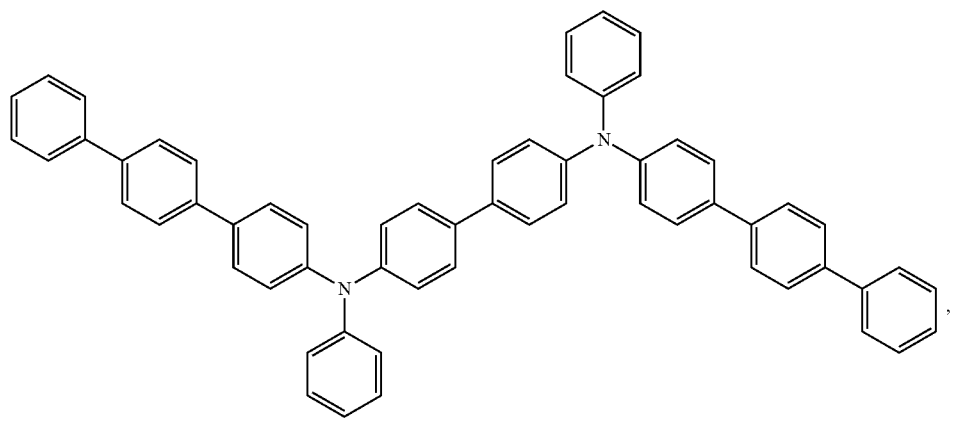

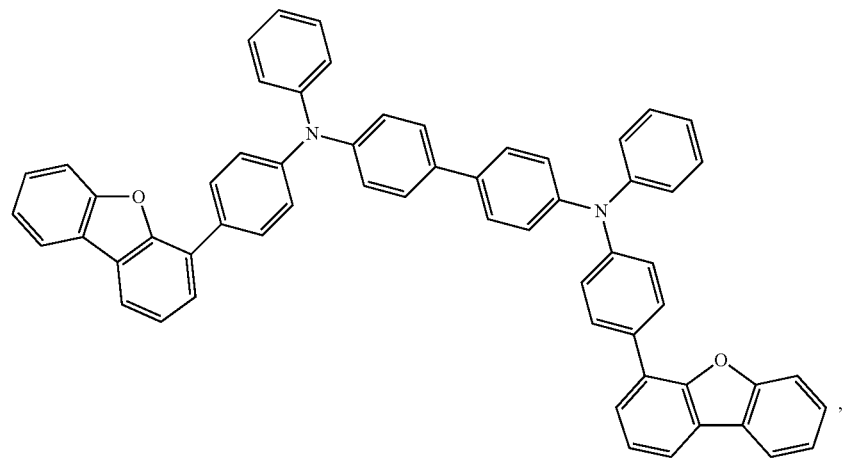
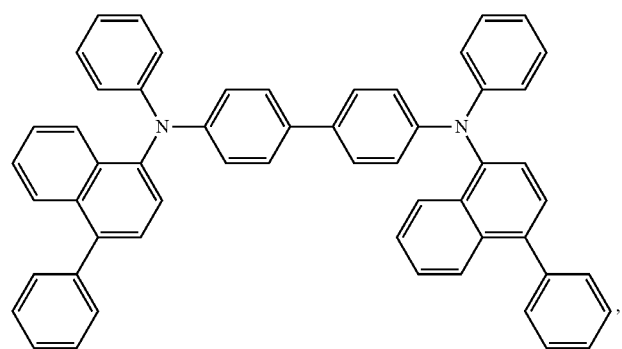
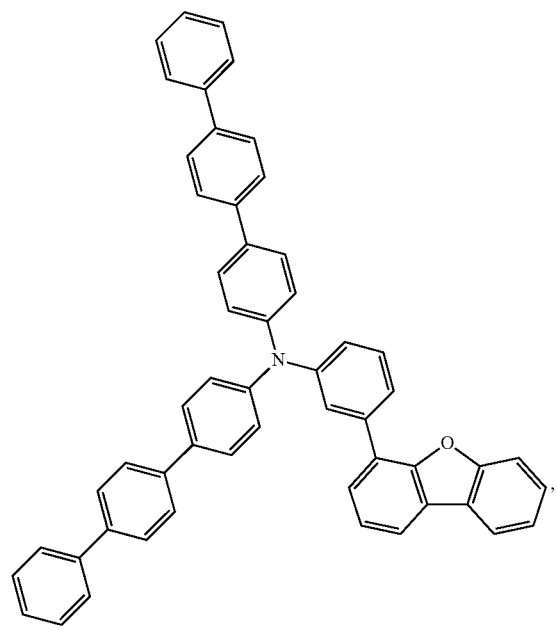

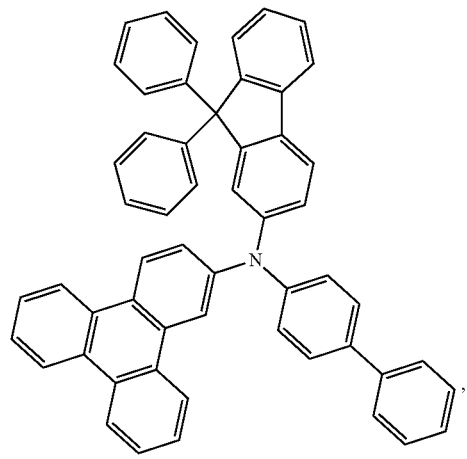
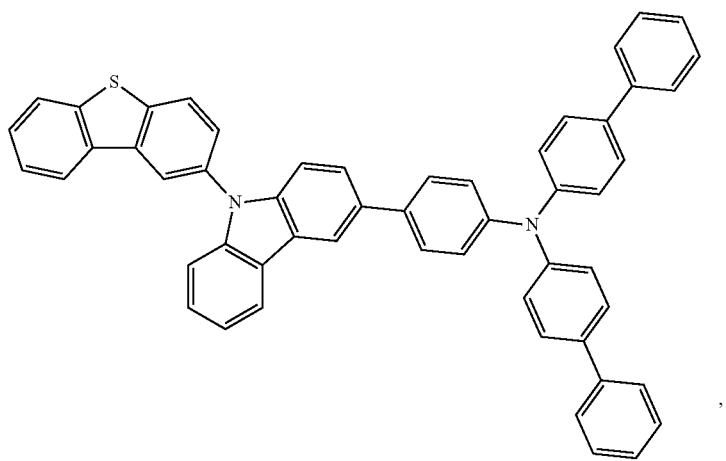
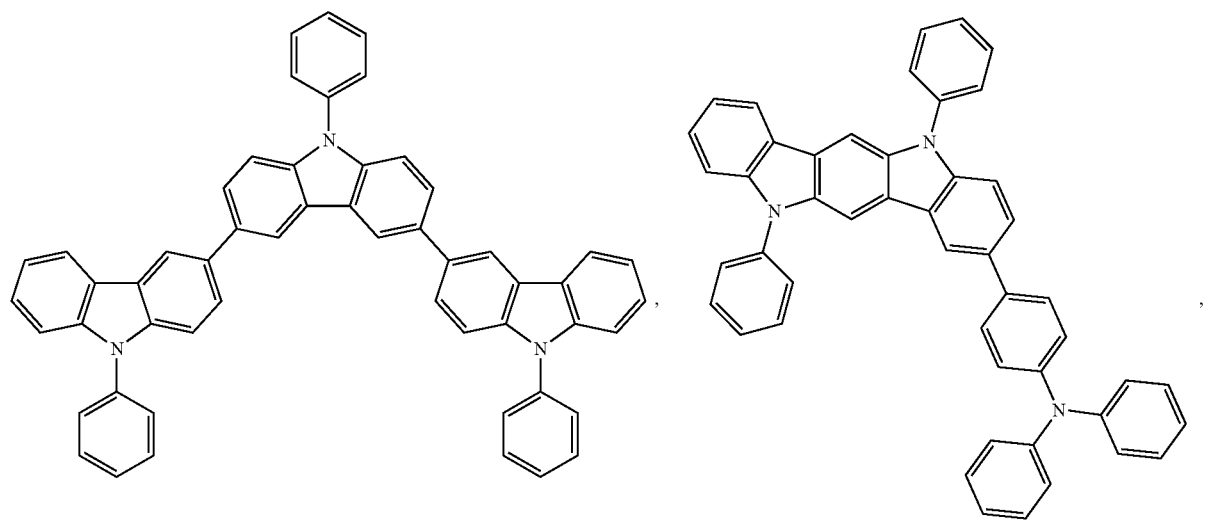
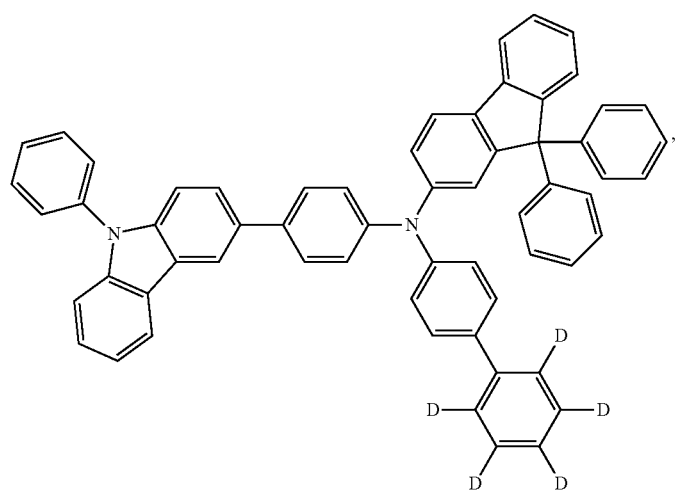

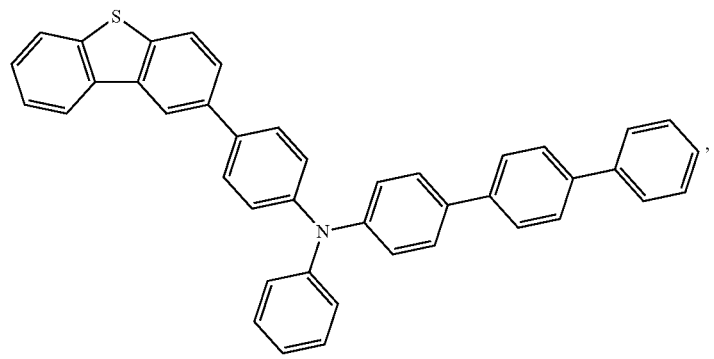
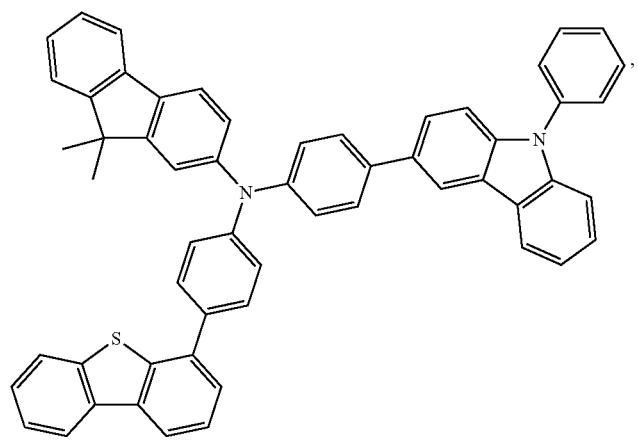
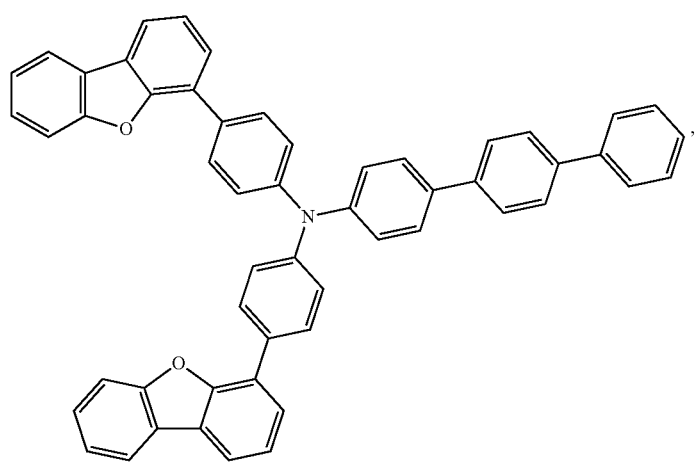

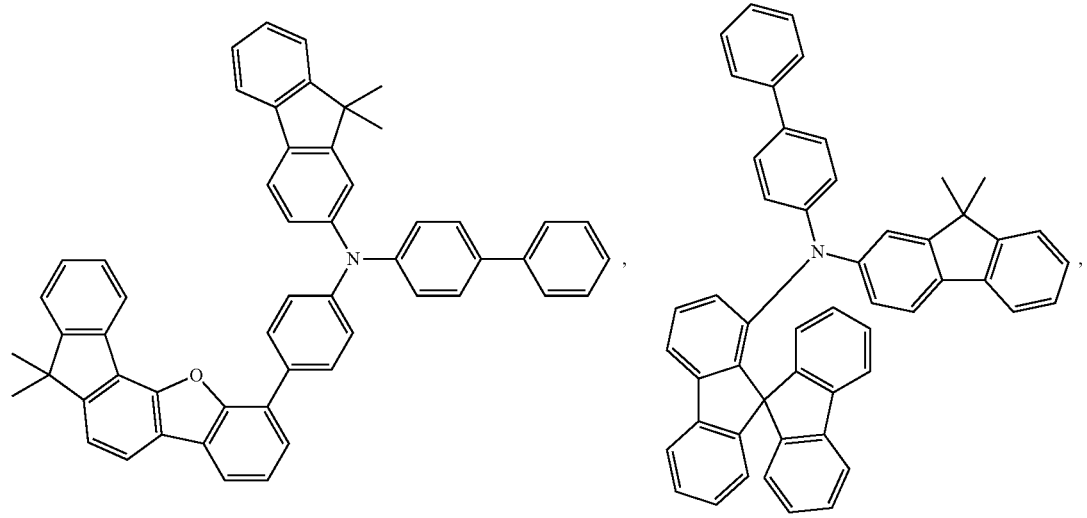
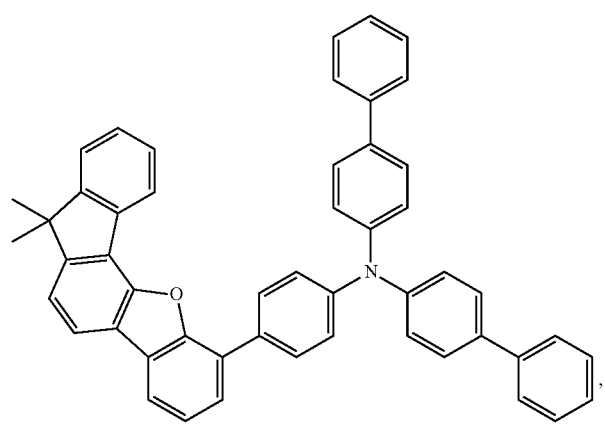
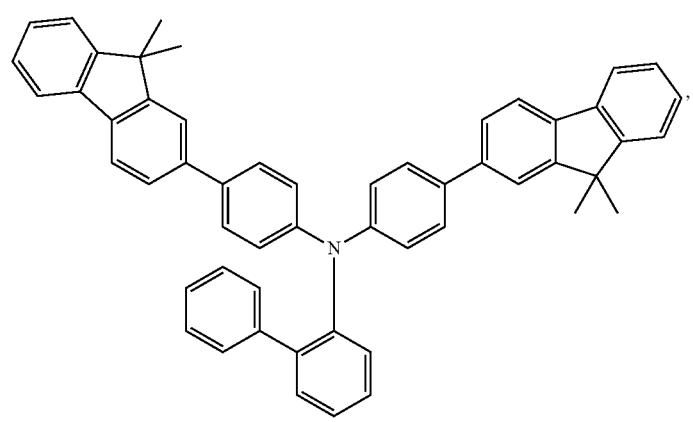

-continued
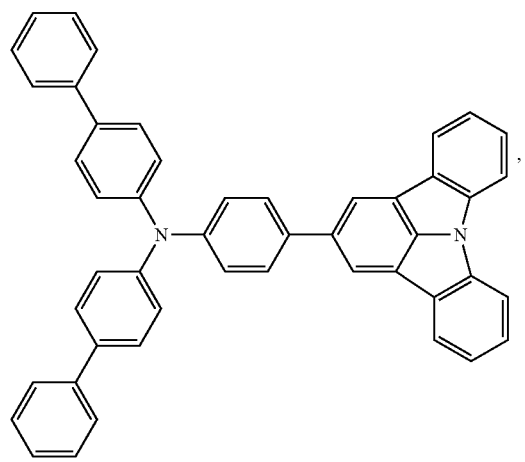
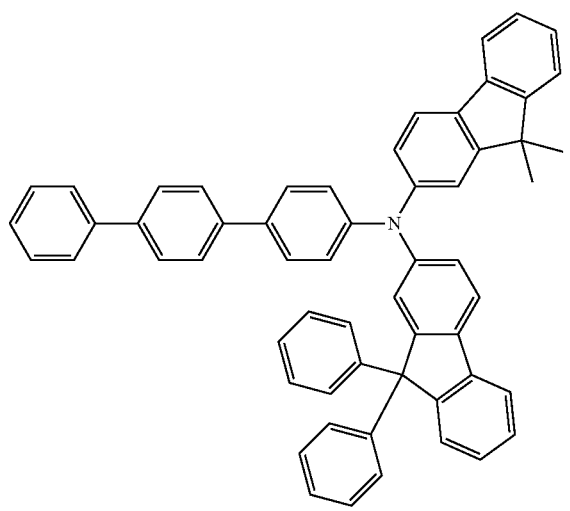
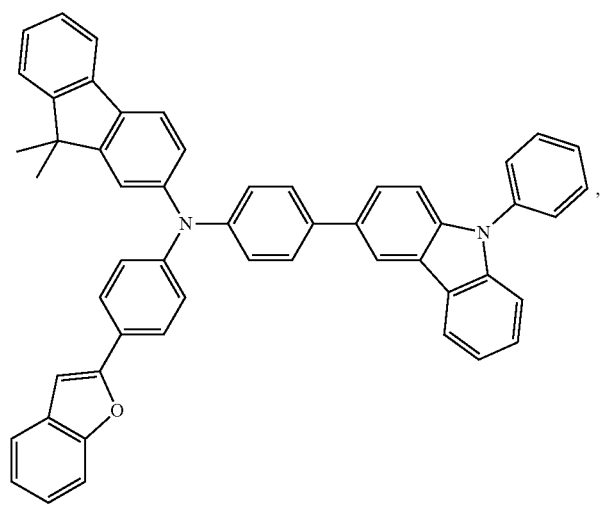
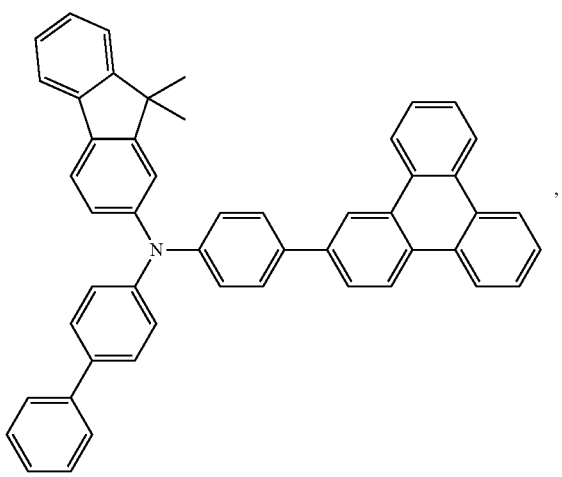
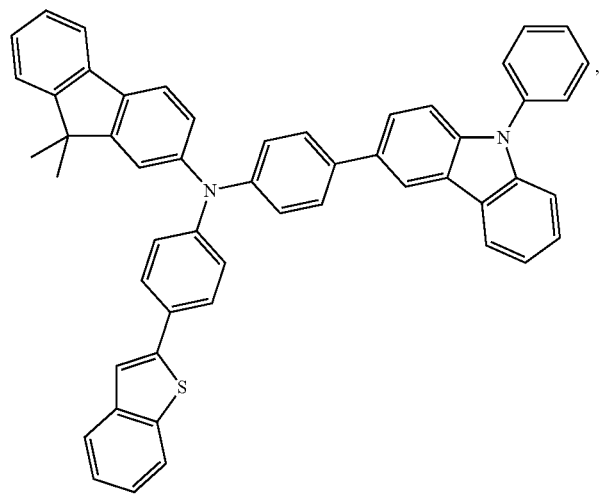

-continued
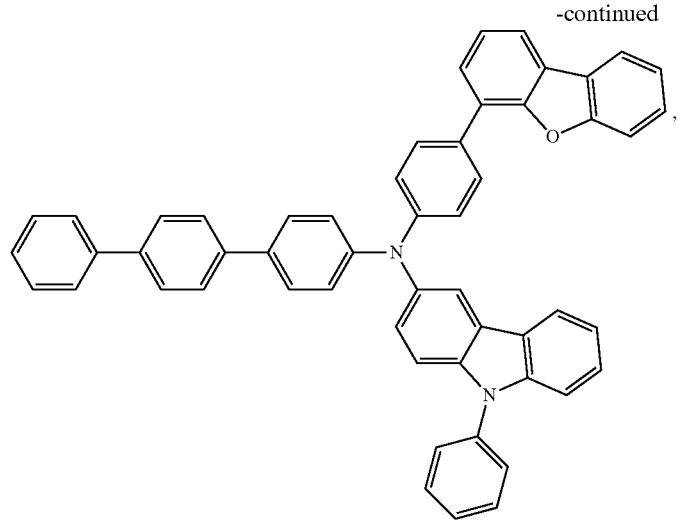
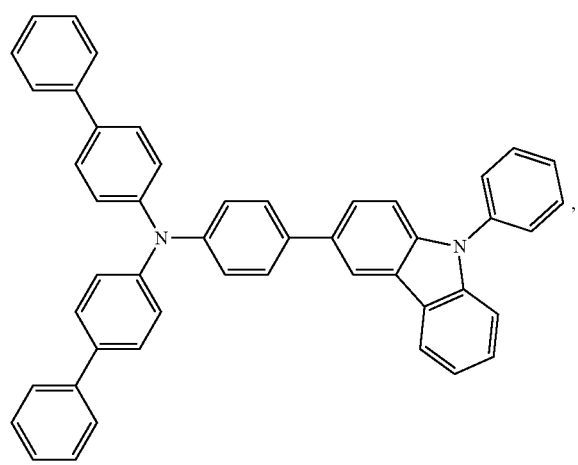
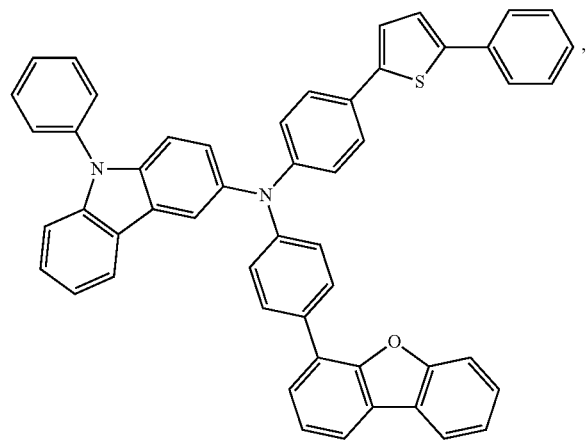
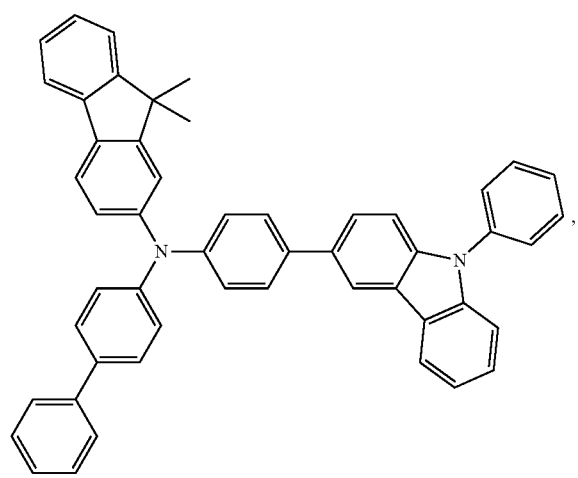
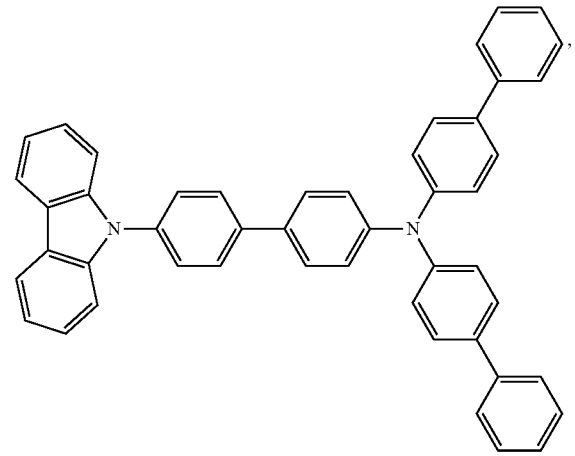

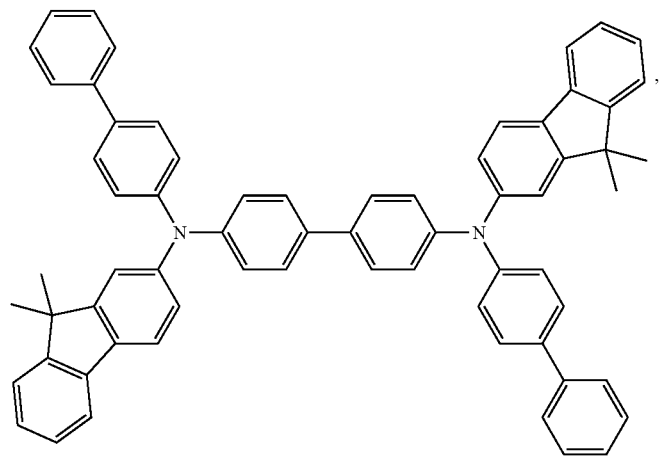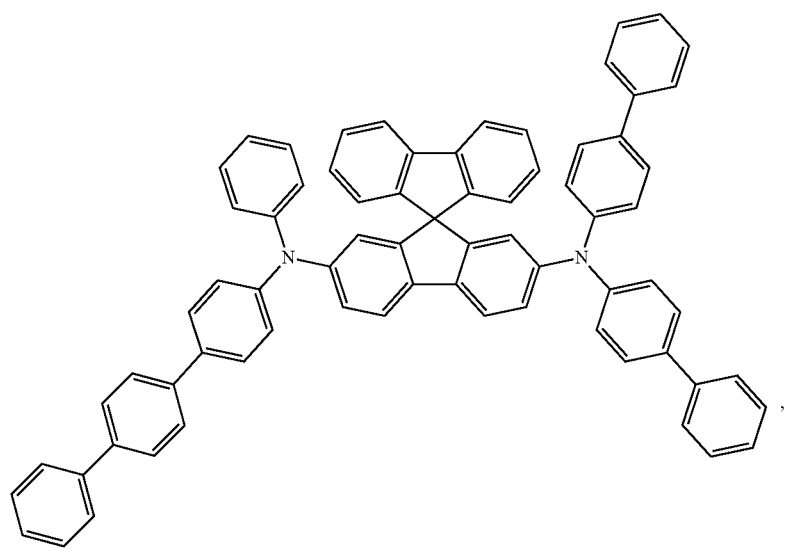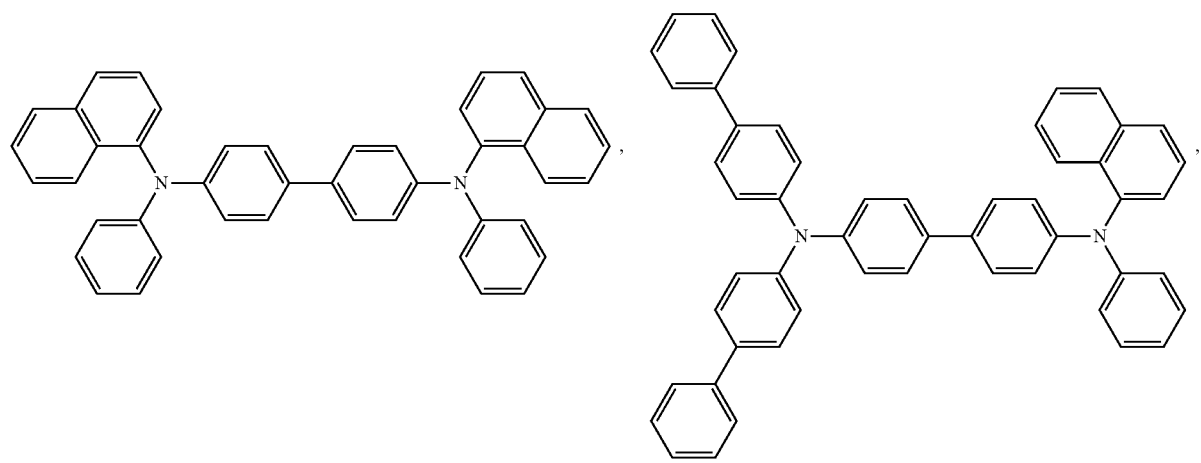

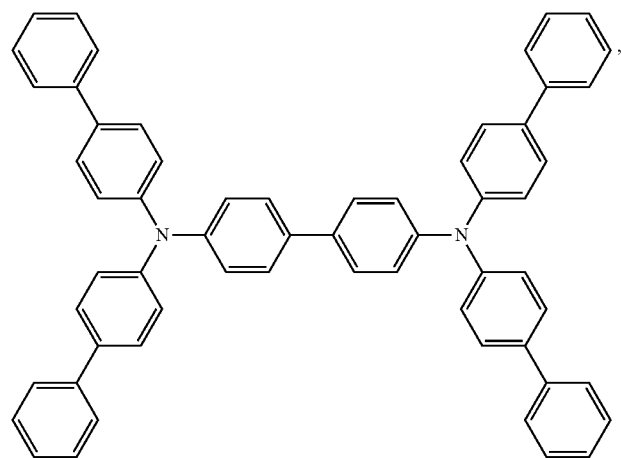
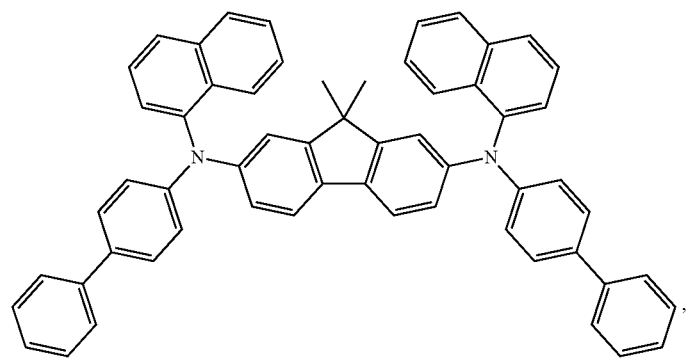
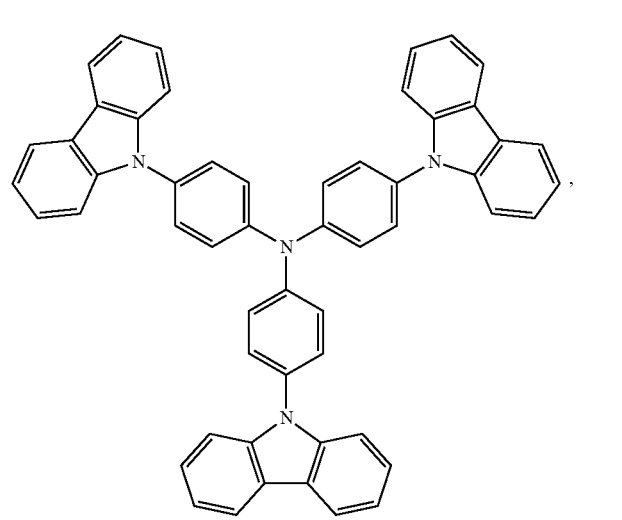
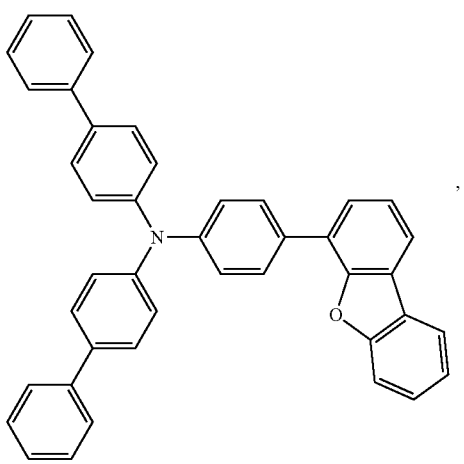

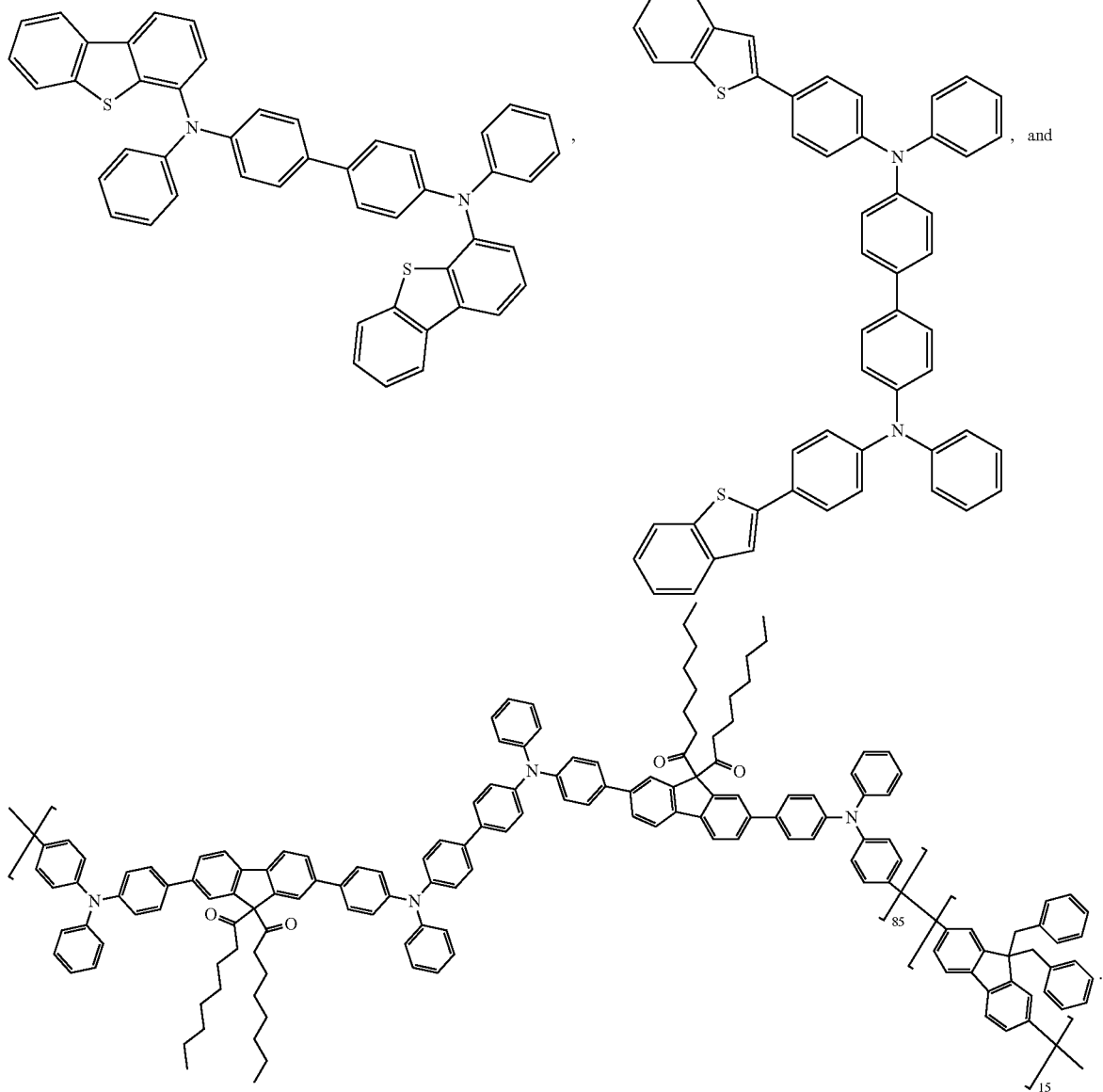

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

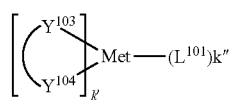

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

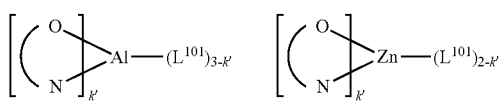

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

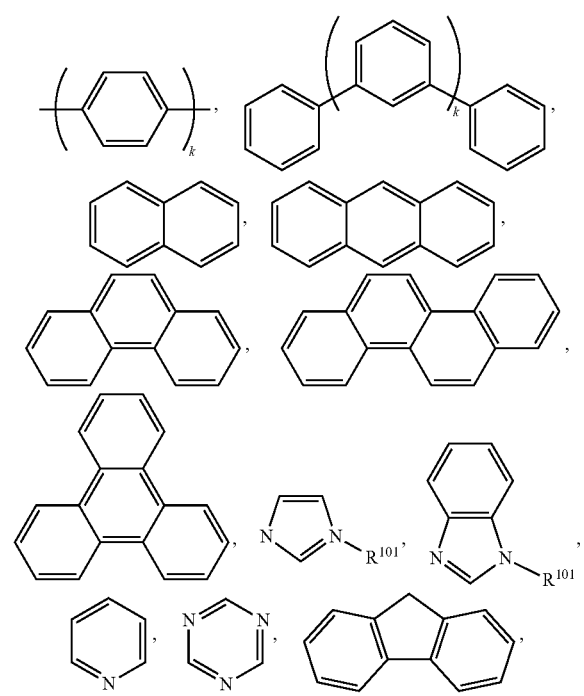

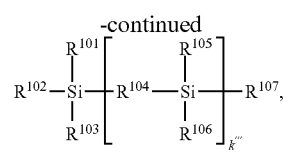

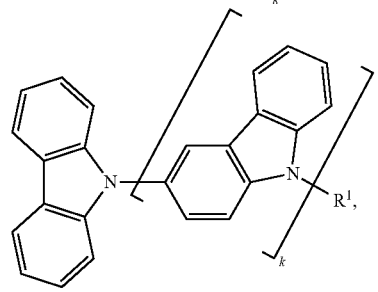

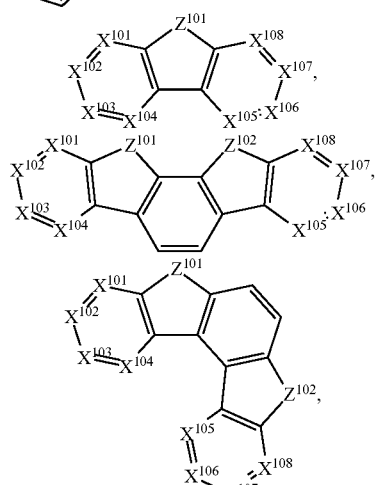

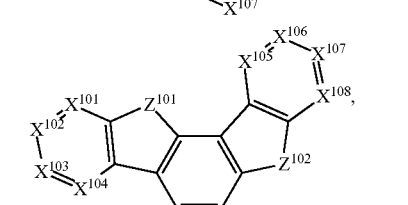

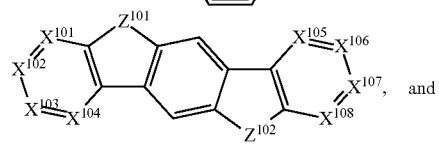

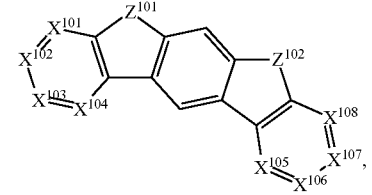

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

Non-limiting examples of the Host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, US71541.14, WO2001039234, WO2004093207, WO2005014551, WO2005089025, WO2006072002, WO2006114966, WO2007063754, WO2008056746, WO2009003898, WO2009021.126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472.
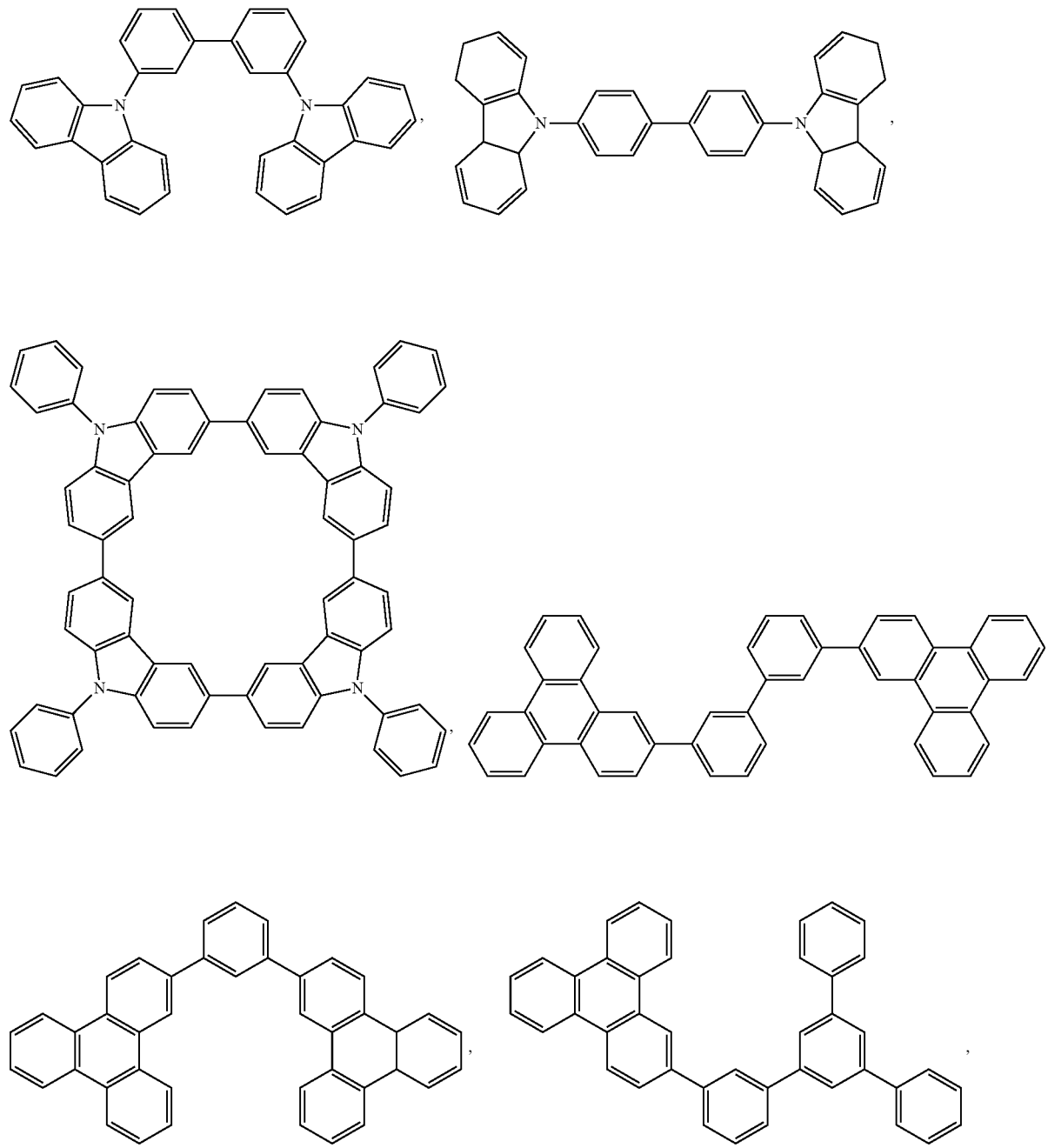

-continued
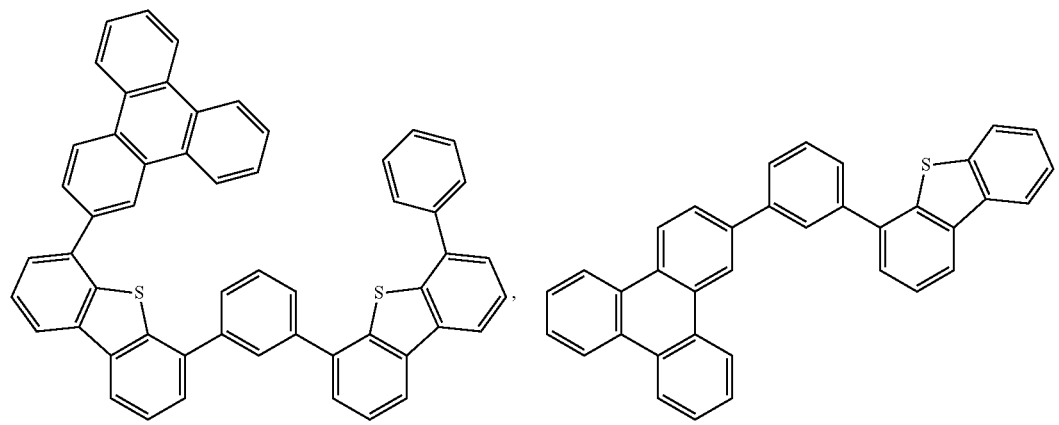
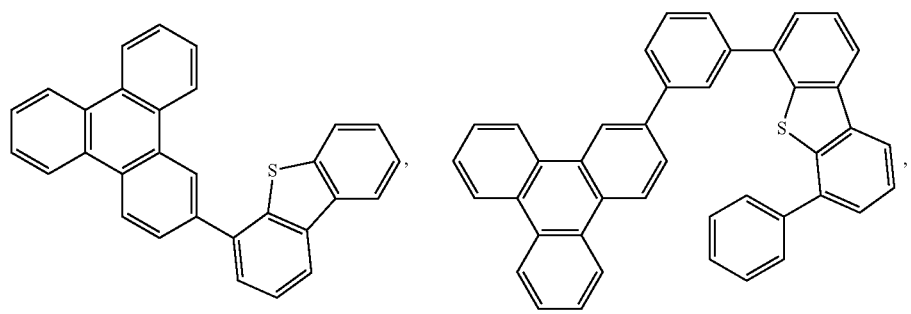
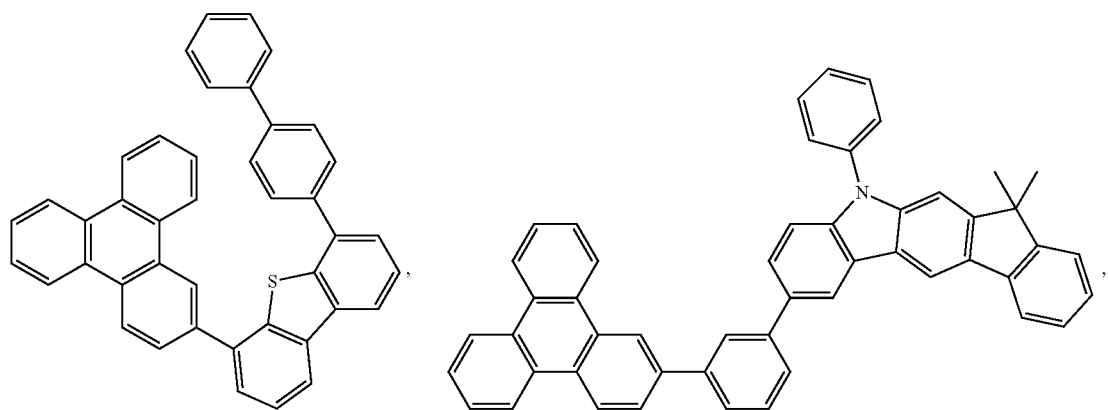
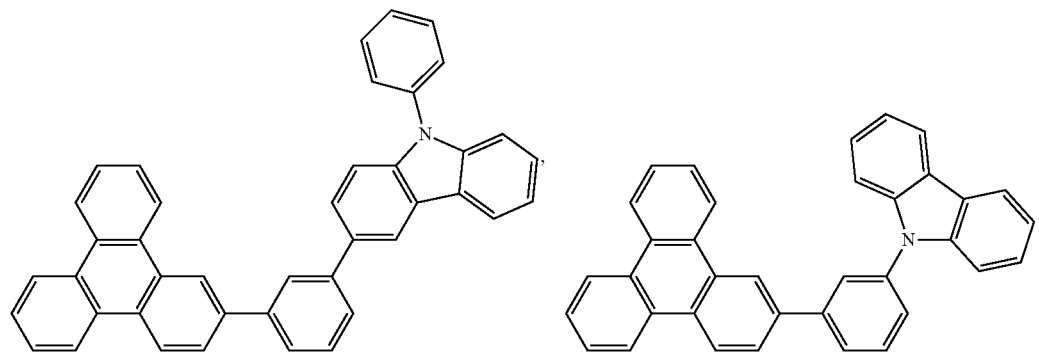

-continued
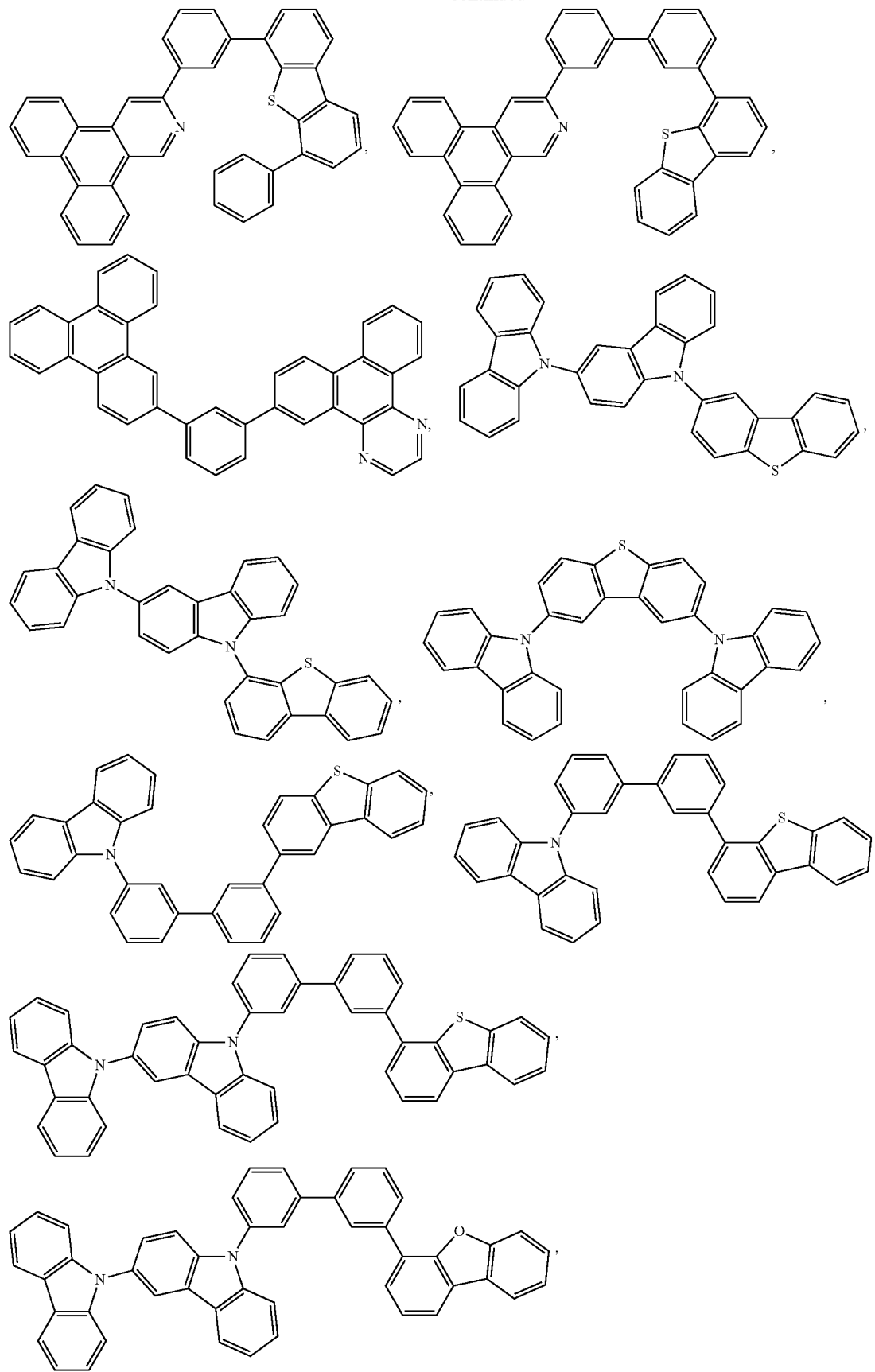

-continued
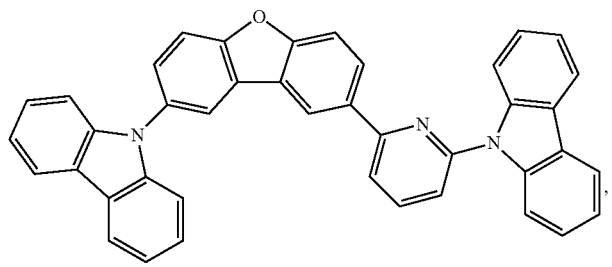
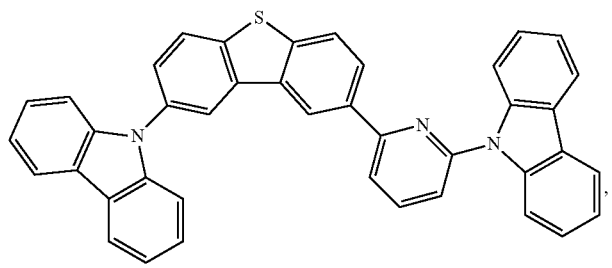
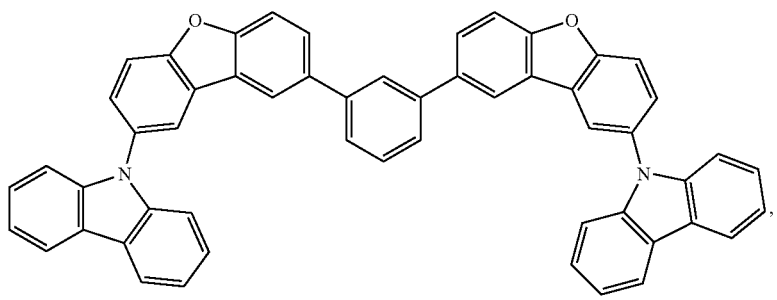
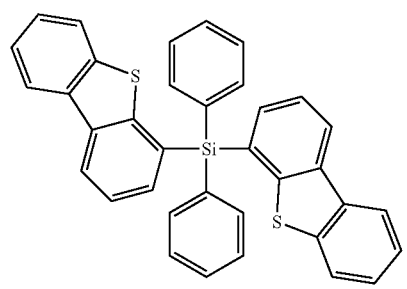
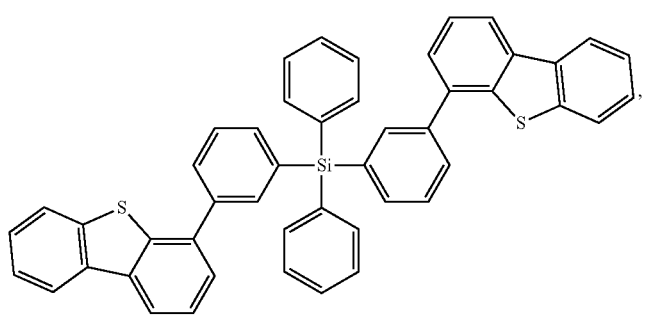
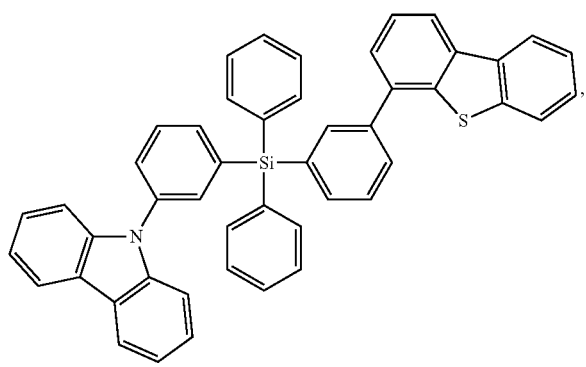

-continued
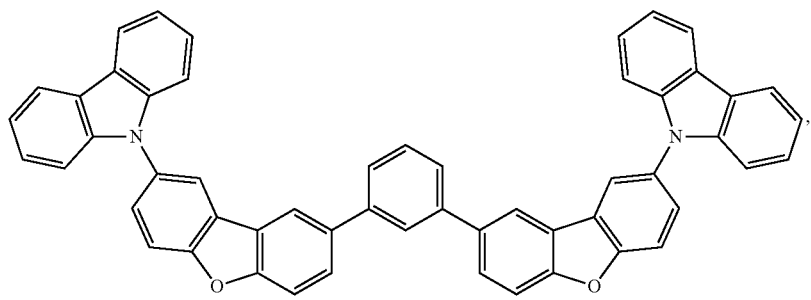
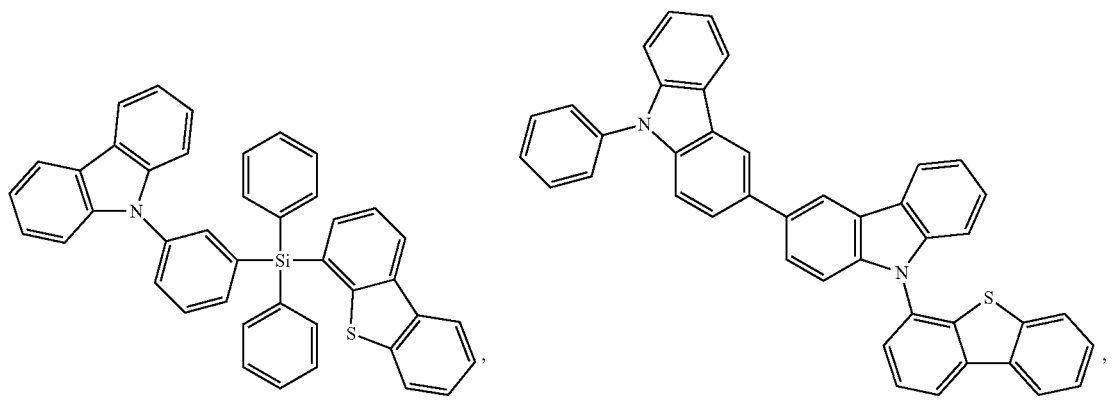
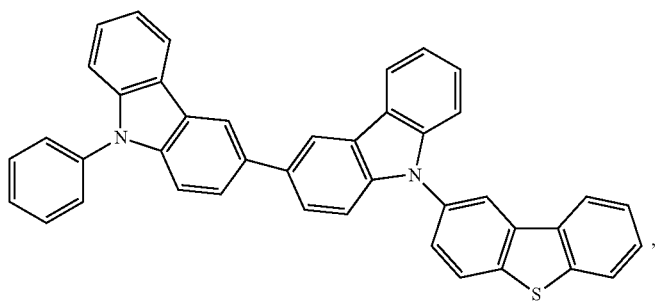
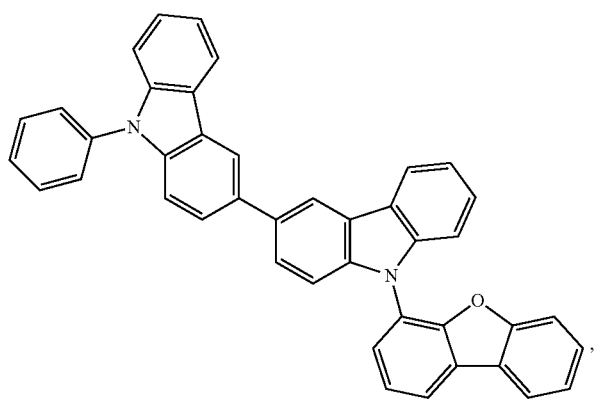
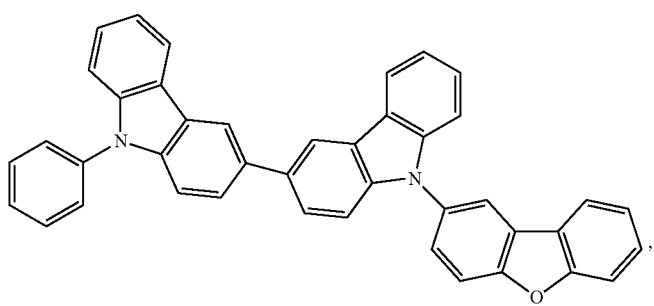

-continued
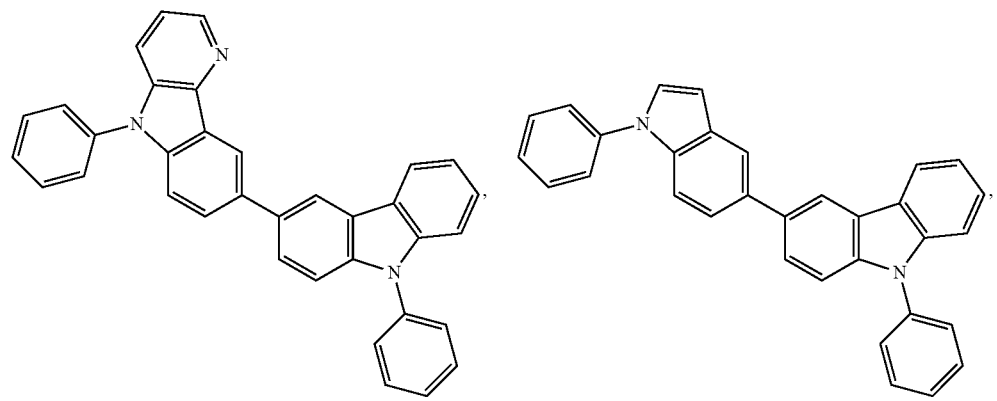
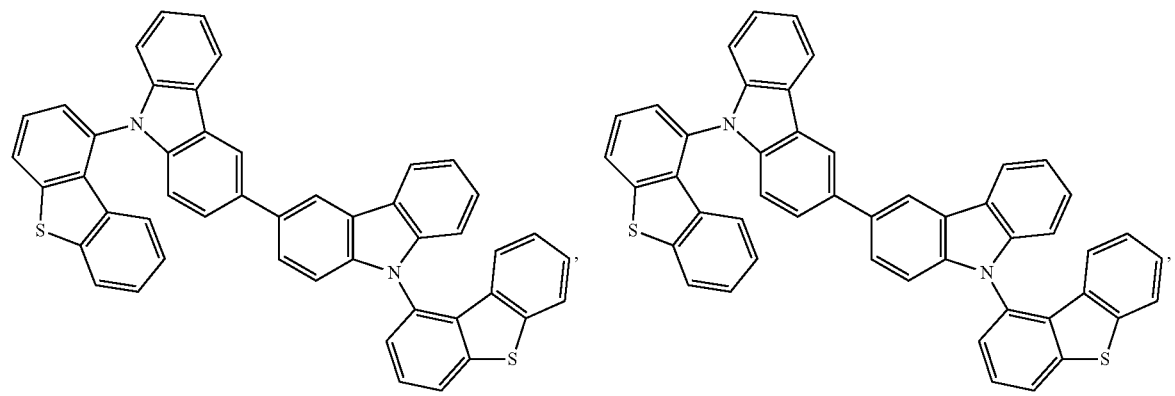
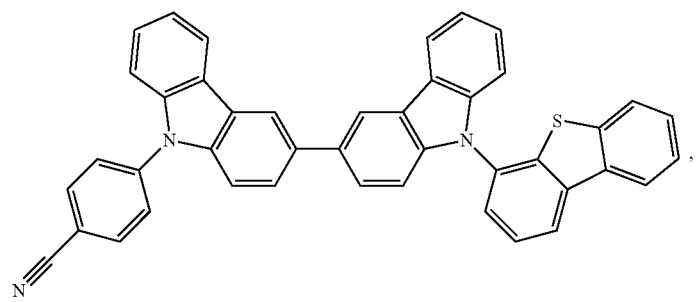
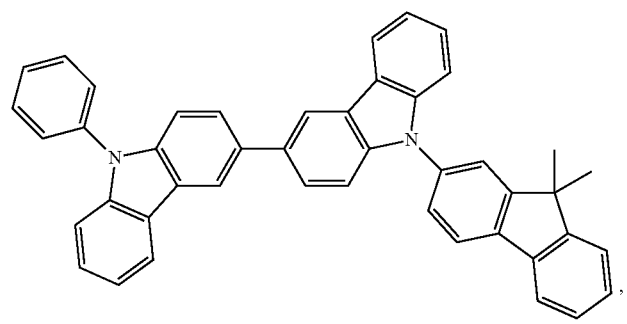

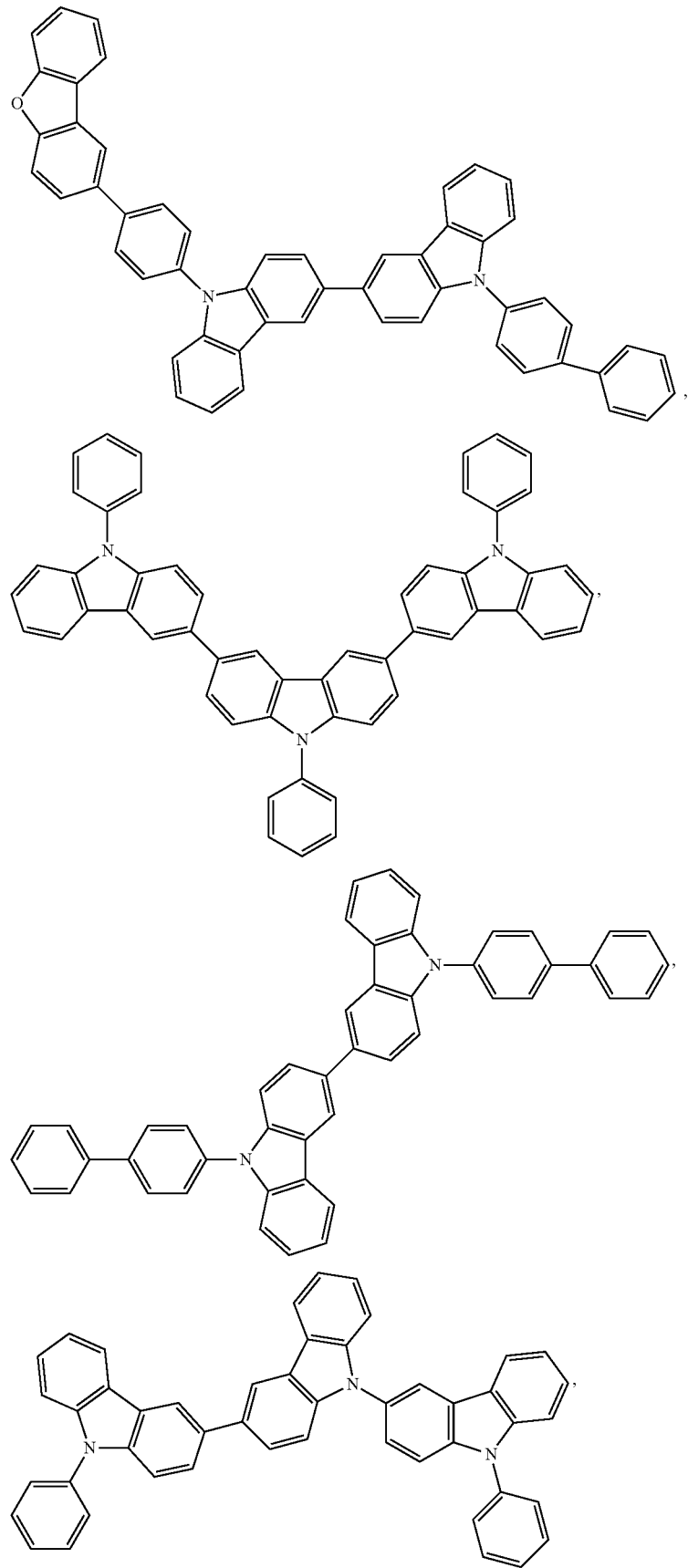

-continued
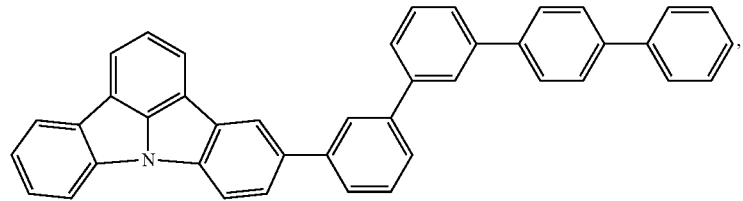
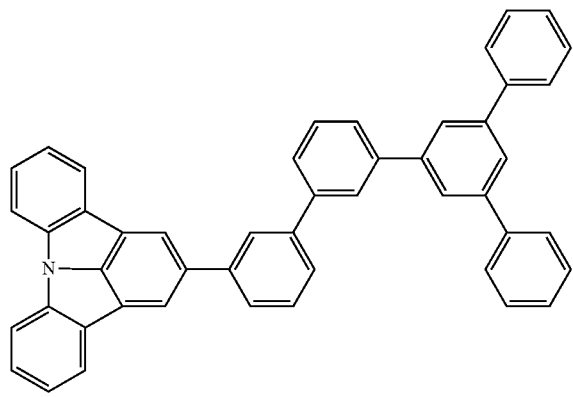
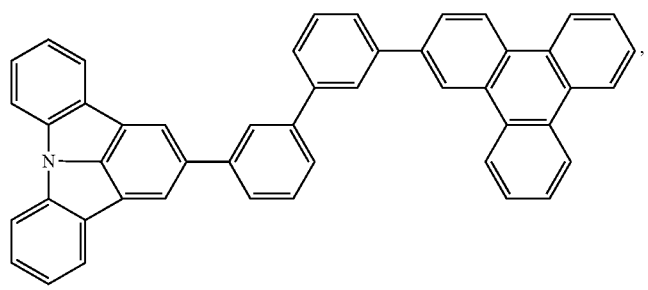
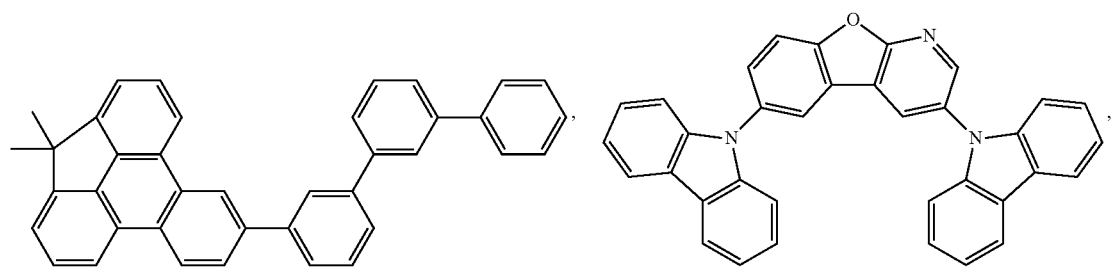
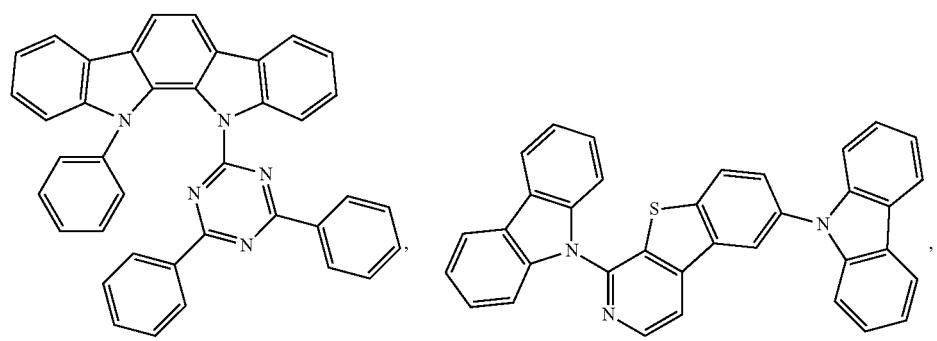

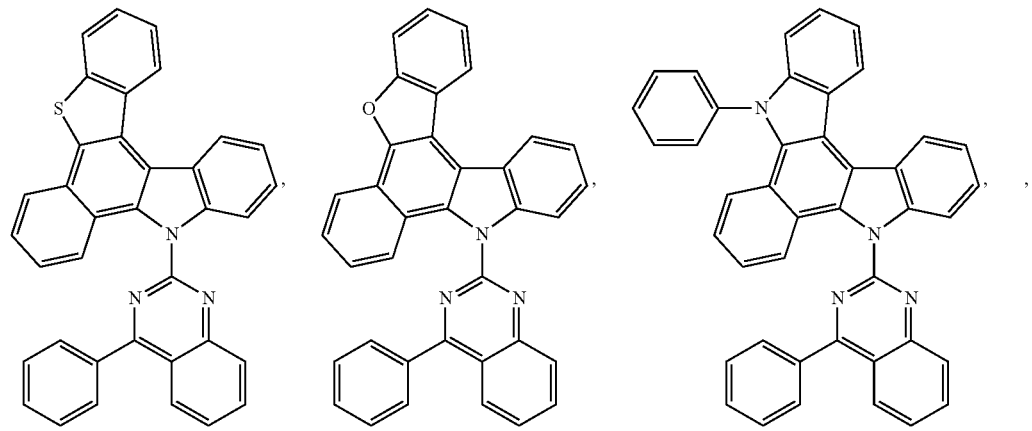
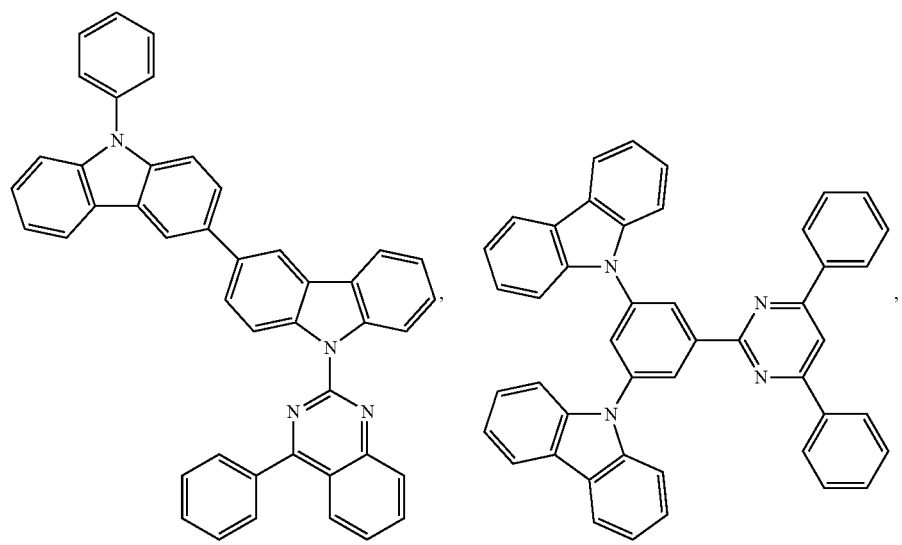
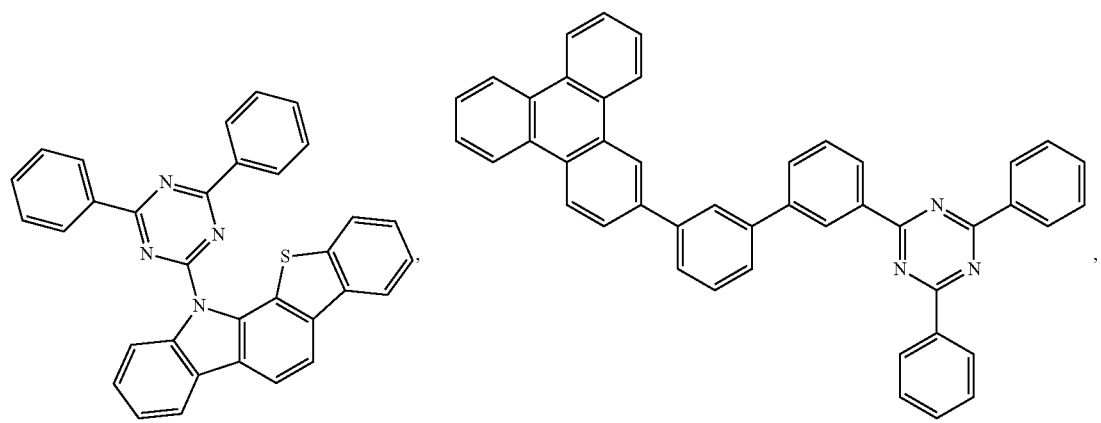

-continued
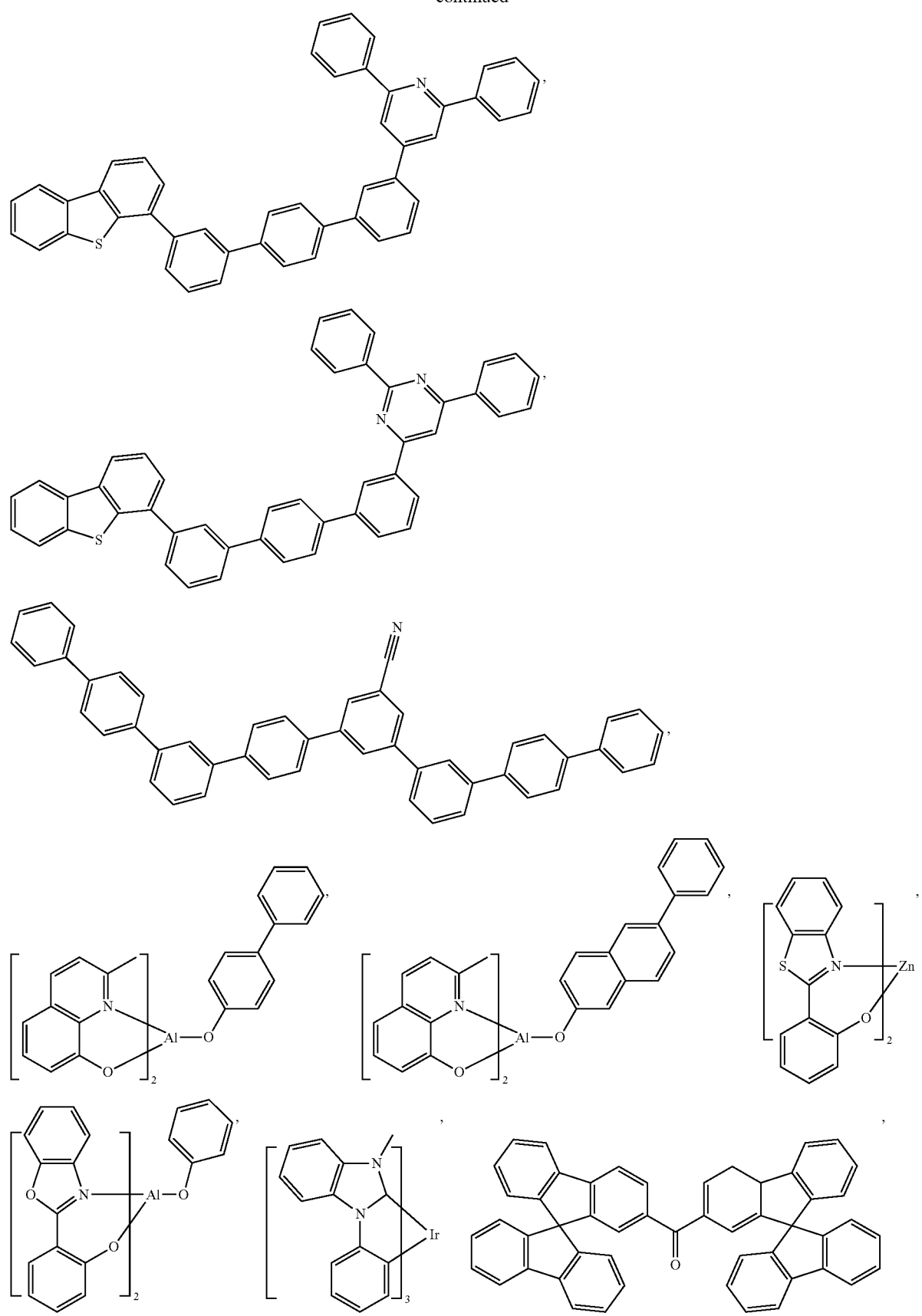

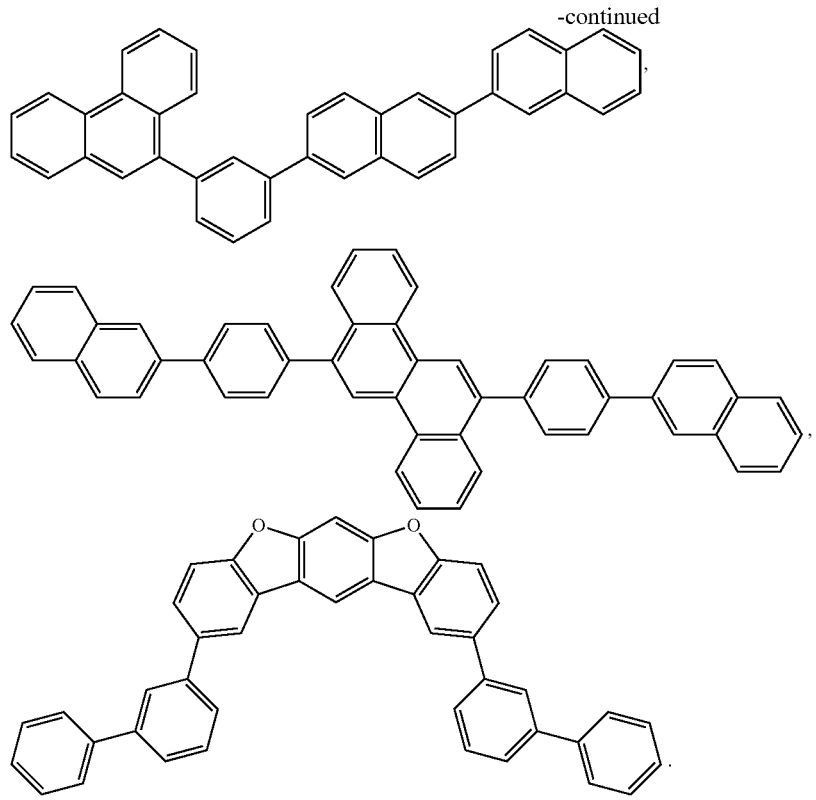

Emitter:

An emitter example is not particularly limited, and any compound may be used as long as the compound is typically used as an emitter material. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. No. 6,303,238, U.S. Pat. No. 6,413,656, U.S. Pat. No. 6,653,654, U.S. Pat. No. 6,670,645, U.S. Pat. No. 6,687,266, U.S. Pat. No. 6,835,469, U.S. Pat. No. 6,921,915, U.S. Pat. No. 7,279,704, U.S. Pat. No. 7,332,232, U.S. Pat. No. 7,378,162, U.S. Pat. No. 7,534,505, U.S. Pat. No. 7,675,228, U.S. Pat. No. 7,728,137, U.S. Pat. No. 7,740,957, U.S. Pat. No. 7,759,489, U.S. Pat. No. 7,951,947, U.S. Pat. No. 8,067,099, U.S. Pat. No. 8,592,586, U.S. Pat. No. 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

87
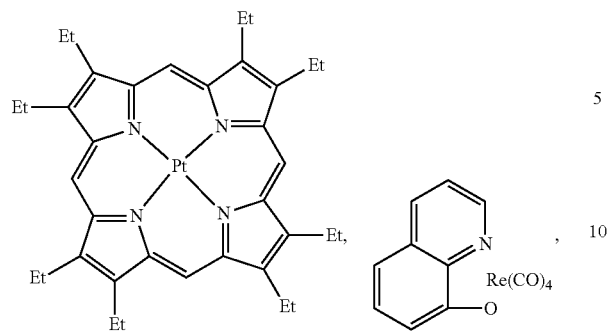
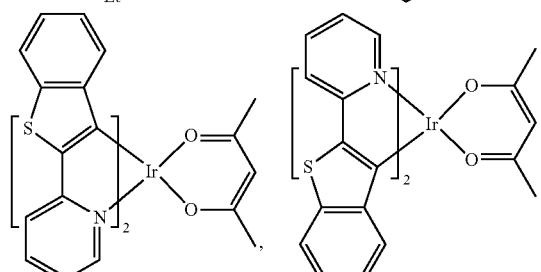
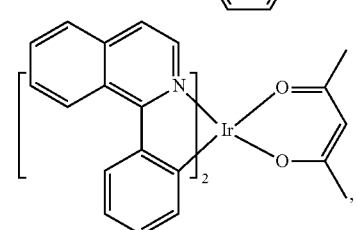
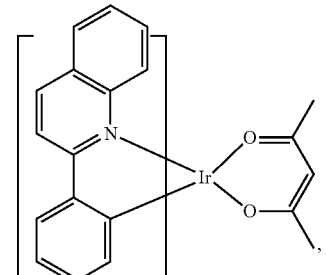
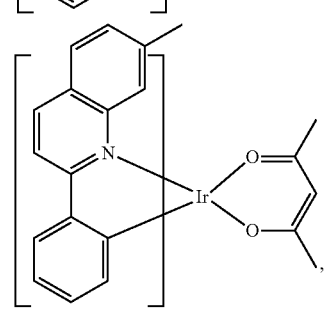
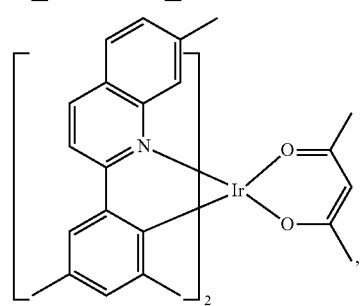
88
-continued
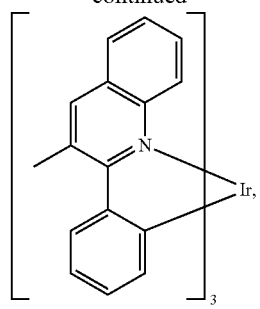
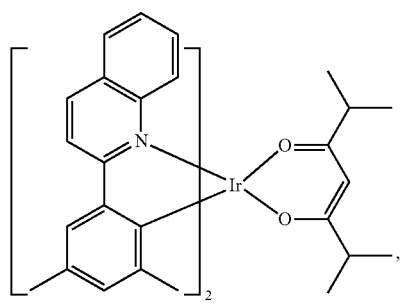
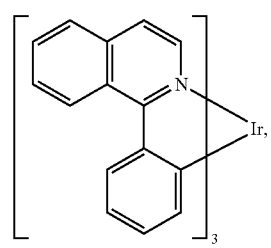
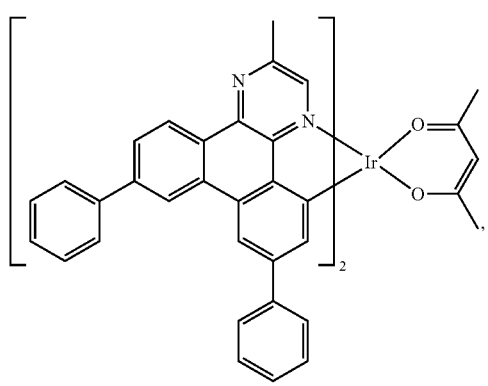
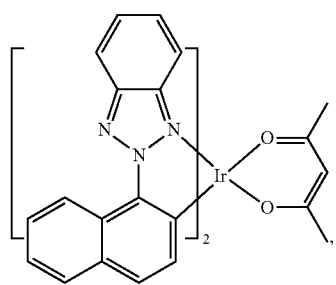

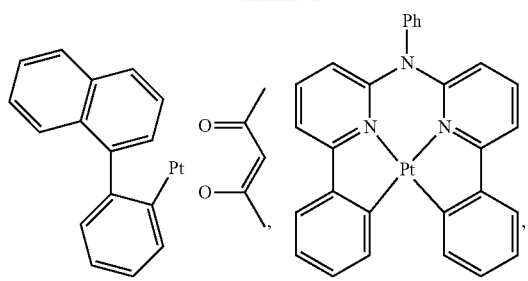
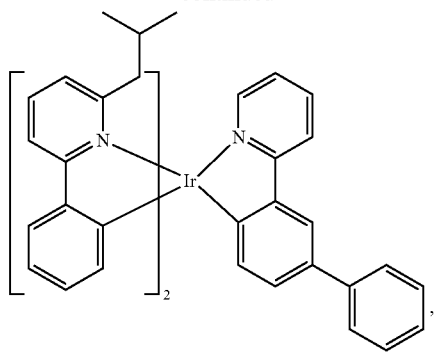
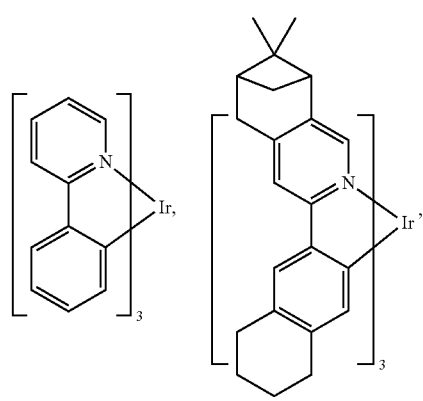
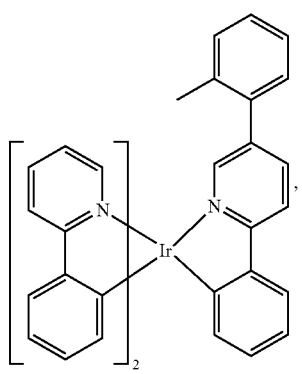
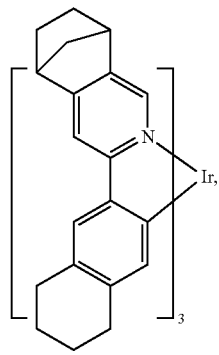
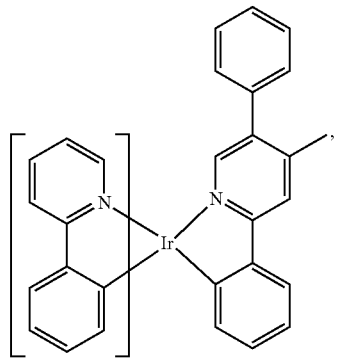
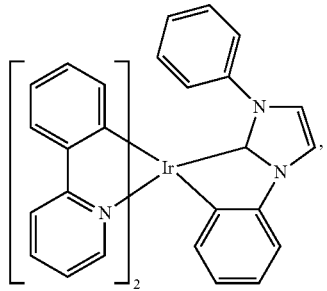
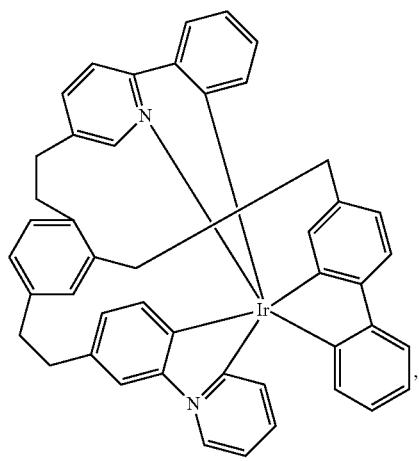
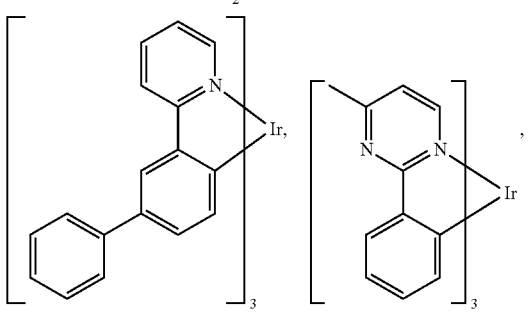

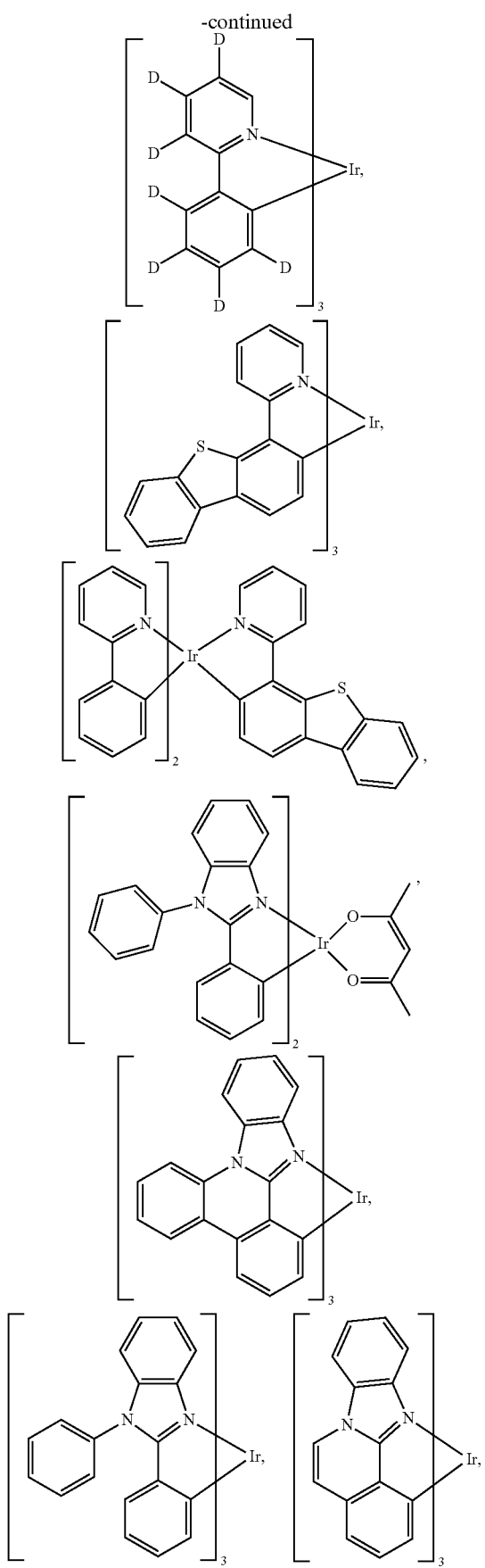
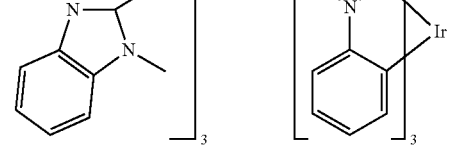
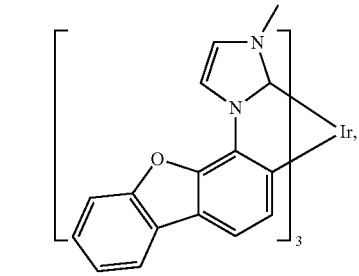

93
-continued
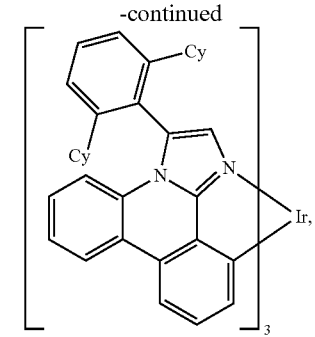
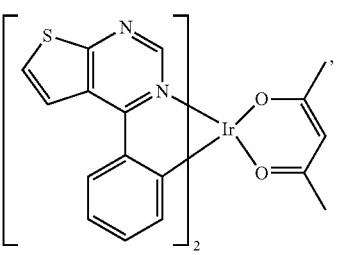
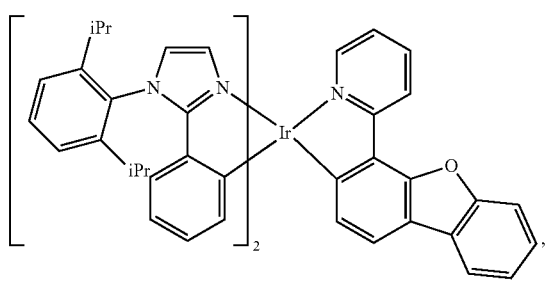
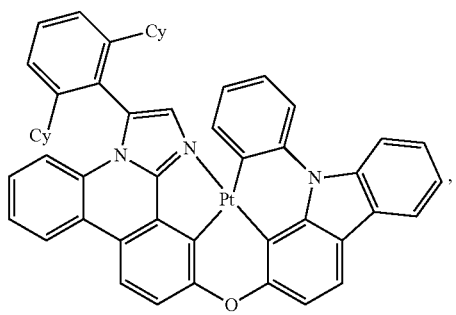
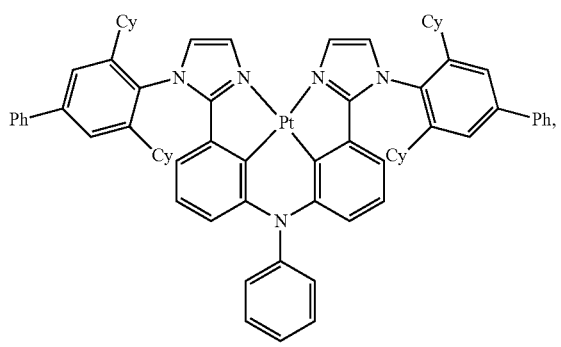
94
-continued
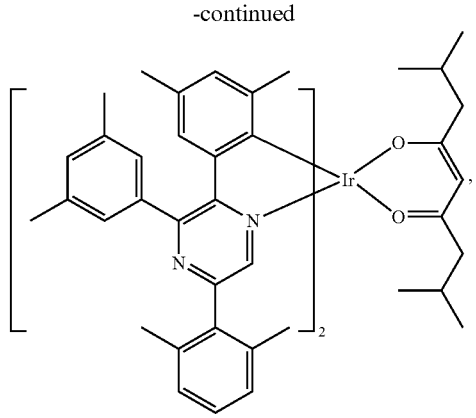
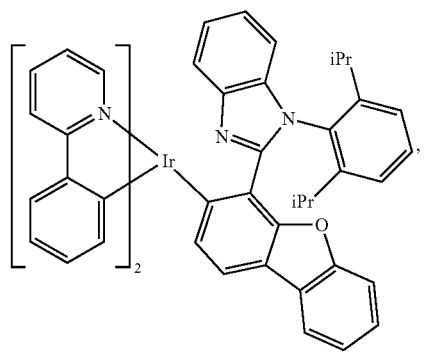
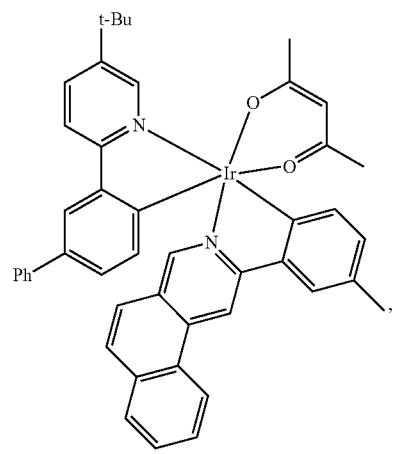
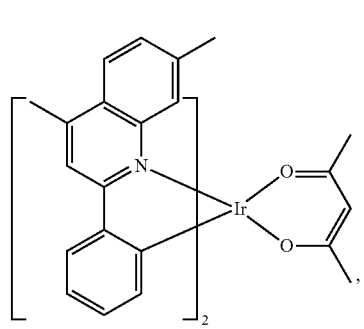

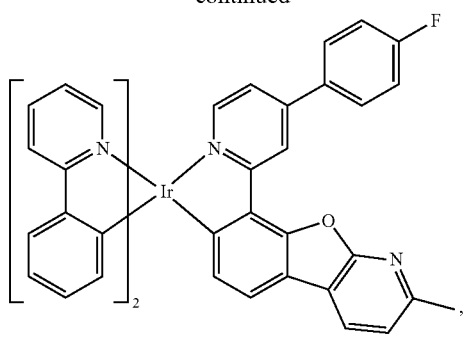
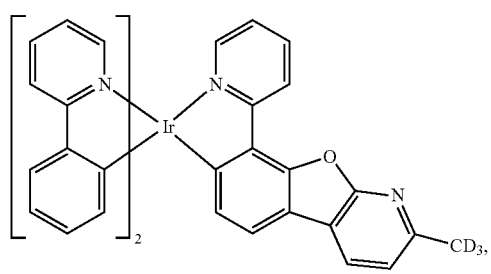
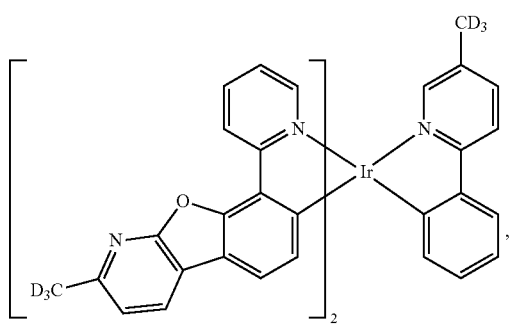
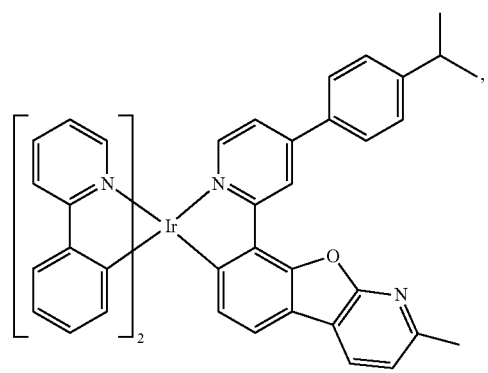
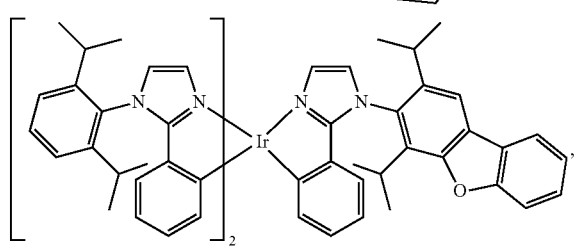
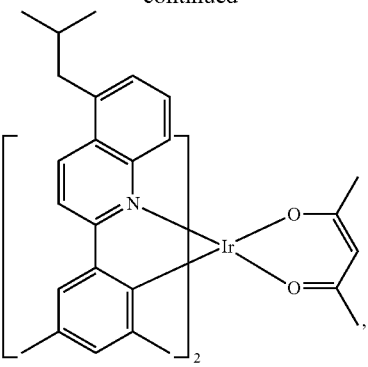
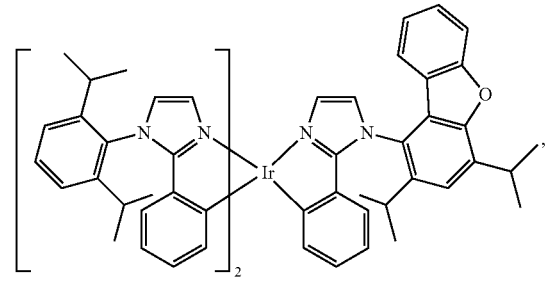
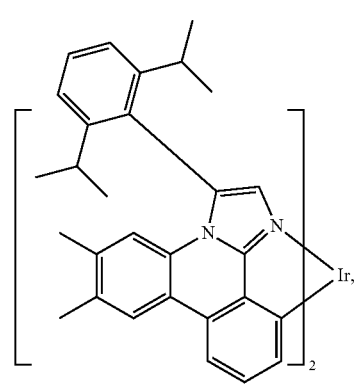
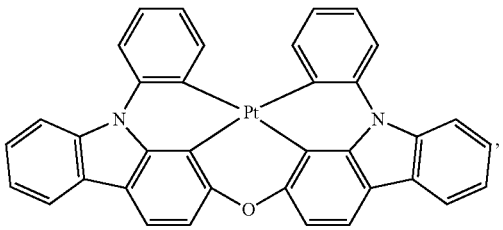
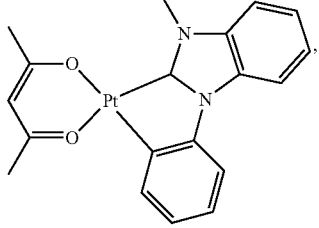

97
-continued
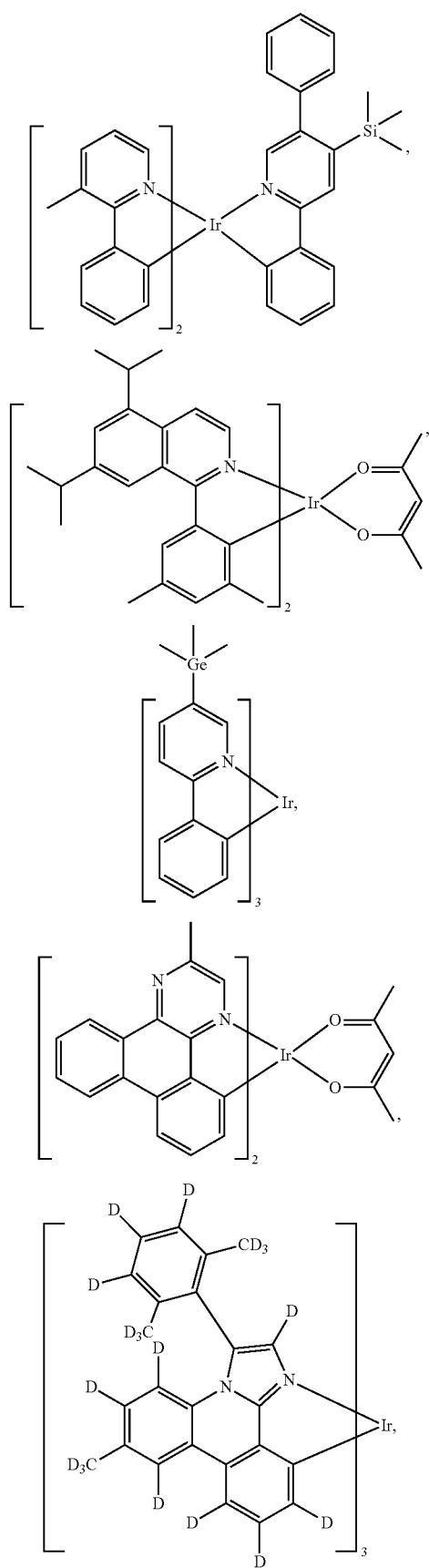
98
-continued
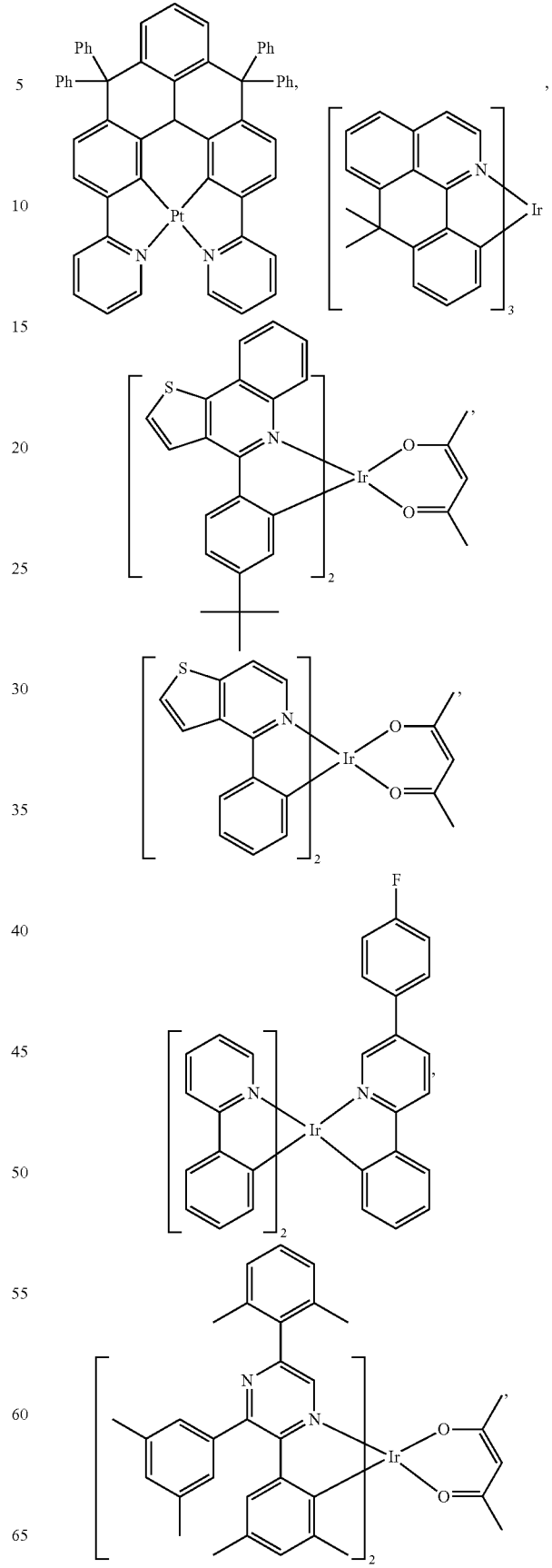

99
-continued
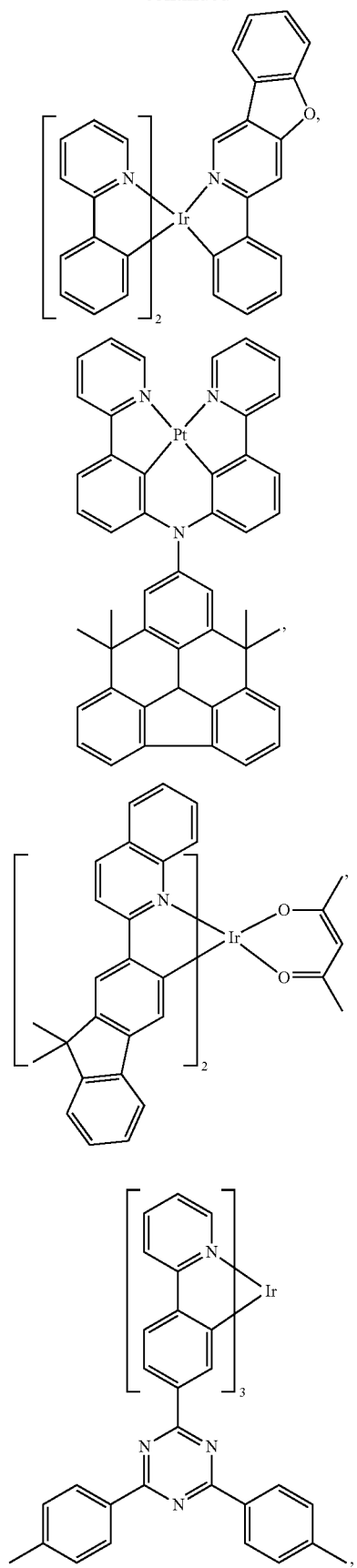
100
-continued
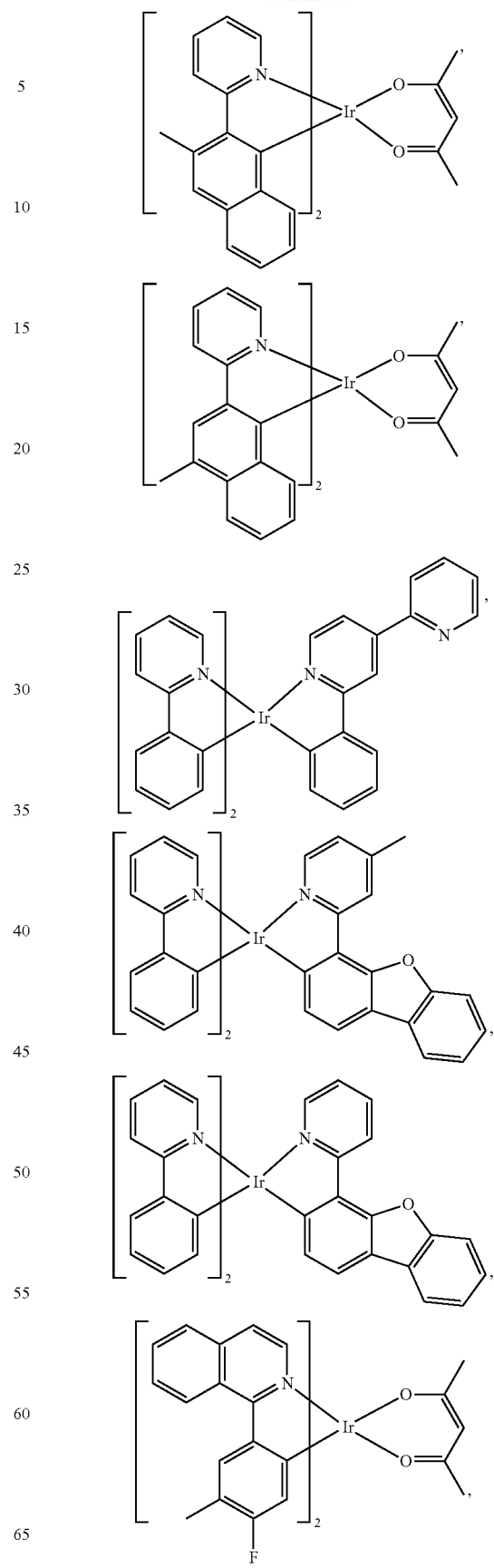

101
-continued
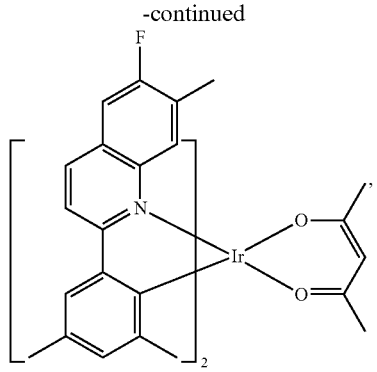
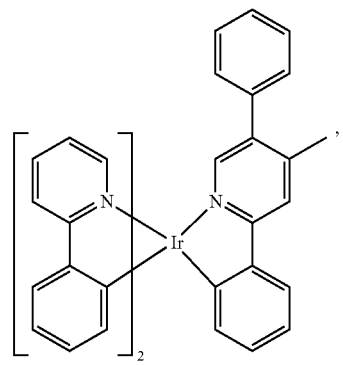
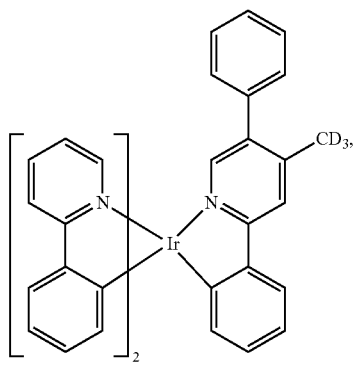
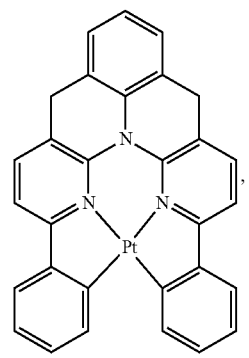
102
-continued
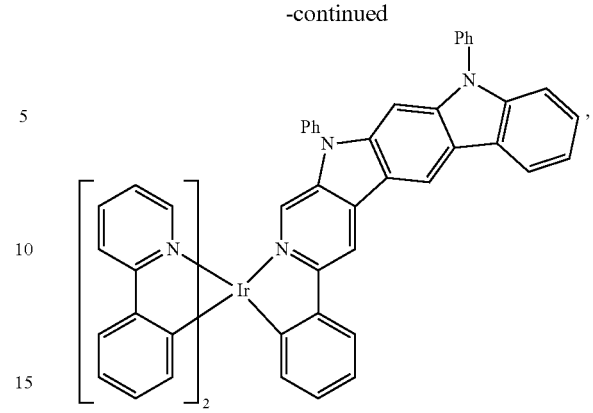
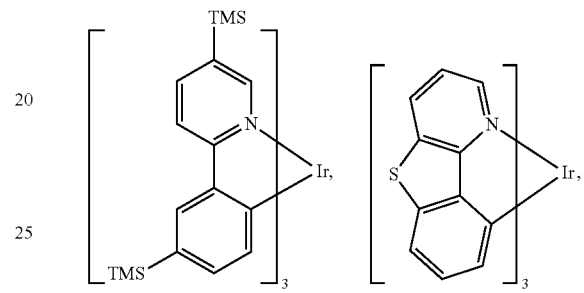
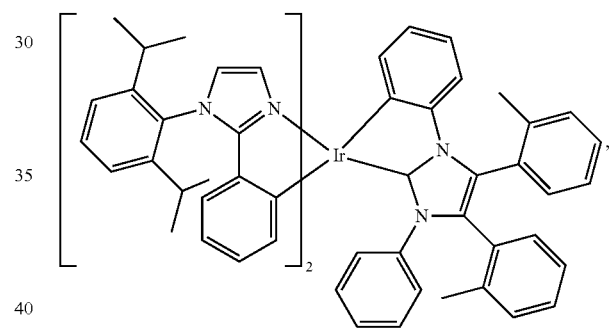
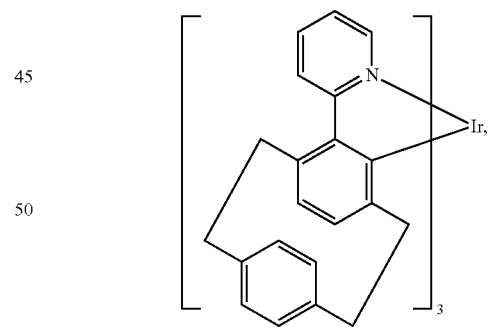
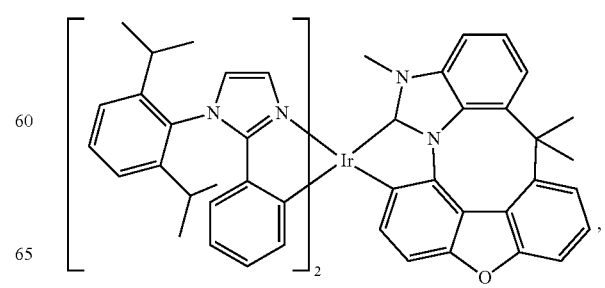

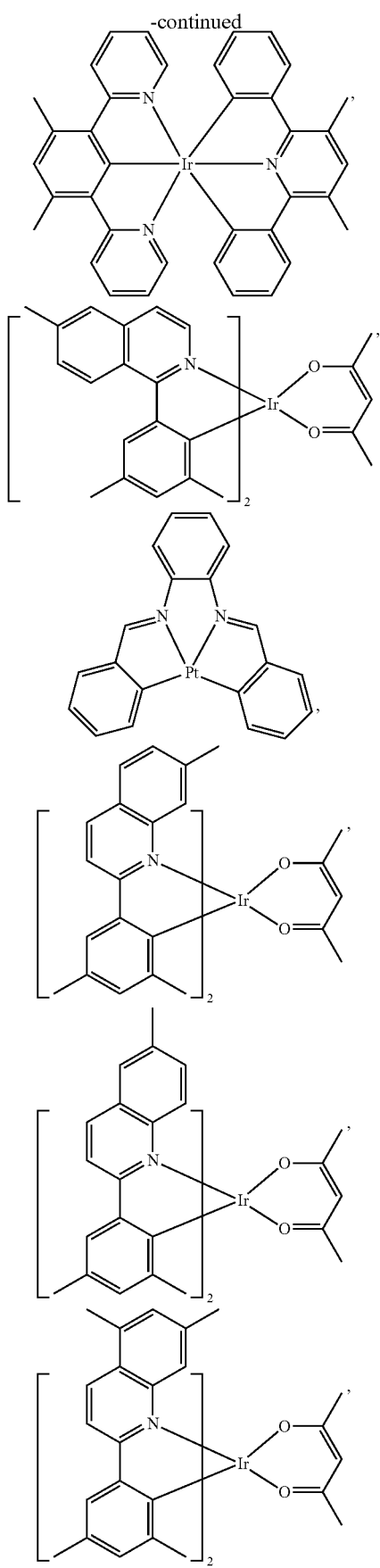
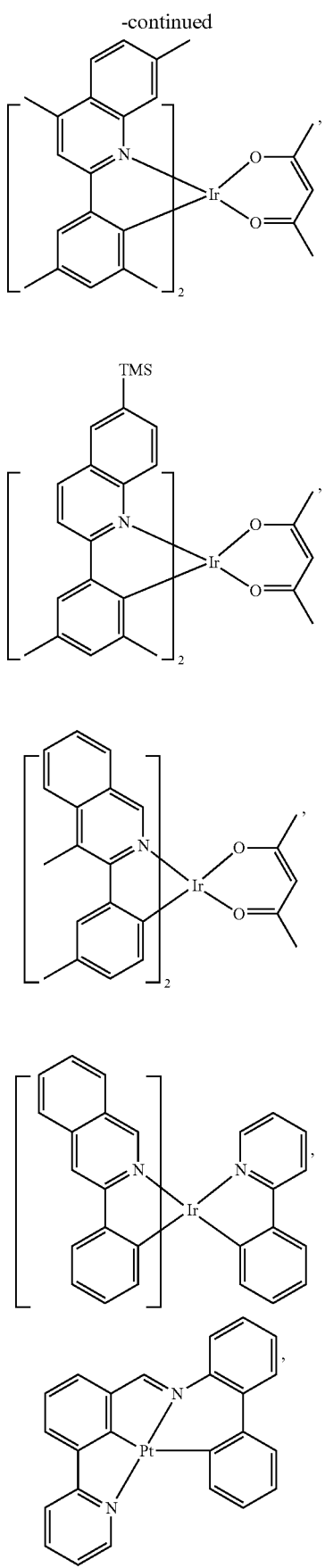

105
-continued
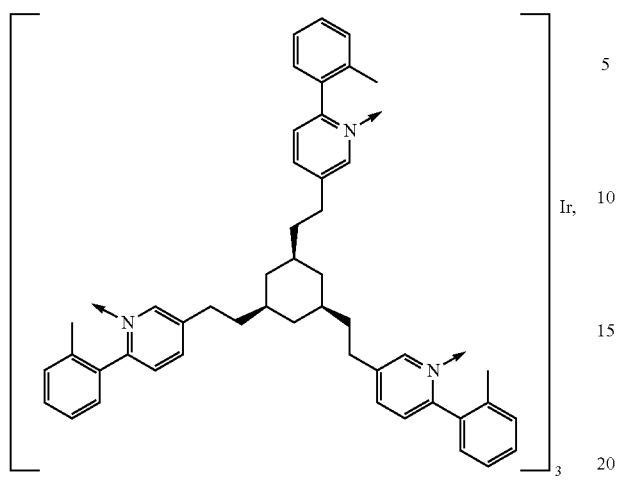
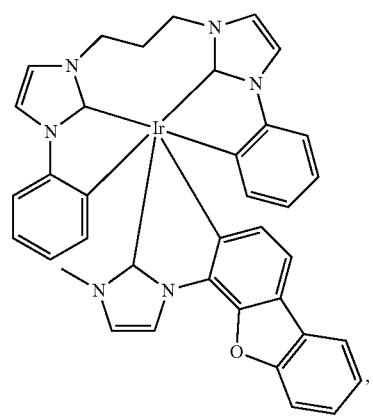
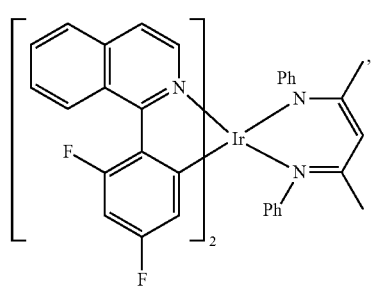
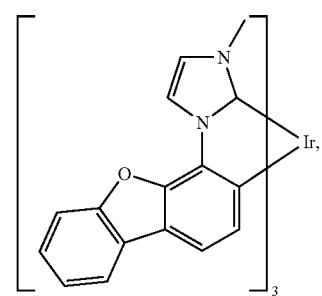
106
-continued
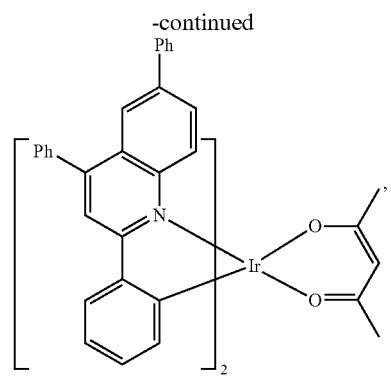
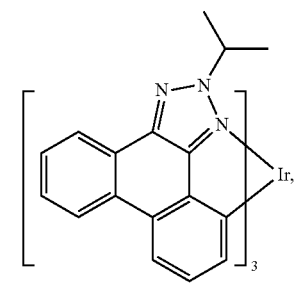
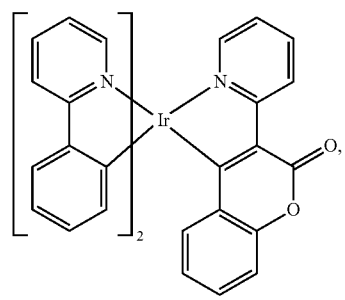
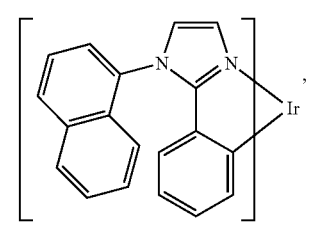

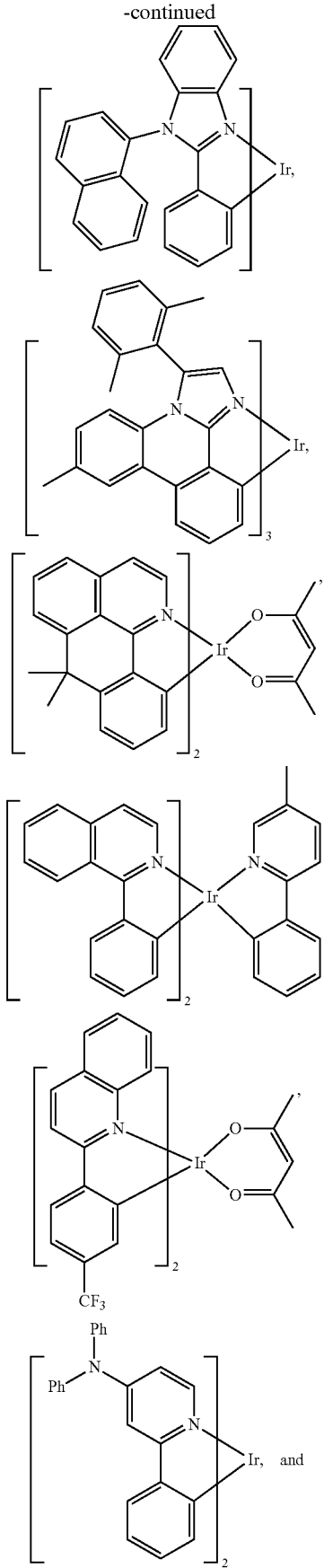
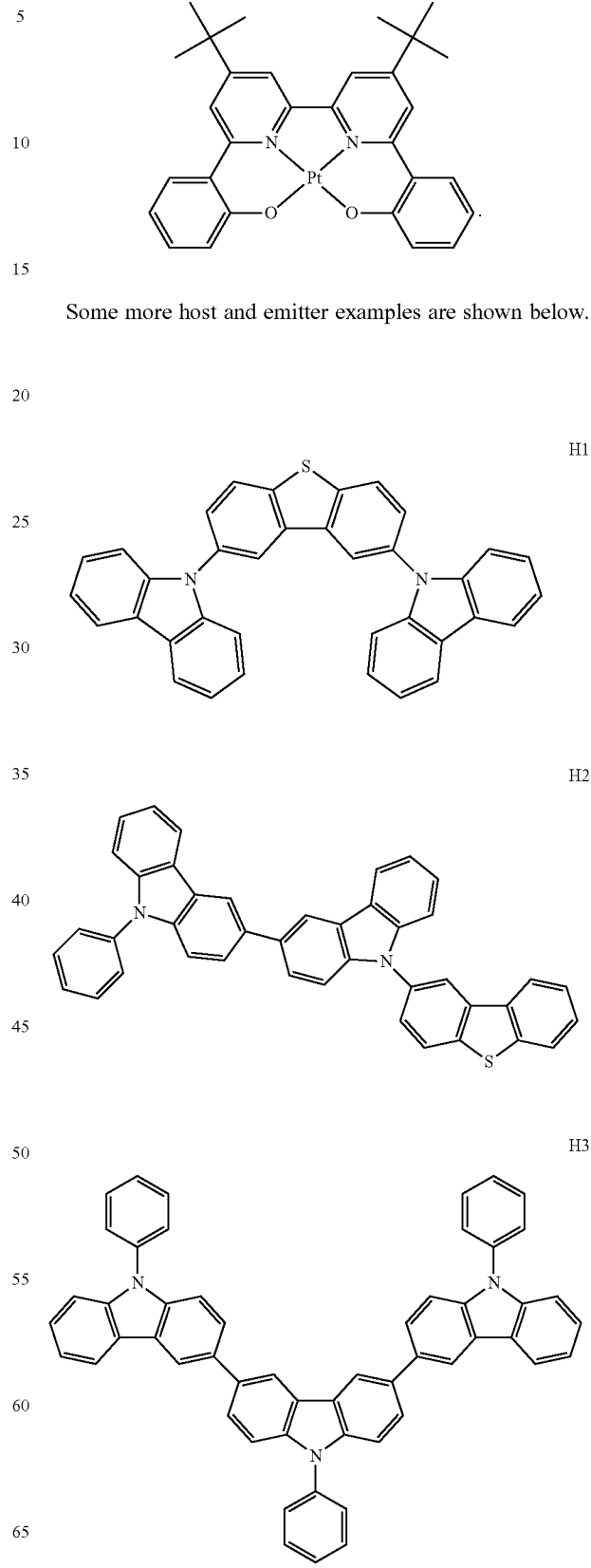
Some more host and emitter examples are shown below.

-continued
H4
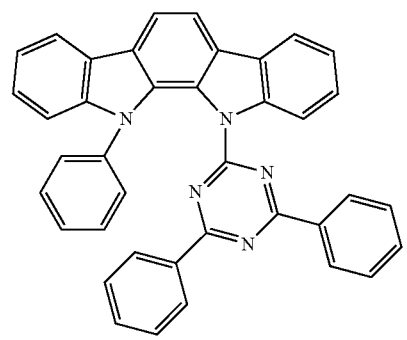
H5
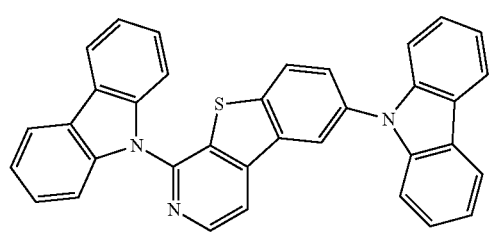
H6
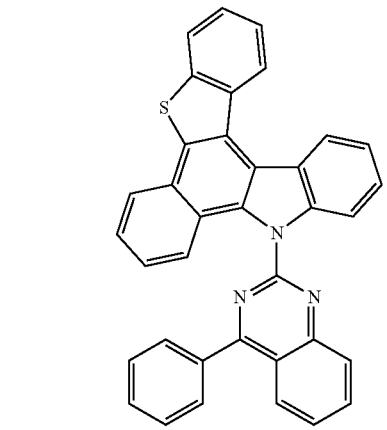
H7
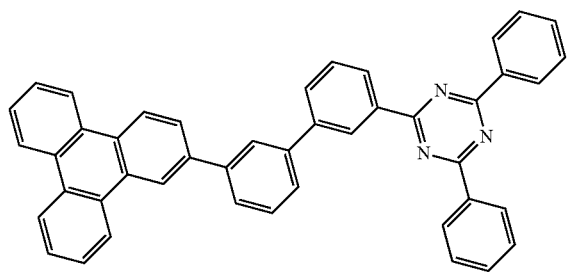
H8
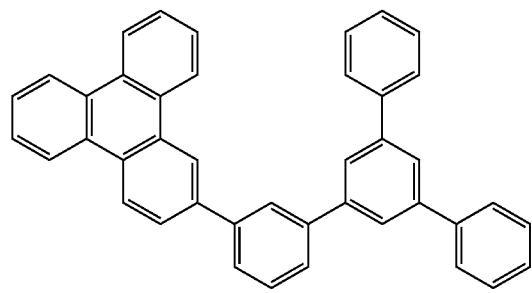
-continued
H9
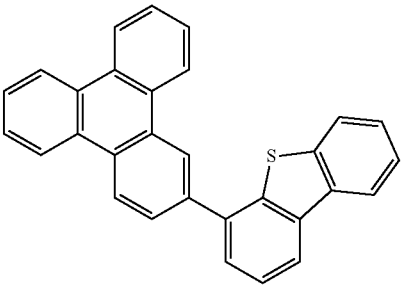
D1
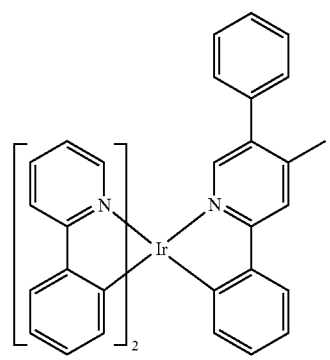
D2
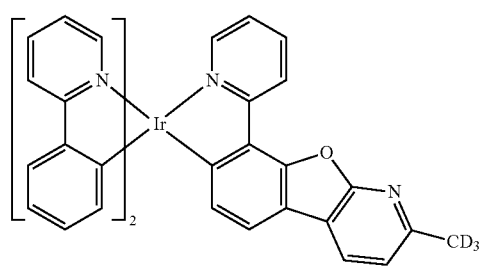
D3
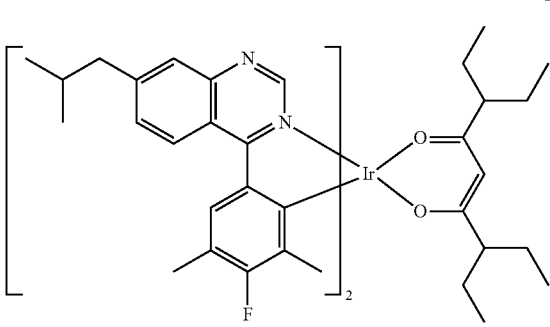
D4
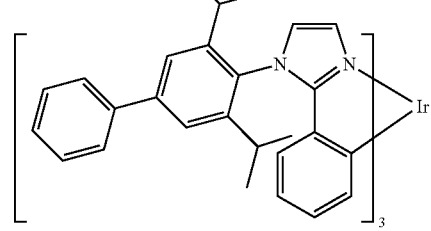

-continued

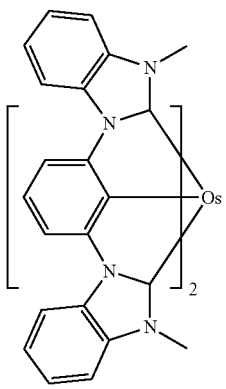

D5

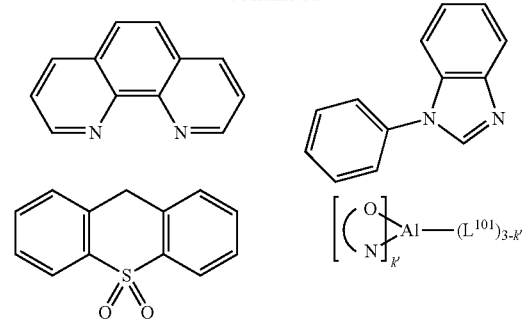

D6

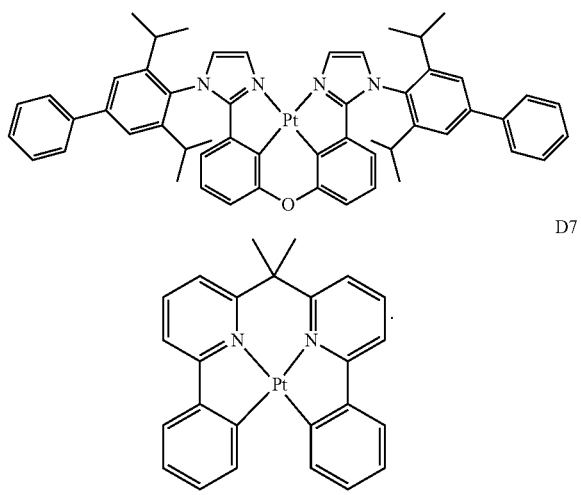

D7 wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

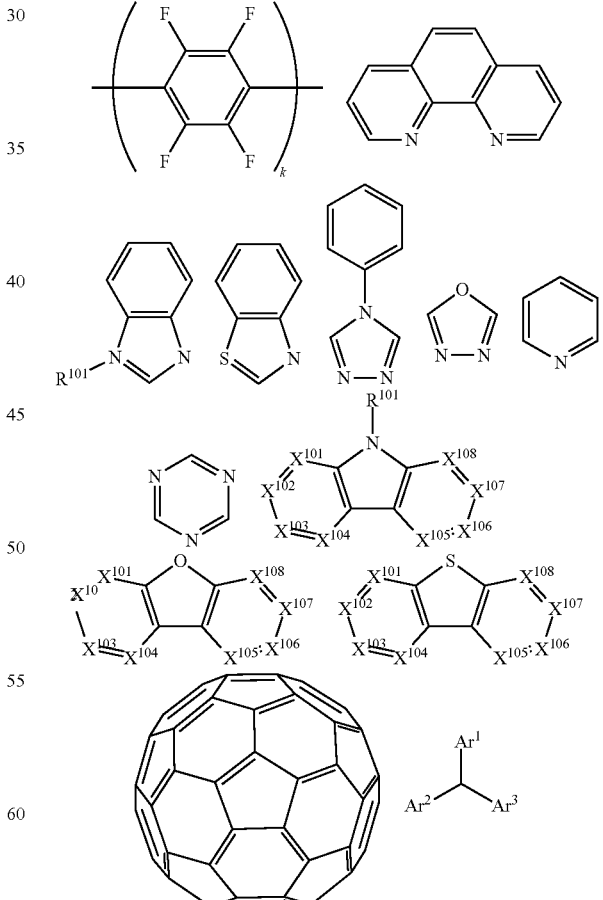

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

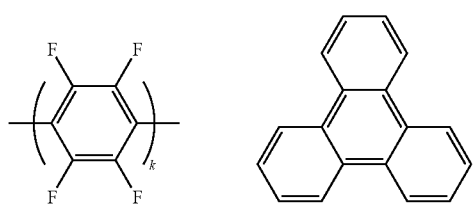

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

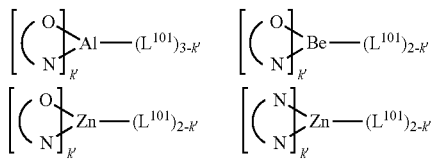

wherein (O—N) or (N—N) is a bidentate ligand, having metal coordinated to atoms O, N or N, N, $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. No. 6,656,612, U.S. Pat. No. 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535.

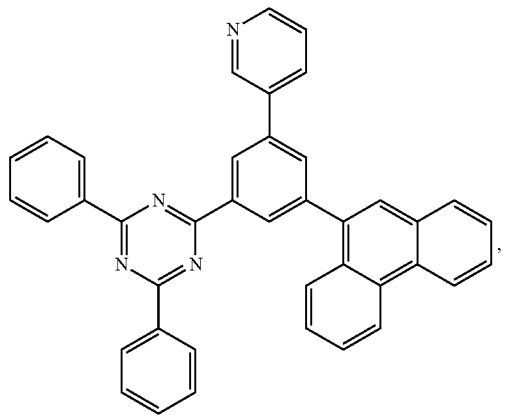

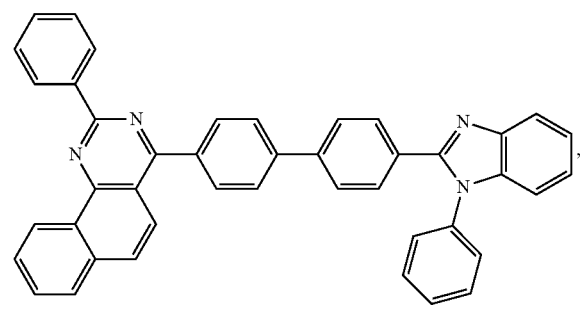

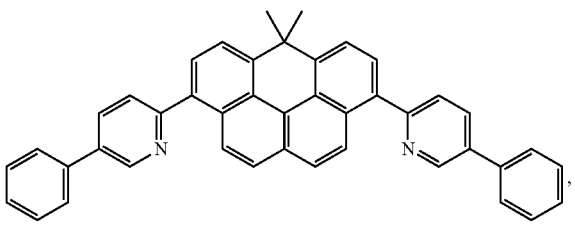

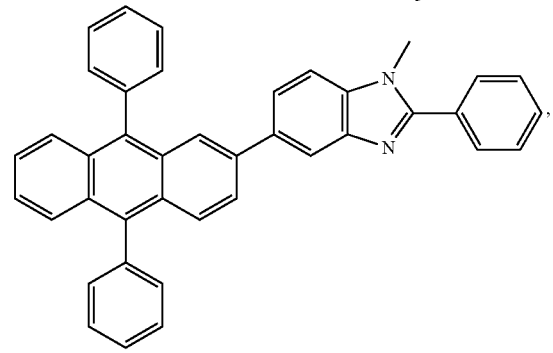

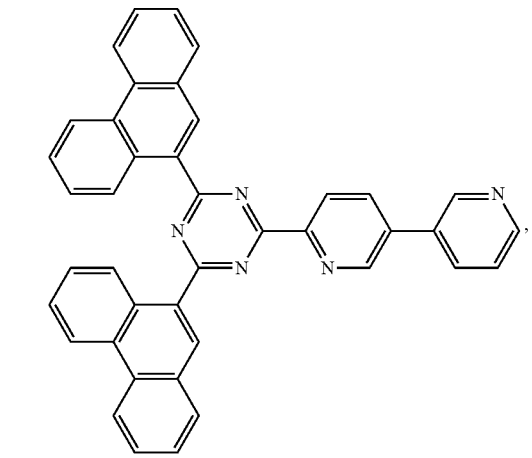

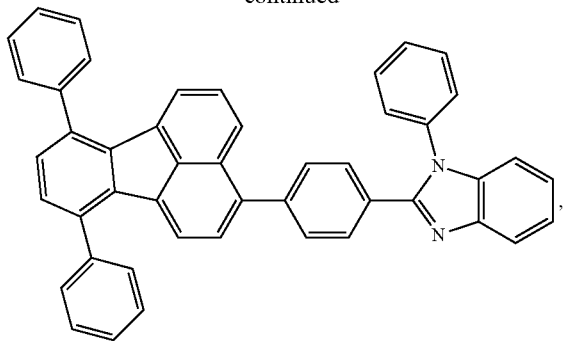
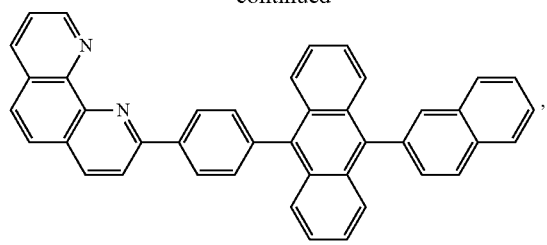
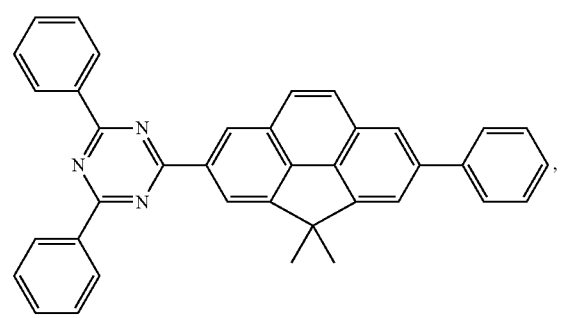
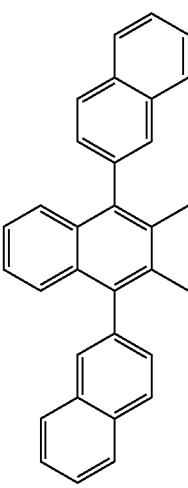
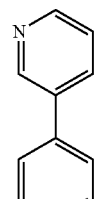
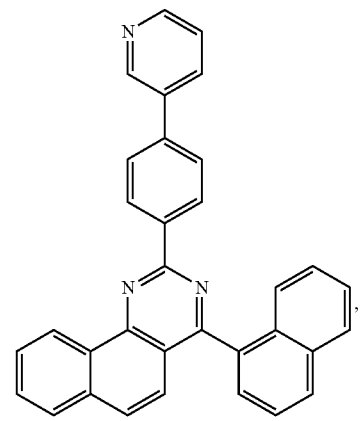
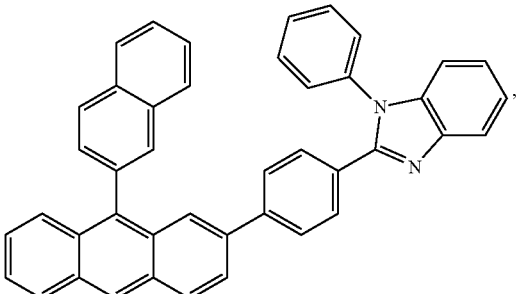
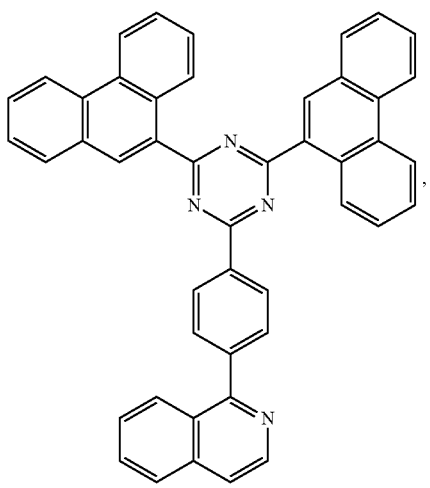
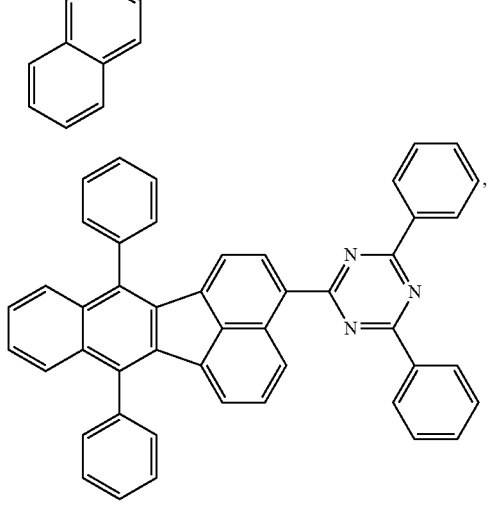

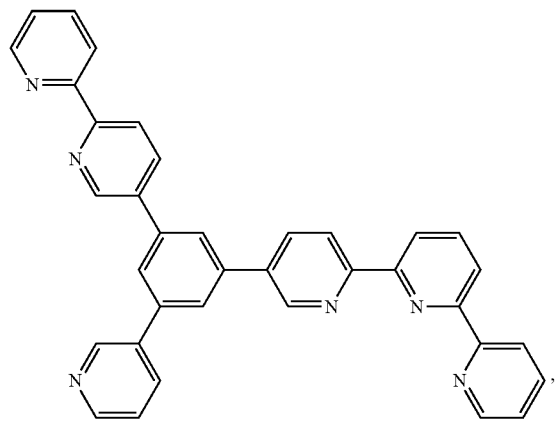
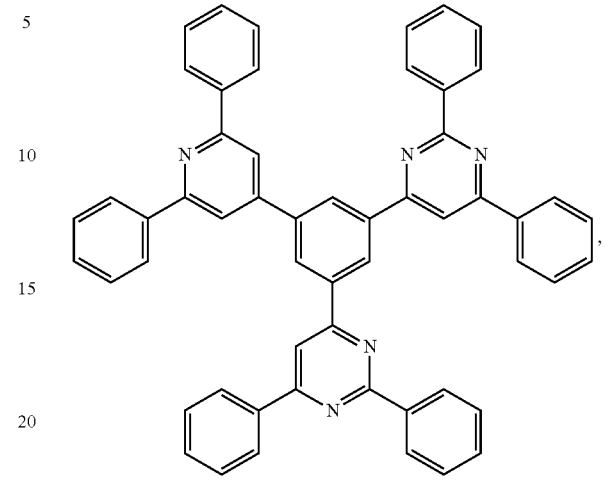
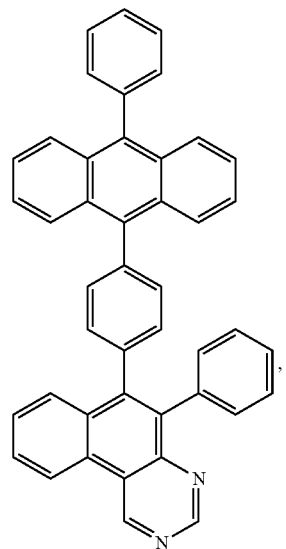
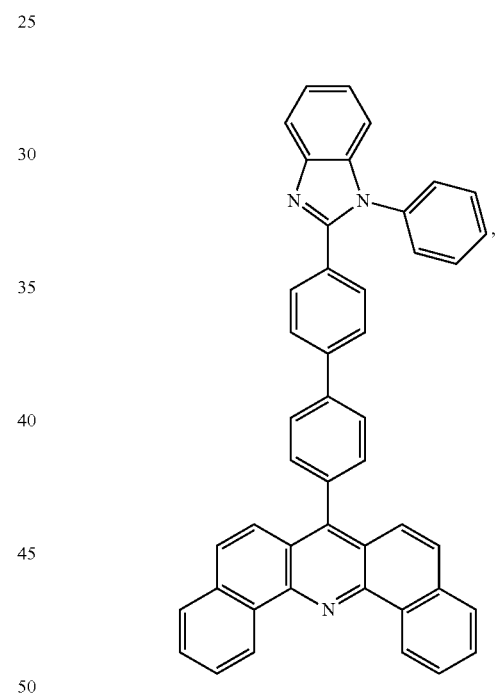
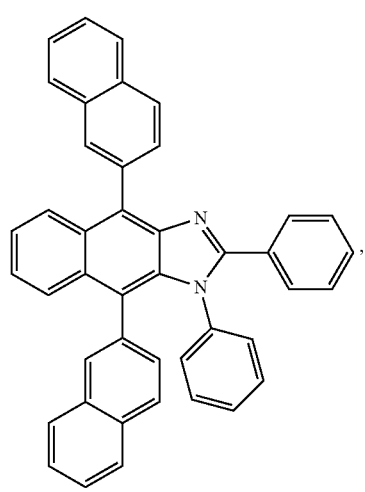
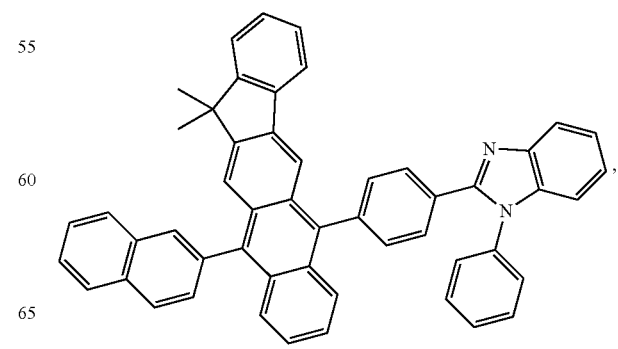

119
-continued
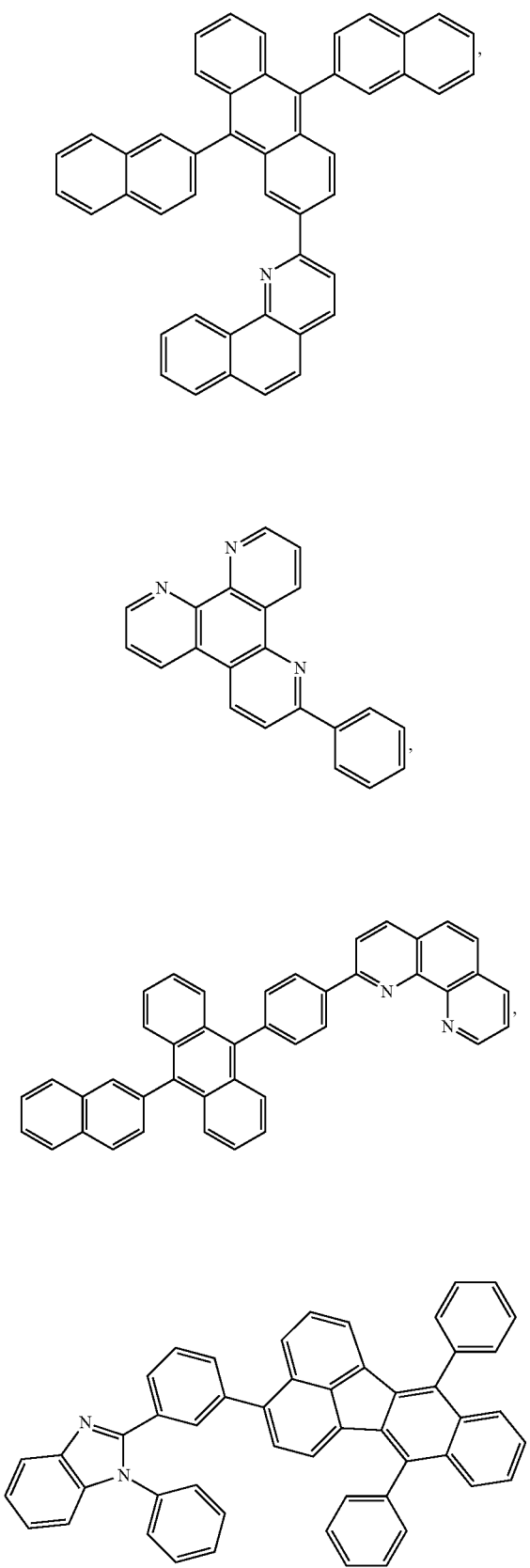
120
-continued
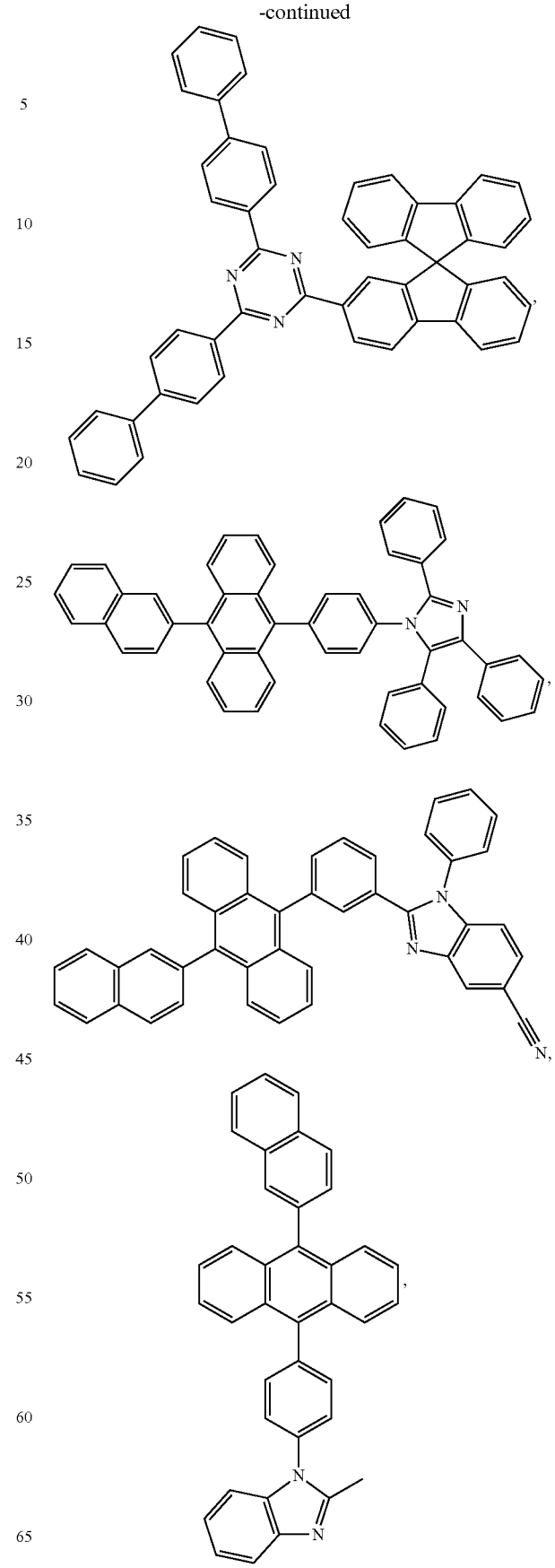

-continued

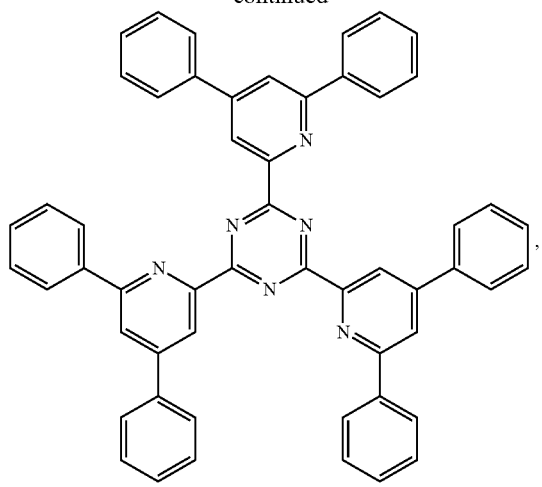

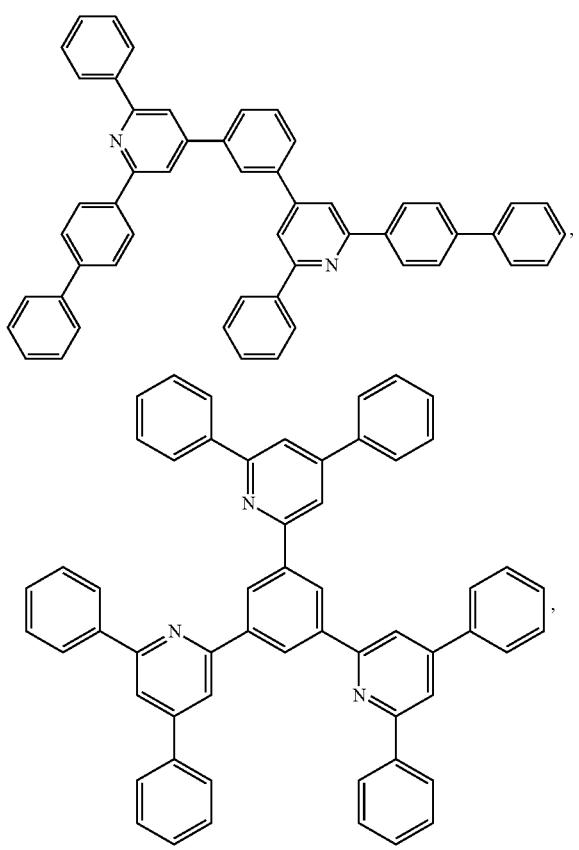

-continued

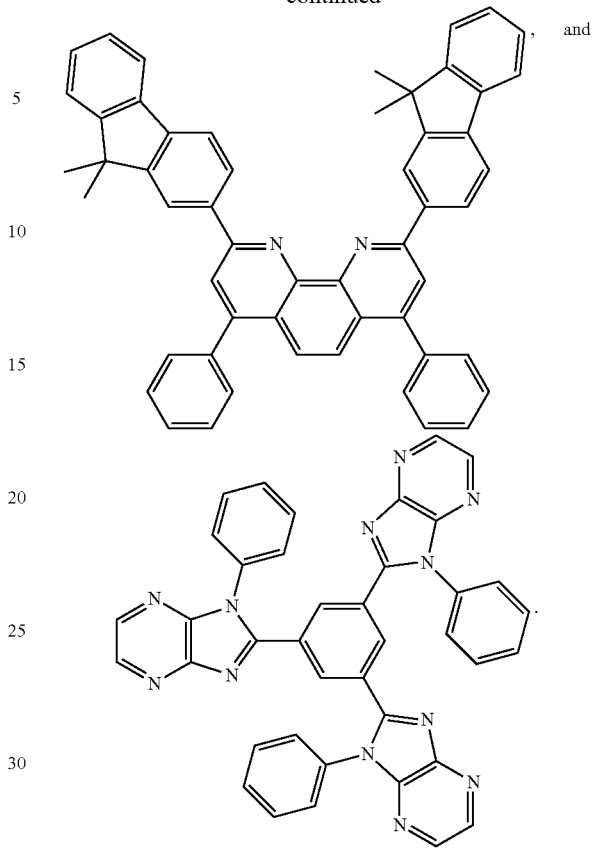

Charge Generation Layer (CGL):

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

According to another aspect of the present disclosure, a device that includes one or more organic light emitting devices disclosed herein is also provided. Such device can be one or more of a consumer product, an electronic component module, an organic light-emitting device and a lighting panel. The organic layer can be an emissive layer and the compound can be an emissive dopant in some embodiments, while the compound can be a non-emissive dopant in other embodiments.

EXPERIMENTAL

Device Fabrication and Characterization.

Figure 5A:
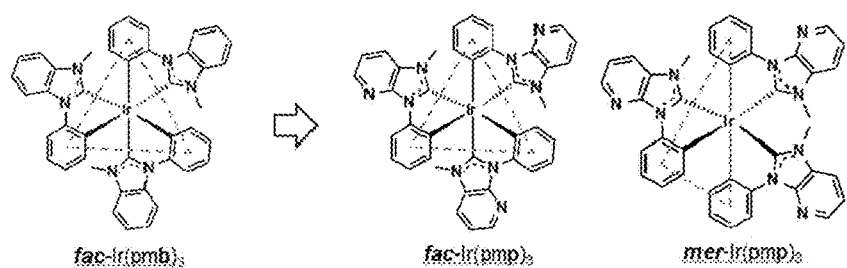
FIG. 5A shows structures of fac-Ir(pmp)$_3$, fac-Ir(pmb)$_3$, and mer-Ir(pmp)$_3$.

PHOLEDs were grown on pre-cleaned glass substrates coated with 80 nm-thick indium tin oxide (ITO) by vacuum thermal evaporation in a chamber with a base pressure $6 \times 10^{-7}$ torr. The devices consist of 10 nm $MoO_3$ doped at 15 vol. % in 9-(4-tert-Butylphenyl)-3,6-bs(triphenylsilyl)-9H-carbazole (CzSi) as a hole injection layer (HIL)/5 nm CzSi hole transport layer (HTL)/5 nm NHC Ir (III) complex-based EBL/40 nm Ir(pmp)$_3$ doped in Diphenyl-4-triphenyl-silylphenyl-phosphine oxide (TSPO1) to form the emissive layer (EML)/5 nm TSPO1 hole and exciton blocking layer (HBL)/30 nm 2,2',2''-(1,3,5-benzinetriyl)-tris(1-phenyl-1-H-benzimidazole) (TPBi) electron transport layer (ETL)/1.5 nm 8-hydroxyquinolinolato-Li electron injection layer (EIL)/100 nm Al (cathode). The EBLs and the emitter dopants used for the fac- and mer-Ir(pmp)$_3$ based devices were fac-Ir(pmp)$_3$ and fac-Ir(pmb)$_3$, respectively. In other words, the EBL in each device was a neat film formed from the same compound as the emitter dopant. FIG. 5A shows the structures of fac-Ir(pmp)$_3$ and fac-Ir(pmb)$_3$. The current density-voltage-luminance (J-V-L) characteristics were measured using a parameter analyzer (HP4145, Hewlett-Packard) and a calibrated photodiode (FDS1010-CAL, Thorlab) according to standard procedures, such as those described in Forrest, S. R., Bradley, D. C. & Thompson, M. E. Measuring the Efficiency of Organic Light-Emitting Devices. *Adv. Mater.* 15, 1043-1048 (2003). The emission spectra at 10 mA cm$^{-2}$ were recorded using a calibrated spectrometer (USB4000, Ocean Optics) coupled to the device with an optical fiber.

Recombination Zone Probing.

Figure 6A:
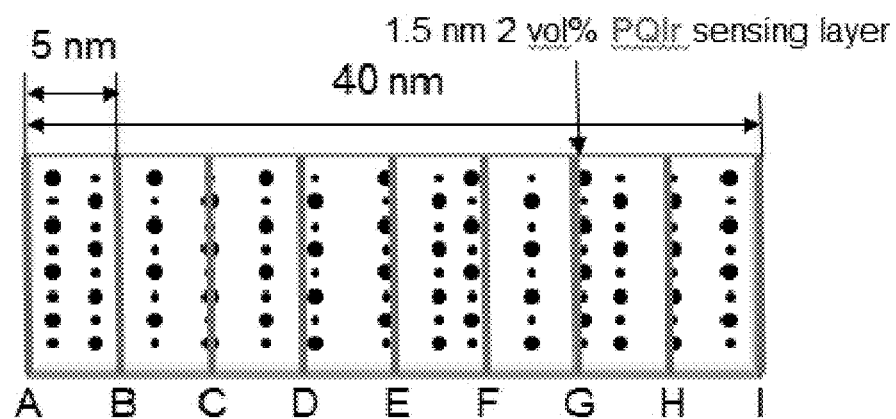
FIG. 6A is a schematic of a 1.5 nm-thick sensing layer containing 5 vol. % PQIr in the emissive layer (EML) of 9 PHOLEDs inserted at the different position, x, (denoted as devices $D_A$ to $D_I$) with an interval of $\Delta$x=5 nm.
Figure 6B:
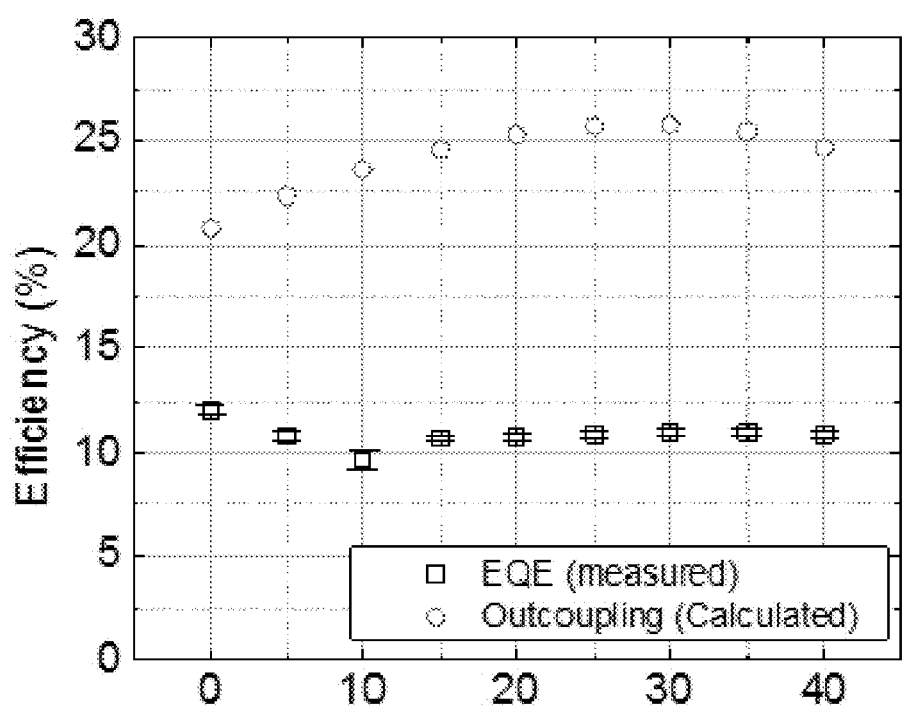
FIG. 6B shows calculated outcoupling efficiencies (circle) of the dipoles in the respective position (A to I, corresponding to x=0 to 40 nm) of the PHOLED EMLs and their external quantum efficiencies (square) measured at current density of J=10 mA cm$^{-2}$.
Figure 6C:
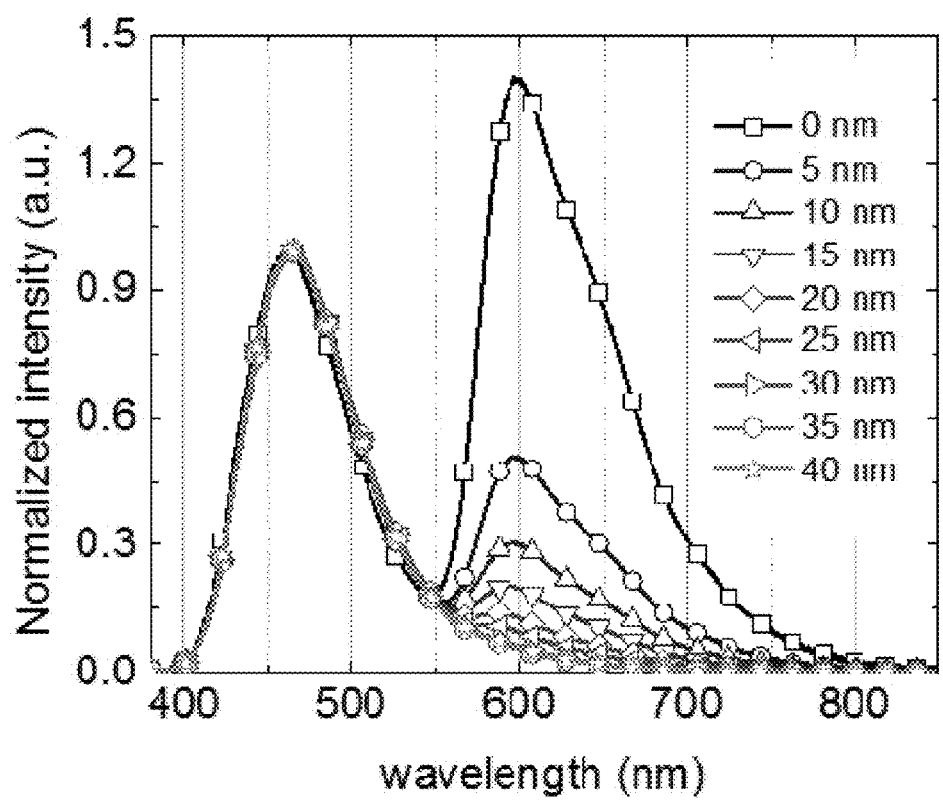
FIG. 6C shows electroluminescent spectra of PHOLEDs measured at J=10 mA cm$^{-2}$.

The triplet exciton density, N(x), in the EML as a function of distance, x, from the EBL/EML interface was determined by measuring the relative emission intensity from a 1.5 nm-thick "sensing" layer comprised of 5 vol. % doped red-emitting phosphor, i.e., iridium (III) bis (2-phenyl quinolyl-N,C$^{2'}$) acetylacetonate (PQIr), inserted at different positions within the EML, as previously[18] (see FIG. 6A). Specifically, N(x) is calculated using $$N(x) \times \Box_R(x) = A \times EQE(x) \times \frac{I_R(x)}{I_R(x) + I_B(x)}, \quad (1)$$

where $\Box_R(x)$ is the calculated outcoupling efficiency of PQIr, EQE(x) is the EQE of the PHOLEDs with PQIr at x (see FIG. 6B), $I_R(x)$ and $I_B(x)$ are the peak EL intensities of PQIr (red) and Ir(pmp)$_3$ (blue), respectively (see FIG. 6C), and A is the normalization constant satisfying $$\int N(x)dx = 1.$$

Figure 6D:
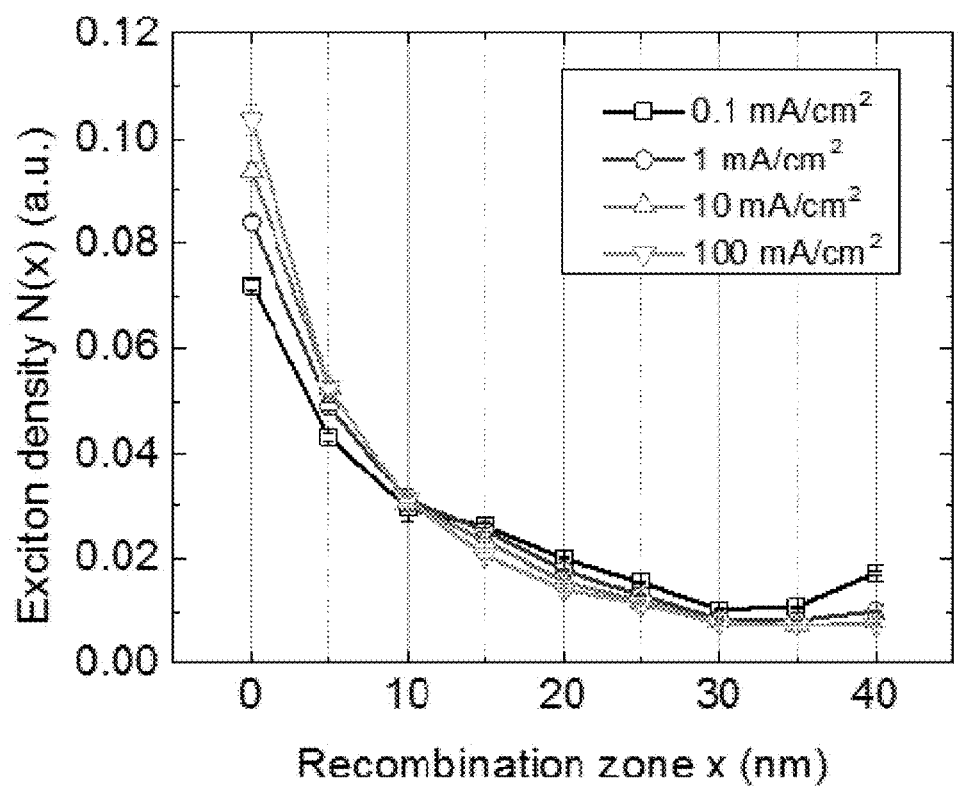
FIG. 6D shows calculated local triplet density, N, with respect to the EML position (x) at J=0.1, 1, 10, and 100 mA cm$^{-2}$ (corresponding to square, circle, triangle and reversed triangle, respectively).

As an example, the resulting N(x) of the uniformly doped EML by mer-Ir(pmp)$_3$ at 14 vol. % at different current densities are shown in FIG. 6D.

Unipolar Charge Transporting Device.

The hole-only-transport device was grown on the ultraviolet-ozone treated ITO, which consisted of 10 nm 15 vol. % $MoO_3$ doped into CzSi/5 nm CzSi/5 nm fac-tris(phenylpyrazole) iridium (III) (fac-Ir(ppz)$_3$)/EML/5 nm TSPO1/5 nm $MoO_3$/100 nm Al. The electron-only-transport device was grown on untreated ITO and its structure consisted of 10 nm 15 vol. % $MoO_3$ doped into CzSi/5 nm CzSi/5 nm fac-Ir(ppz)$_3$/EML/5 nm TSPO1/1.5 nm LiQ/100 nm Al. For both types, 40 nm of mer-Ir(pmp)$_3$ doped at 4, 8, and 20 vol. % into TSPO1 were used as EMLs.

Results and Discussion

Figure 5B:
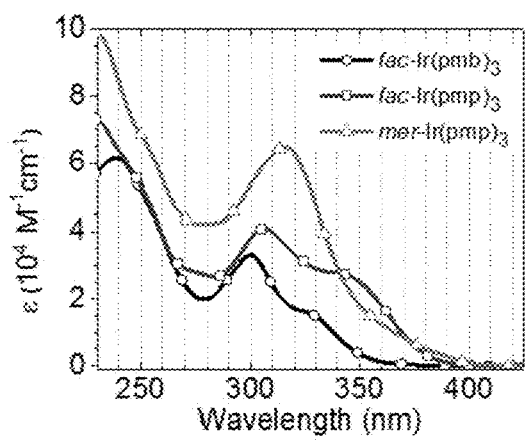
FIG. 5B shows absorption spectra of fac-Ir(pmb)$_3$ (circles) and fac-Ir(pmp)$_3$ (squares) dispersed in dichloromethane. Spin-allowed metal-to-ligand charge-transfer ($^1$MLCT) transitions of both molecules are observed at peak wavelengths of $\lambda$=320 and 340 nm, respectively.
Figure 5C:
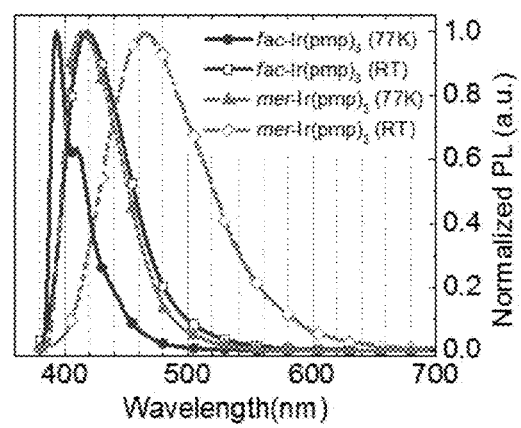
FIG. 5C shows a photoluminescence spectra of fac- and mer-Ir(pmp)$_3$ at temperatures of T=295 K and 77 K in degassed 2-methyltetrahydrofuran (2-MeTHF). fac-Ir (pmp)$_3$ has the smaller rigidochromic shift and more resolved vibronic progressions than the mer-isomer, due to relatively more $\pi$-$\pi$* ligand-centered character of its excited states. Additionally, mer-Ir(pmp)$_3$ with a stronger $^3$MLCT character has a broader spectrum due to the greater metal-orbital involvement in its polar excited states.

The structure of Ir(pmp)$_3$ shown in FIG. 5A is based on the near-ultraviolet-emitting tris-(N-phenyl, N-methyl-benzimidazol-2-yl) Ir(III), Ir(pmb)$_3$, whose benzannulated component in the NHC ligands is replaced with a fused pyridyl ring. The absorption spectra of fac-Ir(pmp)$_3$ and fac-Ir(pmb)$_3$ in FIG. 5B show that their spin-allowed metal-to-ligand charge-transfer ($^1$MLCT) transitions have a high energy onset at λ=380 nm and 350 nm, respectively. The deeper lowest unoccupied molecular orbital (LUMO) and nearly identical highest occupied molecular orbital (HOMO) energies of Ir(pmp)$_3$ compared to Ir(pmb)$_3$ results in its spectral red shift as shown in Table 1 below. FIG. 5C shows that the photoluminescence (PL) spectrum of fac-Ir(pmp)$_3$ in 2-methyltetrahydrofuran (2-MeTHF) (peak wavelength of $\lambda_{max}$=418 nm) also red-shifts into the deep blue compared to the near UV emission of fac-Ir(pmb)$_3$ ($\lambda_{max}$=380 nm). The PL spectrum of mer-Ir(pmp)$_3$, on the other hand, displayed a large red-shift relative to the fac-isomer at room temperature. The low emission energy of the mer-isomer is due to its reduced energy gap confirmed by cyclic voltammetry. See Table 1. In Table 1 below, reduction/oxidation potentials, $E_{red}/E_{oxi}$, of fac- and mer-Ir(pmp)$_3$ and fac-Ir(pmb)$_3$ were measured by cyclic voltammetry (CV). The highest occupied molecular orbital (HOMO$_{CV}$) and lowest unoccupied molecular orbital (LUMO$_{CV}$) are calculated based on the CV measurement. HOMO values measured by ultraviolet photoelectron spectroscopy (HOMO$_{UPS}$) are also listed.

TABLE 1

| Isomers | $E_{oxi}$ (V)$^a$ | $E_{red}$ (V)$^a$ | HOMO$_{UPS}$ (eV) | HOMO$_{CV}$ (eV)$^b$ | LUMO$_{CV}$ (eV)$^b$ |
|---|---|---|---|---|---|
| fac-Ir(pmp)$_3$ | 0.47 | −2.77 | −5.50 ± 0.10 | −5.26 ± 0.13 | −1.48 ± 0.39 |
| mer-Ir(pmp)$_3$ | 0.23 | −2.80 | −5.30 ± 0.10 | −4.93 ± 0.10 | −1.45 ± 0.39 |
| fac-Ir(pmb)$_3$ | 0.45 | −3.19 | — | −5.23 ± 0.13 | −0.98 ± 0.43 |

$^a$versus Fc/Fc$^+$.
$^b$Calculations are based on the empirical relationships as given by HOMO$_{CV}$ = −(1.4 ± 0.1) × $E_{oxi}$ − 4.6 ± 0.08 eV and LUMO$_{CV}$ = −(1.19 ± 0.08) × $E_{red}$ − 4.78 ± 0.17 eV.
* Error range of the CV measurement is 50 mV.

Figure 7A:
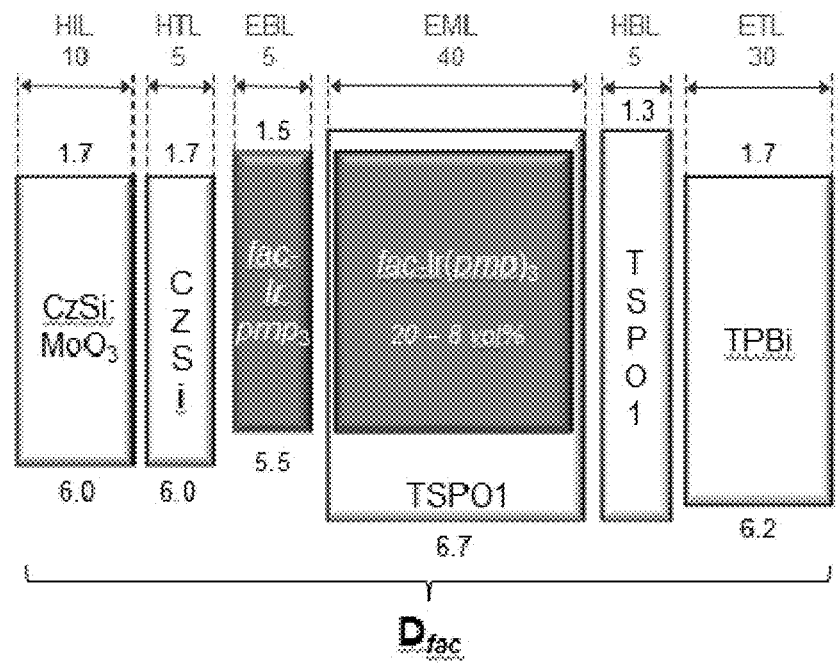
FIG. 7A shows energy level diagrams of electrophosphorescent organic light emitting devices (PHOLEDs) based on fac-Ir(pmp)$_3$, denoted by device D$_{fac}$.
Figure 7B:
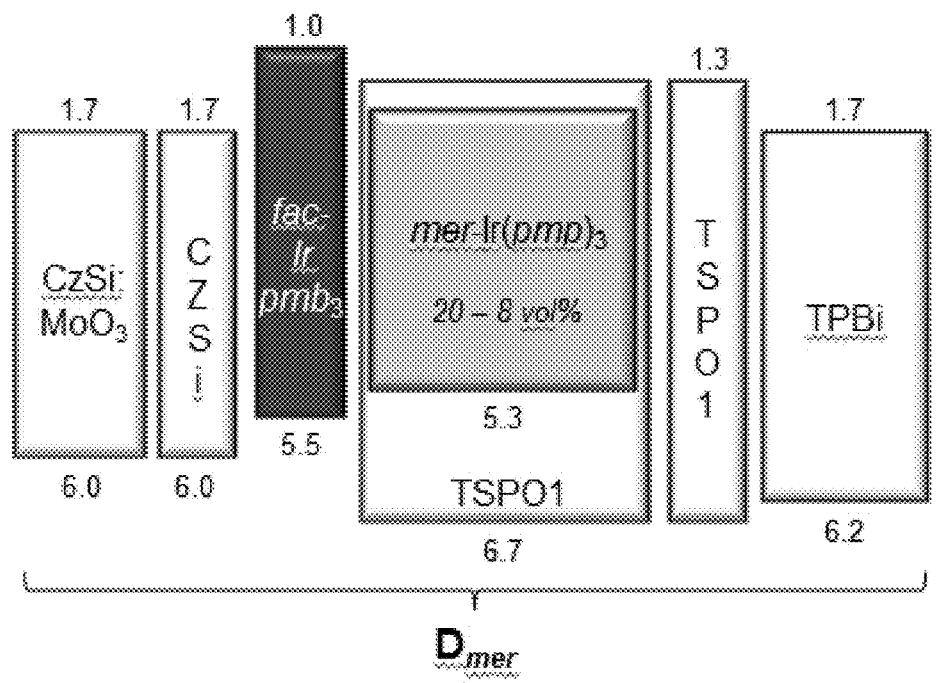
FIG. 7B shows energy level diagrams of PHOLEDs based on mer-Ir(pmp)$_3$, denoted by device D$_{mer}$. Highest occupied molecular orbital (HOMO) and lowest unoccupied molecular orbital (LUMO) energies of comprising materials in electron volt (eV) are either calculated or obtained from the literature. Here, HIL=hole injection layer, HTL=hole blocking layer, EBL=electron/exciton blocking layer, EML=emissive layer, HBL=hole/exciton blocking layer, and ETL=electron transport layer; the corresponding number below each abbreviation is its thickness in nanometer. Also, CzSi=9-(4-tert-Butylphenyl)-3,6-bs(triphenylsilyl)-9H-carbazole, TPBi=2,2',2"-(1,3,5-benzinetriyl)-tris(1-phenyl-1-H-benzimidazole).

FIG. 7 shows the structures of PHOLEDs using either fac- or mer-Ir(pmp)$_3$ (denoted by devices D$_{fac}$ or D$_{mer}$, respectively) along with the HOMO and LUMO energies for all organic materials studied. Transport LUMO energies are calculated from the reported or measured reduction potentials based on the empirical relationship by Djurovich P. I., Mayo, E. I., Forrest, S. R. & Thompson, M. E., Measurement of the lowest unoccupied molecular orbital energies of molecular organic semiconductors. *Org. Electron.* 10, 515-520 (2009), instead of using optical LUMO energies (i.e., via adding the HOMO energy obtained from the optical absorption onset wavelength, since this introduces error by ignoring the exciton binding energy). The EBLs consist of the NHC Ir (III) complexes themselves, i.e., fac-Ir(pmp)$_3$ and fac-Ir(pmb)$_3$ for D$_{fac}$ and D$_{mer}$, respectively, since they have equal or shallower LUMO energies than those of the host, as well as equal or larger triplet energy levels than the dopants. This enables efficient, nearly barrier free, hole injection into the hole-conducting emitter dopants in the EML, while blocking electrons transported via the host. In addition to matching the EBL with the emitter dopant, the dopant concentration was also graded for further performance enhancement. The doping concentrations in the EML were linearly graded from 20 vol. % at the EBL interface, to 8 vol. % at the HBL interface to create a uniform triplet distribution across the EML.

Figure 8A:
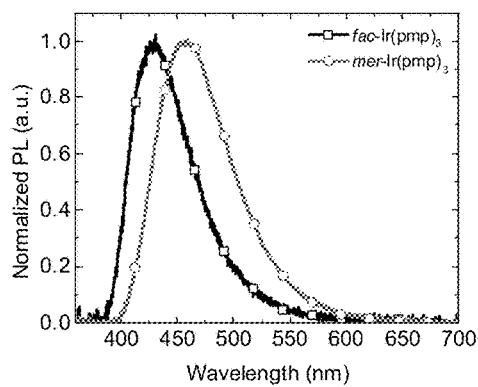
FIG. 8A shows photoluminescence spectra of fac-(squares) and mer-Ir(pmp)$_3$ (circles) doped at 14 vol. 0/% into TSPO1 excited by a HeCd laser (wavelength, $\lambda$=325 nm).
Figure 8B:
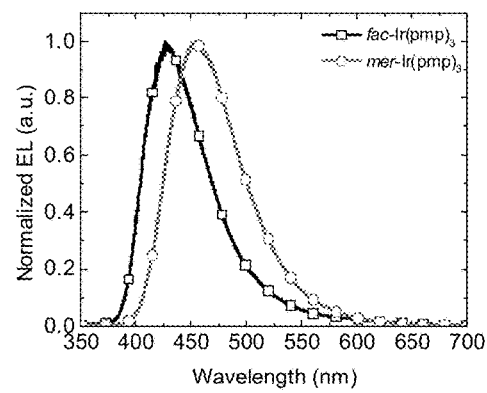
FIG. 8B shows electroluminescence spectra of D$_{fac}$ and D$_{mer}$ measured at a current density of J=10 mA cm$^{-2}$.
Figure 8C:
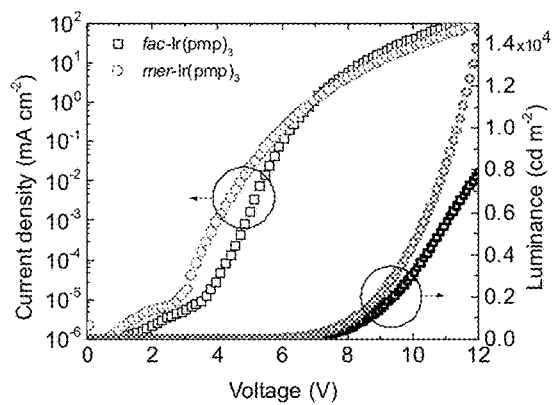
FIG. 8C shows current density-voltage-luminance (J-V-L) characteristics of D$_{fac}$ and D$_{mer}$.

FIG. 8A shows the PL spectra of fac- and mer-Ir(pmp)3 uniformly doped at 14 vol. % into TSPO1. FIG. 8B shows the electroluminescence (EL) spectra of D$_{fac}$ and D$_{mer}$ at a current density of J=10 mA cm$^{-2}$, which resulted in deep blue CIE coordinates of [0.16, 0.09] and [0.16, 0.15], respectively. The PL spectra have nearly identical CIE coordinates to the EL, confirming that the emission is solely from the dopants in the PHOLEDs. FIG. 8C shows the current density-voltage-luminance (J-V-L) characteristics of D$_{fac}$ and D$_{mer}$. D$_{mer}$ turns on at a lower voltage than D$_{fac}$ (3 V vs. 4 V), which is presumably due to different charge injection, transport and trapping characteristics, and the lower HOMO energy of mer-Ir(pmp)$_3$=5.3±0.1 vs. 5.5±0.1 eV for the fac-isomer. (See Table 2 below.). The J-V-L characteristics were measured by ultraviolet photoelectron spectroscopy. Although the current densities of D$_{fac}$ at high voltage (>7 V) are greater than those of D$_{mer}$, the latter still achieved higher luminance due to its red-shifted emission and higher EQE at all current densities. (See FIGS. 8B and 8D.). In addition, the EQE of D$_{fac}$ and D$_{mer}$ were found to be consistent with the solid state PL quantum yields of 43±4 and 73±7% for fac- and mer-Ir(pmp)$_3$ doped at 14 vol. % into TSPO1, respectively. (See Table 2 below.). Parameters for triplet-triplet (k$_{TT}$) and triplet-polaron annihilation (k$_{TP}$).

TABLE 2

| Fixed parameter | | Fitting parameters | |
|---|---|---|---|
| Doping | τ (µs)$^a$ | k$_{TT}$ (10$^{-12}$ cm$^{-3}$s$^{-1}$) | k$_{TP}$ (10$^{-13}$ cm$^{-3}$s$^{-1}$) |
| D$_{fac}$ Uniform | 1.0 ± 0.1 | 4.6 ± 0.8 | 8.6 ± 0.1 |
| Graded | | 5.6 ± 0.4 | 3.2 ± 0.5 |
| D$_{mer}$ Uniform | 0.85 ± 0.03 | 5.8 ± 0.8 | 10 ± 1 |
| Graded | | 7.3 ± 0.4 | 6.4 ± 0.4 |

$^a$Triplet lifetime (τ) obtained from the transient phosphorescence decay fit.
* Errors for the model parameters (k$_{TT}$ and k$_{TP}$) are the 95% confidence interval.

Figure 8D:
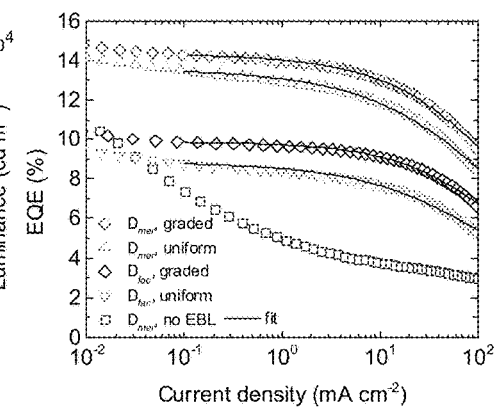
FIG. 8D shows external quantum efficiency (EQE) vs. J for PHOLEDs of either linearly graded or uniformly doped emissive layers consisting of either fac- or mer-Ir(pmp)$_3$. Fits (solid lines) are based on the model in text. EQE vs. J for the mer-based PHOLED without an electron/exciton blocking layer (EBL) is also plotted.

FIG. 8D shows the EQE vs. current density characteristics of D$_{fac}$, D$_{mer}$ and the analogous devices whose EMLs are uniformly doped at 14 vol. % by fac- and mer-Ir(pmp)$_3$, and a device without an Ir(C^C:)$_3$-based EBL. By employing fac-Ir(pmb)$_3$ as the EBL, the uniformly doped EML PHOLED exhibited a markedly higher EQE and reduced efficiency roll-off at high J compared to the PHOLED lacking an EBL. Therefore, J$_{1/2}$ increases by almost 280 times, from 0.5±0.1 to 140±10 mA cm$^{-2}$, and EQE increases by at least 40% at all current densities. The EQEs of the graded-EML devices employing an EBL were further improved by ~10% at all current densities compared to uniformly doped EML PHOLEDs, and J$_{1/2}$ is increased by a further 50%, leading to a cumulative improvement by a significant factor of 420. Thus, D$_{fac}$ and D$_{mer}$ attain EQE=10.1±0.2 and 14.4±0.4% at low luminance, decreasing only slightly to 9.0±0.1 and 13.3±0.1% at L=1,000 cd m$^{-2}$, and by 50% at L=7,800±400 and 22,000±1,000 cd m$^{-2}$ (corresponding to J$_{1/2}$=160±10 and 210±10 mA cm$^{-2}$), respectively.

Figure 9:
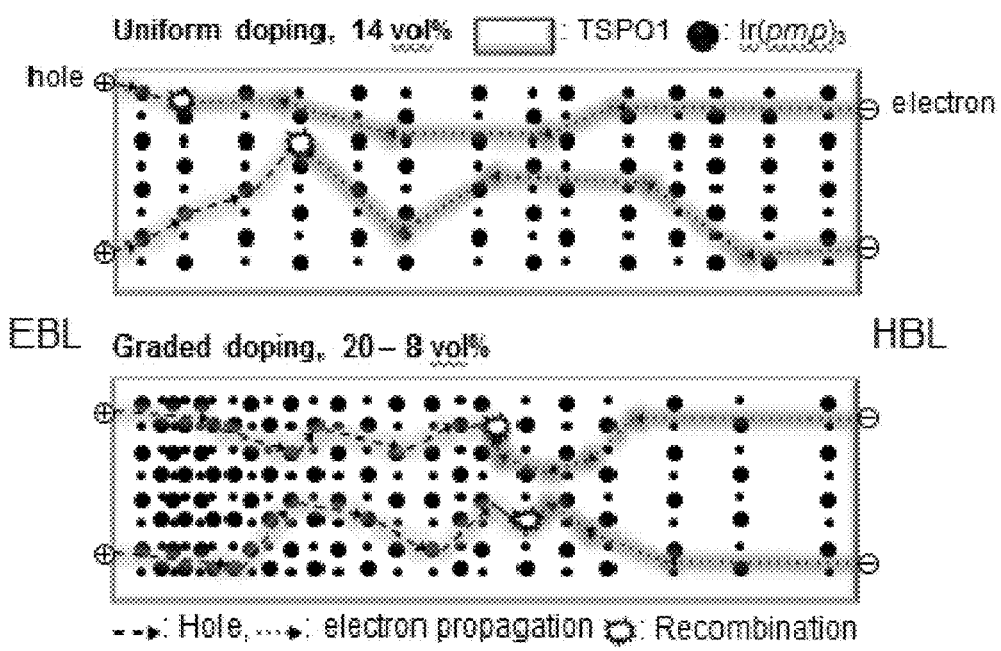
FIG. 9 shows charge-transport mechanisms in the emissive layers (EML) of (top) uniformly doped Ir(pmp)$_3$ (circle) at 14 vol. % and (bottom) linearly graded at 20-8 vol. % into TSPO1 (rectangular background), from the EBL to the HBL boundaries. Black and red arrows describe the hole and electron transport trajectories respectively, which then radiatively recombine as described as a yellow starburst. This figure conceptually demonstrates that recombination occurs relatively closer to the EBL boundary for the graded vs. uniformly doped EML, due to the improved hole injection and transport.
Figure 10A:
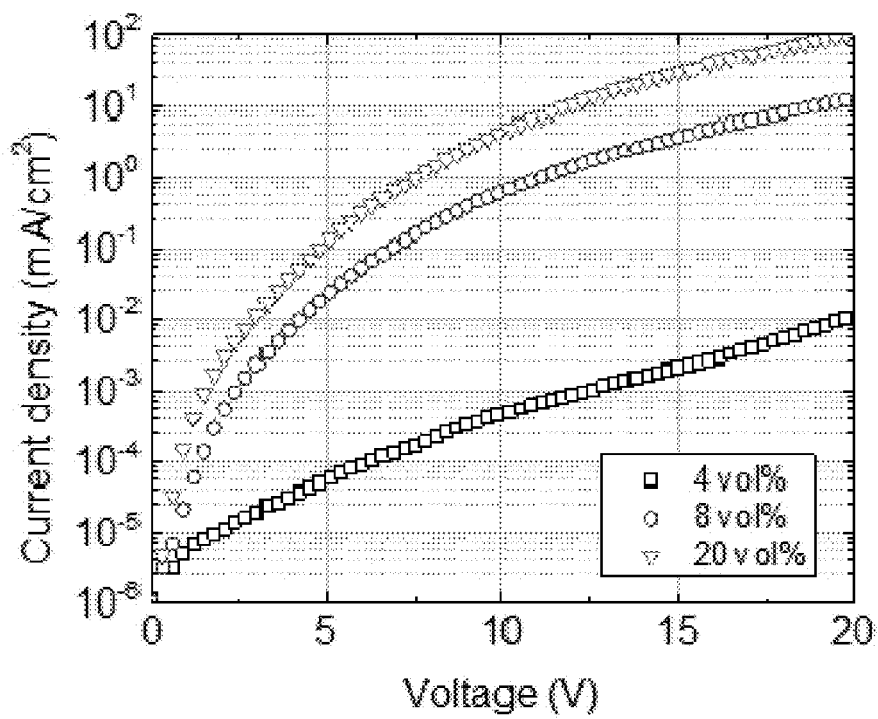
FIG. 10A shows current density-Voltage (J-V) characteristics of hole-only transporting devices with different doping concentrations of mer-Ir(pmp)$_3$ at 4, 8, and 20 vol. % (square, circle, and triangle, respectively) in the EML.
Figure 10B:
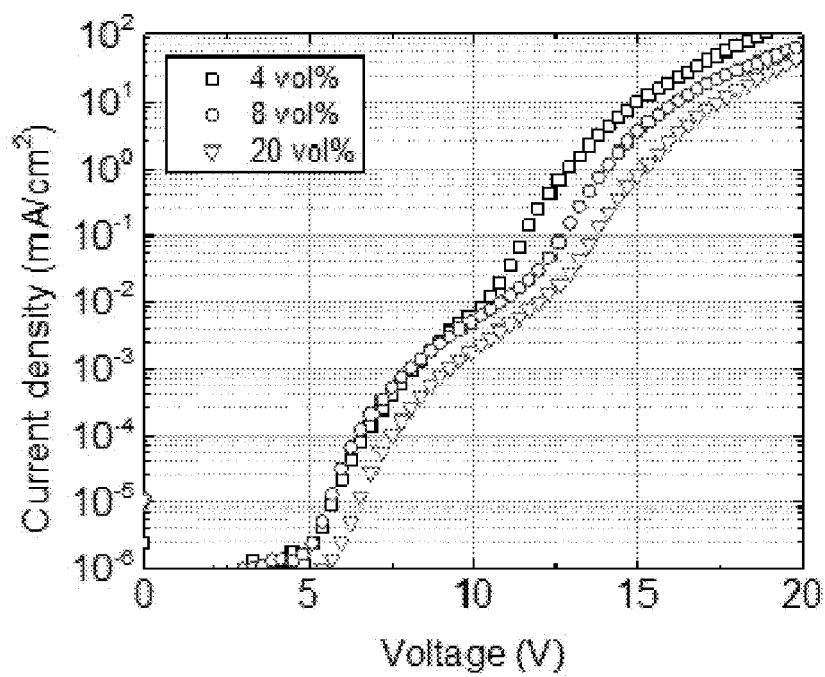
FIG. 10B shows current density-Voltage (J-V) characteristics of electron-only transporting devices with different doping concentrations of mer-Ir(pmp)$_3$ at 4, 8, and 20 vol. % (square, circle, and triangle, respectively) in the EML.
Figure 11:
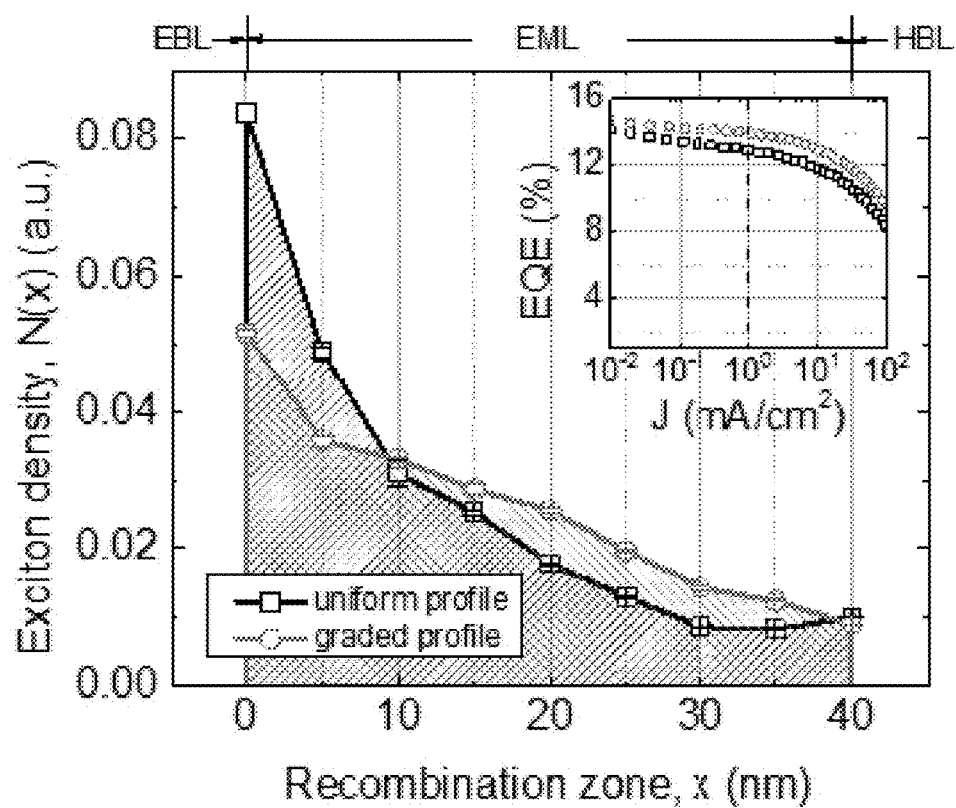
FIG. 11 shows measured triplet density distributions of the uniformly doped (squares) and graded doped (circle) EMLs in D$_{mer}$. The EQE vs. J of D$_{mer}$ for the graded and uniformly doped EML structures are compared in the inset.

FIG. 9 illustrates the charge transport mechanisms across the EMLs. The injected holes and electrons into the EML are nearly exclusively transported via the dopant and the host, respectively. This is confirmed by experiments that the current density in the electron-only transporting devices is nearly independent of doping concentration, whereas the current density significantly increases with concentration for hole-only transporting devices as shown in FIGS. 10A and 10B. Since TSPO1 is a preferably electron-transporting host due to its diphenylphosphine oxide group, triplets are primarily formed at the EBL/EML interface (top, FIG. 9). This necessitates the use of EBLs with high triplet energies as shown in FIGS. 7 and 8D. In the graded EML, a higher doping concentration near the EBL/EML interface facilitates the hole injection and transport, then gradually reduces due to the decreasing dopant fraction near the EML/HBL interface (bottom, FIG. 9). The resulting measured triplet densities, i.e., recombination profiles at a current density of J=10 mA/cm$^2$ using the method of Zhang et al. (Zhang, Y., Lee, J. & Forrest, S. R. Tenfold increase in the lifetime of blue phosphorescent organic light-emitting diodes. *Nat. Commun.* 5, (2014)) are shown in FIG. 11. The integrals of both profiles are normalized to unity for a comparison. As expected, nearly 47% of the triplets are concentrated near the EBL/EML interface (x=0~10 nm) in the uniformly doped EML, whereas approximately one third of triplets in that region migrate towards the HBL in the graded EML. The distributed profile reduces triplet-triplet annihilation (TTA) that scales as the square of the triplet density.

Figure 12A:
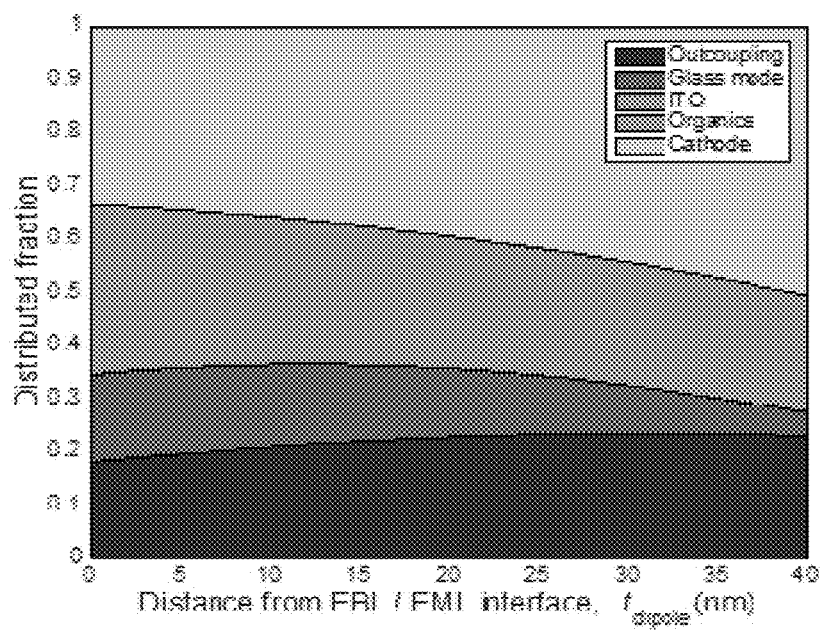
FIG. 12A shows calculated fraction of dipole power dependent on its location, x, in the EML from an EBL/EML interface (x=0 nm) to EML/hole blocking layer (HBL) interface (x=40 nm).
Figure 12B:
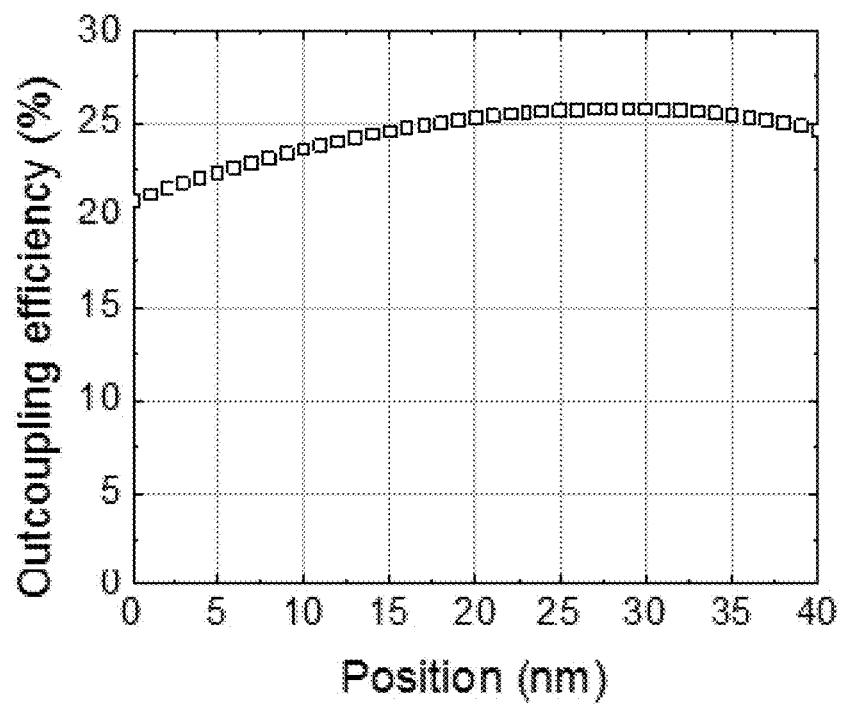
FIG. 12B shows the outcoupling efficiency extracted from FIG. 12A.

In addition, radiative recombination in the graded EML device arises relatively distant from the EBL/EML interface, which results in an increased EQE due to enhanced light outcoupling shown in FIG. 12B. These combined effects lead to the increase in the EQE for $D_{mer}$, as shown in the inset of FIG. 11.

We model the EQE vs. current density (J) of graded and uniformly doped fac- and mer-Ir(pmp)$_3$ PHOLEDs in FIG. 8D. The rate equations for the position (x)- and time (t)-dependent electron, n, and triplet densities, N are given by:

$$\frac{dn(x,t)}{dt} = G(x) - \gamma n^2(x,t), \quad (2)$$

$$\frac{dN(x,t)}{dt} = G(x) - \frac{n(x,t)}{\tau} - k_{TP}n(x,t)N(x,t) - \frac{1}{2}k_{tt}N^2(x,t), \quad (3)$$

where $\gamma = q(\mu_n + \mu_p)/\varepsilon\varepsilon_0$ is Langevin recombination rate and $\mu_n$, and $\mu_p$ are the electron and hole mobilities in the doped EML, respectively. Also, $\varepsilon = 3$ is the dielectric constant, G is the charge generation rate, and $k_{TP}$ is the triplet-polaron annihilation rate. Here, $G(x) = J/q \times R(x)$, where R is the measured recombination profile in FIG. 11.

In Eq. (2), it is assumed that the PHOLEDs have an equal number of electrons and holes in the EML, i.e. p=n. Also, $\tau$ in Eq. (3) is obtained from the transient phosphorescence decay of solid-state thin films. These expressions are combined in the steady state and solved for N(x), that is subsequently integrated over the EML from x=0 to 40 nm. Then, N/J was initially normalized by the EQE at J=0.1 mA/cm$^2$ and fit to J=100 mA/cm$^2$ as shown in FIG. 8D (lines), where bimolecular quenching processes are active. Table 2 summarizes the parameters extracted from the fits: as the doping concentration changes from the uniform (14 vol. %) to graded (20-8 vol. %), $k_{TT}$ increases while $k_{TP}$ decreases for both fac- and mer-Ir(pmp)$_3$ devices. The increased $k_{TT}$ is explained by a high triplet concentration near to the EBL/EML interface (see FIG. 11); That is, emission of the graded device occurs in the more highly-doped region (starting from 20 vol. %) than the uniformly doped device (14 vol. %), which results in the higher $k_{TT}$. However, the reduced local density of triplets in the graded EML compensates for the higher $k_{TT}$. Also, the significantly lower $k_{TP}$ for the graded devices, which is proportional to the charge carrier density, is consistent with the measured profiles.

The improved EQE and $J_{1/2}$ of the devices are primarily due to the inclusion of Ir(C^C:)$_3$ as an EBL that prevents electron and exciton leakage (FIG. 8D). As noted above, being used as a neat dopant layer for electron blocking is a unique property of the Ir(C^C:)$_3$ family of phosphors with their very shallow LUMO energies and wide HOMO-LUMO gaps. Thus, electrons are transported only on the host, and holes on the dopant, forming an exciplex that immediately transfers to an exciton on the dopant, followed by blue emission. The rapid radiative decay of Ir(pmp)$_3$ likely prevents the saturation of the triplet density and resulting bimolecular annihilation. (i.e., radiative triplet lifetimes of fac- and mer-Ir(pmp)$_3$ measured to be $\tau=1.2\pm0.1$ and $0.8\pm0.1$ μs, respectively, in 2-methyltetrahydrofuran). The distributed recombination profile achieved by the graded doping concentration further contributes to reduced bimolecular quenching that is especially pronounced at high current densities. As a result, $J_{1/2}$ increases from $120\pm10$ mA/cm$^2$ to $160\pm10$ mA/cm$^2$, and from $150\pm10$ mA/cm$^2$ to $210\pm10$ mA/cm$^2$ for fac- and mer-Ir(pmp)$_3$ based PHOLEDs. These values for both EQE and $J_{1/2}$ are extremely high compared to other deep blue-emitting phosphors as detailed in Table 3 below.

TABLE 3

Summary of reported performance of selected deep blue PHOLEDs.

| Dopants | EQE (%)[a] | Luminance | $J_{1/2}$ (mA cm$^{-2}$)[b] | CIE[c] | $\tau$ (μs)[d] | Ref. |
|---|---|---|---|---|---|---|
| mer-Ir(pmp)$_3$ | 14.4 ± 0.4/13.3 ± 0.1 | 1/1000 nits | 210 ± 10 | 0.16, 0.15 | 0.8 ± 0.1 | This work |
| fac-Ir(pmp)$_3$ | 10.1 ± 0.2/9.0 ± 0.1 | 1/1000 nits | 160 ± 10 | 0.16, 0.09 | 1.2 ± 0.1 | This work |
| (fpmi)$_2$Ir(dmpypz) | 17.1/15.1 | 100/1000 nits | 100-150 | 0.13, 0.16 | 1.84 | 11 |
| (TF)$_2$Ir(fptz)[‡] | 8.4/7.4 | max/100 nits | 30-40 | 0.15, 0.12 | 2.3 | 13 |
| (dfbmb)$_2$Ir(fptz) | 6.0/2.5 | 1/100 nits | 20-30 | 0.16, 0.13 | 0.5 | 8 |
| PtON7-dtb | 24.8/10.6 | max/1000 nits | 20 | 0.15, 0.08 | 4.7 | 15 |
| PtON1 | 23.3/16.8 | 100/1000 nits | 10-20 | 0.15, 0.13 | 4.1 | 14 |
| Pt-16 | 15.7/8.3 | max/1000 nits | 10.9 | 0.16, 0.13 | 5.1 | 12 |
| Ir(fppz)$_2$(dfbdp)[†] | 11.9/8.2 | 3/100 nits | 1-10 | 0.15, 0.11 | 7.42 | 9 |
| (HF)$_2$Ir(fptz)[‡] | 8.4/7.1 | max/100 nits | 1-10 | 0.15, 0.13 | 3.7 | 13 |
| mer-Ir(cn-pmic)$_3$ | 12.0 | 14.8 cd/A | <10 | 0.15, 0.15 | 19.5 | 28 |
| PtOO7 | 4.1/0.5 | 100/1000 nits | 0.1-1 | 0.15, 0.10 | 2.5 | 14 |
| Ir(fpmi)$_2$(tfpypz) | 7.6 | N/A | N/A | 0.14, 0.10 | 1.0 | 10 |

[a] External quantum efficiencies (EQE) of PHOLEDs measured at the specified luminance levels in the next column.
[b] Current density at half maximum EQE is based on the reported maximum values, otherwise EQEs at the specified conditions were used.
[c] Color chromaticity coordinate (CIE) CIE in this work was measured at 10 mA cm$^{-2}$. Values are rounded off to two decimal digits.
[d] Most triplet lifetimes (τ) of the phosphors from the reference, except (TF)$_2$Ir(fptz) and (HF)$_2$Ir(fptz), were measured either in solution or the polymer matrix.
[†] Pyrazole and
[‡] carbonyl ligand based phosphors, and others are carbene ligand based.
* Errors for EQE and $J_{1/2}$ are standard deviation from at least three devices and error for τ is the 95% confidence interval.

The disclosed experimental study of the PHOLED characteristics of NHC Ir(III) emitter with NHC Ir (III) electron/exciton blocker showed that NHC Ir(III) not only served as the deep blue emissive centers, but also as an EBL that effectively confines electron and exciton, while transporting and injecting holes into the emissive layer, nearly barrier free, that significantly improves the PHOLED performance, especially at exceptionally high brightness. Fac- and mer-stereo isomers of Ir(pmp)$_3$ were studied and fac-Ir(pmp)$_3$ was shown to produce the most saturated blue emission along with the highest EQE, and a reduced roll-off compared with previously reported deep blue Ir-based PHOLEDs. Compared with the known results achieved using platinum-complex PHOLEDs, our results exhibited high performance especially at a higher brightness (>1000 cd/m$^2$), which is beneficial for operational stability of deep blue PHOLEDs used in displays and solid-state lighting.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting device comprising:
   an anode;
   a cathode;
   an organic light emissive layer disposed between the anode and the cathode, wherein the organic emissive layer comprises one or more host material and an organic phosphorescent emissive dopant material; and
   an electron blocking layer comprising a neat film of the organic phosphorescent emissive dopant material disposed between the organic emissive layer and the anode.

2. The device of claim 1, wherein the electron blocking layer is a neat film of the organic phosphorescent emissive dopant material.

3. The device of claim 1, wherein the organic phosphorescent emissive dopant material is a carbene based compound having a carbene ligand coordinated to a metal center.

4. The device of claim 3, wherein the carbene based compound has the structure:

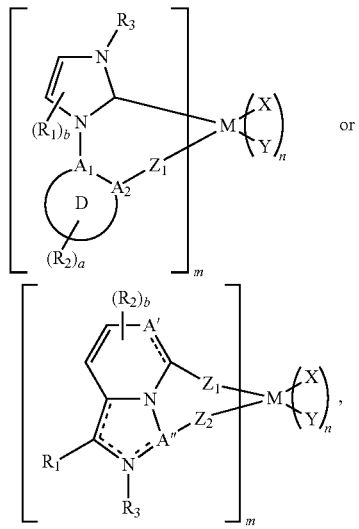

wherein M is a metal; ring D is an aromatic cyclic, heterocyclic, fused cyclic, or fused heterocyclic ring, wherein ring D can be optionally substituted with one or more substitutents $R_2$;

$R_1$ and $R_2$ are independently selected from H, alkyl, alkenyl, alkynyl, aralkyl, CN, $CF_3$, $CO_2R'$, $C(O)R'$, $C(O)NR'_2$, $NR'_2$, $NO_2$, $OR'$, $SR'$, $SO_2$, $SOR'$, $SO_3R'$, halo, aryl, heteroaryl, substituted aryl, substituted heteroaryl, or a heterocyclic group; $R_3$ is H, alkyl, alkenyl, alkynyl, aralkyl, aryl, heteroaryl, substituted aryl, substituted heteroaryl, or a heterocyclic group; and additionally or alternatively, two R groups on the same or adjacent ring, together may form independently a 5 or 6-member cyclic group, which is a cycloalkyl, cycloheteroalkyl, aryl, or heteroaryl; and wherein said cyclic group may be substituted by one or more substituents J;

each substituent J is independently selected from the group consisting of R', CN, $CF_3$, C(O)OR', C(O)R', $C(O)NR'_2$, $NR'_2$, $NO_2$, OR', SR', $SO_2$, SOR', or $SO_3R'$, and additionally, or alternatively, two J groups on adjacent ring atoms may form a fused 5- or 6-membered aromatic group;

each R' is independently selected from halo, H, alkyl, alkenyl, alkynyl, heteroalkyl, aralkyl, aryl, and heteroaryl;

$Z_1$ and $Z_2$ are selected from a bond, O, S, or NR';

$A_1$, $A_2$, A', and A" are independently selected from C, N, or P;

(X—Y) is selected from a photoactive ligand or an ancillary ligand;

a is 0, 1, 2, 3, or 4; b is 0, 1, or 2;

m is a value from 1 to the maximum number of ligands that may be attached to metal M;

m+n is the maximum number of ligands that may be attached to metal M.

5. The device of claim 4, wherein the carbene based compound is selected from the group consisting of:

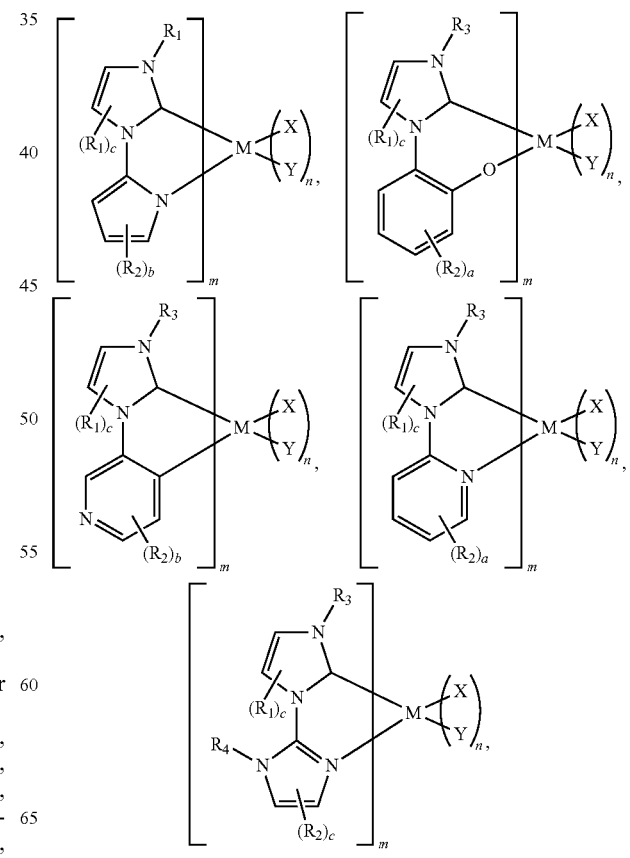

-continued

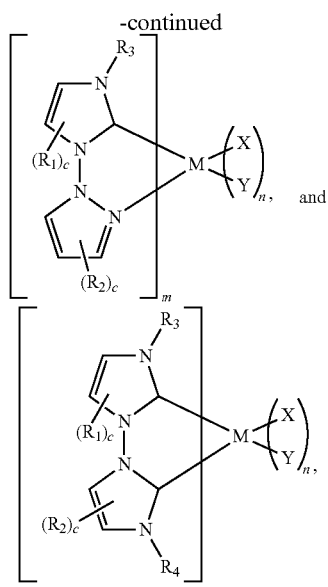

wherein c is 0, 1, or 2; and
wherein $R_4$ is selected from H, alkyl, alkenyl, alkynyl, aralkyl, aryl, heteroaryl, substituted aryl, substituted heteroaryl, or a heterocyclic group.

6. The device of claim 3, wherein the carbene based compound is $Ir(pmp)_3$.

7. The device of claim 4, wherein M is selected from the group consisting of Ir, Pt, Pd, Rh, Re, Ru, Os, Ti, Pb, Bi, In, Sn, Sb, Te, Al, Ga, Au, and Ag.

8. The device of claim 7, wherein M is Ir.

9. The device of claim 8, wherein m is 3 and n is 0.

10. The device of claim 3, wherein the carbene ligand has the structure;

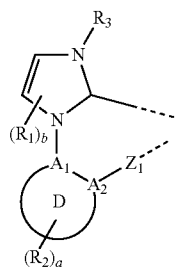

wherein ring D is an aromatic cyclic, heterocyclic, fused cyclic, or fused heterocyclic ring, wherein ring D can be optionally substituted with one or more substituents $R_2$;

$R_1$ and $R_2$ are independently selected from H, alkyl, alkenyl, alkynyl, aralkyl, CN, $CF_3$, $CO_2R'$, $C(O)R'$, $C(O)NR'_2$, $NR'_2$, $NO_2$, $OR'$, $SR'$, $SO_2$, $SOR'$, $SO_3R'$, halo, aryl, heteroaryl, substituted aryl, substituted heteroaryl, or a heterocyclic group; $R_3$ is H, alkyl, alkenyl, alkynyl, aralkyl, aryl, heteroaryl, substituted aryl, substituted heteroaryl, or a heterocyclic group; and additionally or alternatively, two R groups on the same or adjacent ring, together may form independently a 5 or 6-member cyclic group, which is a cycloalkyl, cycloheteroalkyl, aryl, or heteroaryl; and wherein said cyclic group may be substituted by one or more substituents J;

each substituent J is independently selected from the group consisting of R', CN, $CF_3$, $C(O)OR'$, $C(O)R'$, $C(O)NR'_2$, $NR'_2$, $NO_2$, $OR'$, $SR'$, $SO_2$, $SOR'$, or $SO_3R'$, and additionally, or alternatively, two J groups on adjacent ring atoms may form a fused 5- or 6-membered aromatic group;

each R' is independently selected from halo, H, alkyl, alkenyl, alkynyl, heteroalkyl, aralkyl, aryl, and heteroaryl;

$Z_1$ is selected from a bond, O, S, or NR';

$A_1$ and $A_2$ are independently selected from C, N, or P; and a is 0, 1, 2, 3, or 4;b is 0, 1, or 2.

11. The device of claim 10, wherein the carbene ligand is selected from:

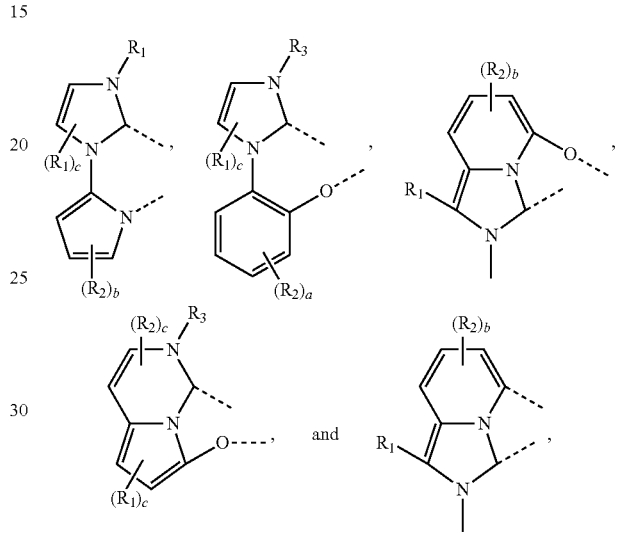

wherein c is 0, 1, or 2.

12. The device of claim 10, wherein the carbene ligand is selected from the group consisting of:

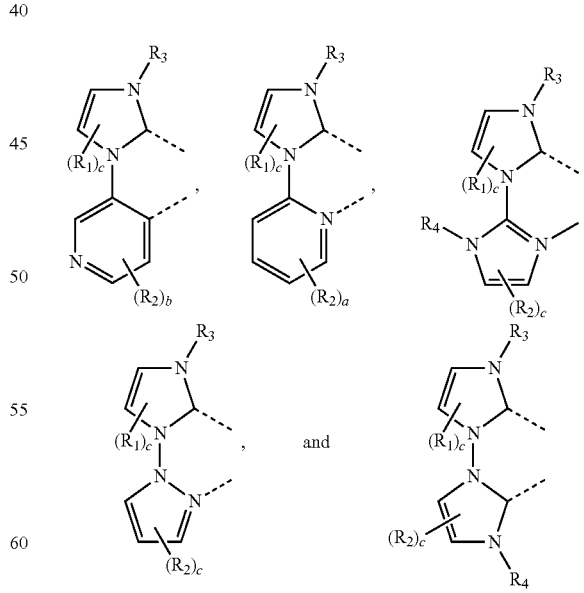

wherein c is 0, 1, or 2; and
wherein $R_4$ is selected from hydrogen, alkyl, alkenyl, alkynyl, aralkyl, aryl, heteroaryl, substituted aryl, substituted heteroaryl, or a heterocyclic group.

13. The device of claim 4, wherein each of $R_1$ is H or an alkyl having 1-15 carbons and each of $R_2$ is H or an alkyl having 1-15 carbons.

14. The device of claim 13, wherein M is Ir or Pt.

15. The device of claim 4, wherein D is a 5-membered aromatic heterocyclic ring.

16. The device of claim 15, wherein D is selected from the group consisting of

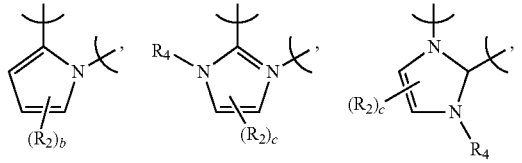

and

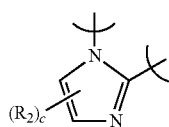

wherein R4 is selected from hydrogen, alkyl, alkenyl, alkynyl, aralkyl, aryl, heteroaryl, substituted aryl, substituted heteroaryl, or a heterocyclic group.

17. The device of claim 4, wherein D is a 6-membered aromatic heterocyclic ring.

18. The device of claim 17, wherein D is

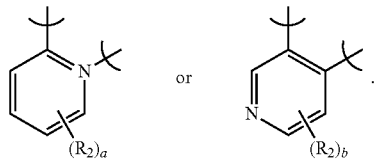

19. The device of claim 4, wherein D-$Z_1$ is

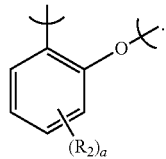

20. The device of claim 1, further comprising a hole blocking layer disposed between the organic emissive layer and the cathode;

wherein the organic emissive layer and the electron blocking layer forming an emissive layer/electron blocking layer interface and the organic emissive layer and the hole blocking layer forming an emissive layer/hole blocking layer interface; and wherein the organic phosphorescent emissive dopant material is present in the organic emissive layer with a graded doping concentration wherein the doping concentration is linearly graded from highest concentration at the emissive layer/electron blocking layer interface, to lowest concentration at the emissive layer/hole blocking layer interface.

21. A device comprising one or more organic light emitting devices of claim 1.

* * * * *